(12) United States Patent
Tsuji et al.

(10) Patent No.: US 8,426,864 B2
(45) Date of Patent: Apr. 23, 2013

(54) INFRARED SENSOR

(75) Inventors: Koji Tsuji, Suita (JP); Yosuke Hagihara, Katano (JP); Naoki Ushiyama, Yawata (JP)

(73) Assignee: Panasonic Corporation, Kadoma-shi (JP)

( * ) Notice: Subject to any disclaimer, the term of this patent is extended or adjusted under 35 U.S.C. 154(b) by 131 days.

(21) Appl. No.: 12/998,213

(22) PCT Filed: Sep. 24, 2009

(86) PCT No.: PCT/JP2009/066510
§ 371 (c)(1),
(2), (4) Date: Mar. 25, 2011

(87) PCT Pub. No.: WO2010/035739
PCT Pub. Date: Apr. 1, 2010

(65) Prior Publication Data
US 2011/0175100 A1    Jul. 21, 2011

(30) Foreign Application Priority Data

Sep. 25, 2008 (JP) .................. 2008-246927
Mar. 31, 2009 (JP) .................. 2009-087008
Mar. 31, 2009 (JP) .................. 2009-087009

(51) Int. Cl.
*H01L 29/76*    (2006.01)
(52) U.S. Cl.
USPC .............. 257/66; 257/48; 257/184; 257/440; 257/467; 257/E29.347
(58) Field of Classification Search .................. 257/48, 257/66, 184, 440, 467
See application file for complete search history.

(56) References Cited

U.S. PATENT DOCUMENTS 5,220,188 A    6/1993 Higashi et al.
5,485,010 A    1/1996 Owen et al.
(Continued)

FOREIGN PATENT DOCUMENTS

| CN | 1898538 A | 1/2007 |
| EP | 1045233 A2 | 10/2000 |

(Continued)

OTHER PUBLICATIONS

International Search Report dated Oct. 27, 2009, issued for PCT/JP2009/066510.

(Continued)

*Primary Examiner* — Wai Sing Louie
(74) *Attorney, Agent, or Firm* — Edwards Wildman Palmer LLP; James E. Armstrong, IV; George N. Chaclas

(57) ABSTRACT

The infrared sensor (1) includes a base (10), and an infrared detection element (3) formed over a surface of the base (10). The infrared detection element (3) comprises an infrared absorption member (33) in the form of a thin film configured to absorb infrared, and a temperature detection member (30) configured to measure a temperature difference between the infrared absorption member (33) and the base (10). The temperature detection member (30) includes a p-type polysilicon layer (35) formed over the infrared absorption member (33) and the base (10), an n-type polysilicon layer (34) formed over the infrared absorption member (33) and the base (10) without contact with the p-type polysilicon layer (33), and a connection layer (36) configured to electrically connect the p-type polysilicon layer (35) to the n-type polysilicon layer (34). Each of the p-type polysilicon layer (35) and the n-type polysilicon layer (34) has an impurity concentration in a range of $10^{18}$ to $10^{20}$ cm$^{-3}$. The p-type polysilicon layer (35) has its thickness of $\lambda/4n_{1p}$, wherein $\lambda$ denotes a center wavelength of the infrared to be detected by the infrared detection element (3), and $n_{1p}$ denotes a reflective index of the p-type polysilicon layer (35). The n-type polysilicon layer (34) has its thickness of $\lambda/4n_{1n}$, wherein $n_{1n}$ denotes a reflective index of the n-type polysilicon layer (34).

9 Claims, 40 Drawing Sheets

U.S. PATENT DOCUMENTS

| | | | |
|---|---|---|---|
| 6,163,061 A | 12/2000 | Iida | |
| 6,703,554 B2 * | 3/2004 | Morita et al. | 136/225 |
| 7,332,717 B2 | 2/2008 | Murata et al. | |
| 2002/0170589 A1 * | 11/2002 | Hamamoto et al. | 136/225 |
| 2003/0147449 A1 * | 8/2003 | Chavan et al. | 374/137 |
| 2007/0114416 A1 | 5/2007 | Ohta et al. | |
| 2007/0125949 A1 | 6/2007 | Murata et al. | |
| 2007/0170361 A1 | 7/2007 | Honda et al. | |
| 2008/0130710 A1 | 6/2008 | Dewes et al. | |
| 2008/0317087 A1 | 12/2008 | Kimura | |

FOREIGN PATENT DOCUMENTS

| | | | |
|---|---|---|---|
| GB | 2359192 A | 8/2001 | |
| JP | 60-186723 A | 9/1985 | |
| JP | 02-205729 A | 8/1990 | |
| JP | 2576259 B2 | 12/1991 | |
| JP | 04-76065 U | 7/1992 | |
| JP | 05-164605 A | 6/1993 | |
| JP | 06-213707 A | 8/1994 | |
| JP | 06-229821 A | 8/1994 | |
| JP | 07-099346 A | 4/1995 | |
| JP | 07-507868 A | 8/1995 | |
| JP | 07-273306 A | 10/1995 | |
| JP | 07-324978 A | 12/1995 | |
| JP | 08-166284 A | 6/1996 | |
| JP | 3287173 B2 | 10/1996 | |
| JP | 10-242534 A | 9/1998 | |
| JP | 11-040539 A | 2/1999 | |
| JP | 11-191644 A | 7/1999 | |
| JP | 11-258039 A | 9/1999 | |
| JP | 11-326064 A | 11/1999 | |
| JP | 2000-065639 A | 3/2000 | |
| JP | 2000-298062 A | 10/2000 | |
| JP | 2000-340848 A | 12/2000 | |
| JP | 2001-153722 A | 6/2001 | |
| JP | 2001-309122 A | 11/2001 | |
| JP | 2002-168716 A | 6/2002 | |
| JP | 2002-176204 A | 6/2002 | |
| JP | 2002-340668 A | 11/2002 | |
| JP | 2003-304005 A | 10/2003 | |
| JP | 3682296 B2 | 8/2005 | |
| JP | 2006-300623 A | 11/2006 | |
| JP | 2006-317232 A | 11/2006 | |
| JP | 3897055 B1 | 3/2007 | |
| JP | 3897056 B1 | 3/2007 | |
| JP | 2007-132865 A | 5/2007 | |
| JP | 2007-139455 A | 6/2007 | |
| JP | 2007-178323 A | 7/2007 | |
| JP | 2007-315916 A | 12/2007 | |
| JP | 2008-082791 A | 4/2008 | |
| JP | 2008-107307 A | 5/2008 | |
| JP | 2010-078451 A | 4/2010 | |
| WO | 2010/035738 A1 | 4/2010 | |
| WO | 2010/035739 A1 | 4/2010 | |

OTHER PUBLICATIONS

P.M. Sarro et al., "An Integrated Thermal Infrared Sensing Array", Sensors and Actuators, 14(2), pp. 191-201 (1988).
International Search Report of PCT/JP2010/55803, dated Jul. 6, 2010.
International Serach Report of PCT/JP2010/55671 dated Jun. 29, 2010.
International Search Report dated Oct. 27, 2009, issued for PCT/JP2009/066509.
Notification of Reasons for Refusal of JP 2008-426926 dated May 15, 2012.
Notification of Reasons for Refusal of JP 2010-178100 dated May 15, 2012.
European Search Report Issued on Jun. 27, 2012.
European Search Report Mailed Jun. 27, 2012 in Application No. 09816153.2.
European Search Report mailed Jun. 27, 2012 in Application No. 09816154.0.
Korean Office Action in corresponding Korean Patent Application No. 10-2011-7025726 issued Dec. 21, 2012.
Notification of the First Office Action in corresponding Chinese Patent Application No. 200980142269.0, issued Jan. 31, 2013.

* cited by examiner

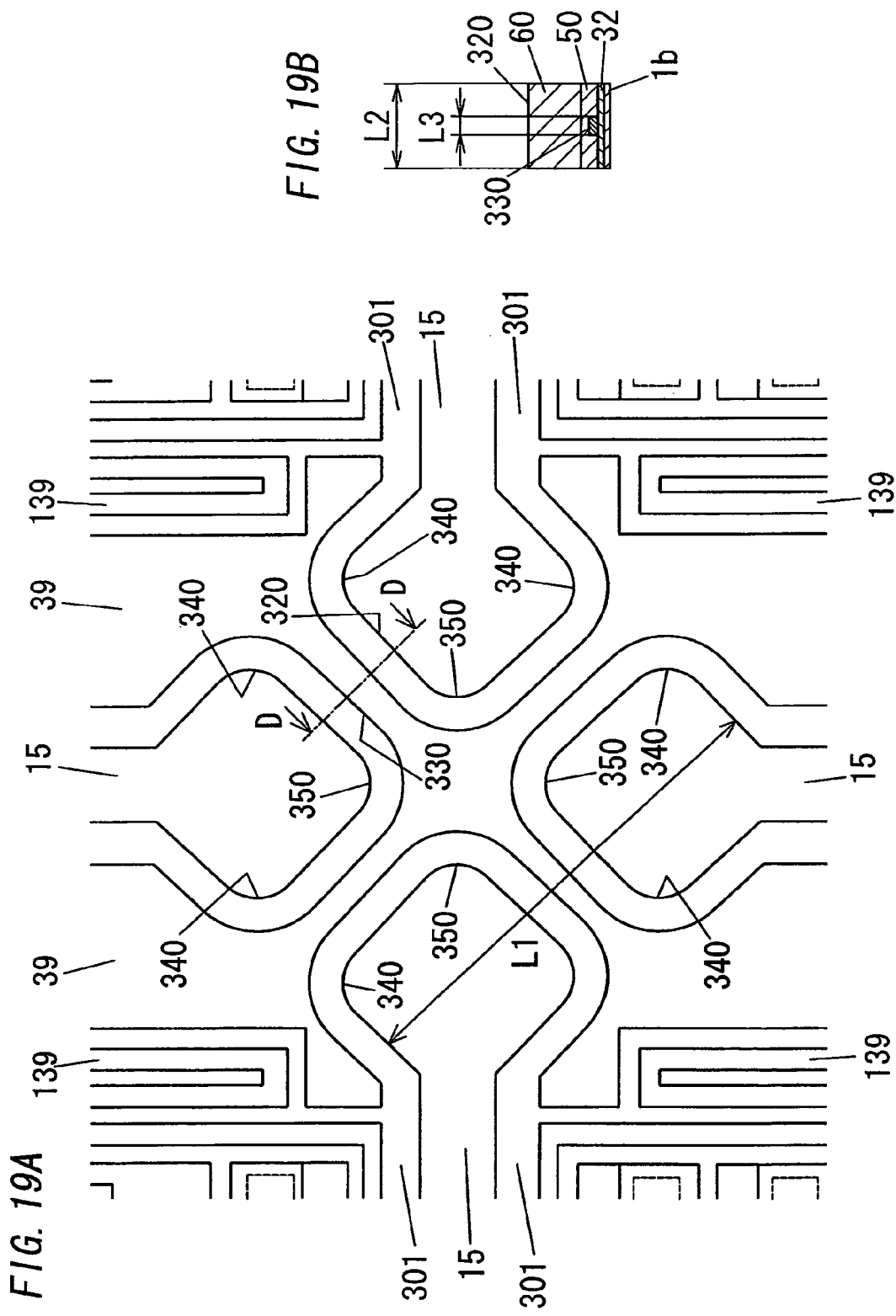

INFRARED SENSOR

CROSS REFERENCE TO RELATED APPLICATIONS

This application is a national stage application of International Application No. PCT/JP2009/066510, filed Sep. 24, 2009, which claims priority to Japanese App. Nos. 2008-246927, 2009-087008, and 2009-087009, filed Sep. 25, 2008, Mar. 31, 2009 and Mar. 31, 2009, respectively; each of the above-identified applications is incorporated by reference herein. This application is also related to co-pending application, entitled, "INFRARED SENSOR" filed concurrently herewith in the names of Koji Tsuji, Yosuke Hagihara and Naoki Ushiyama as a national stage application of International App. No. PCT/JP2009/066509, filed Sep. 24, 2009, which application is assigned to the assignee of the instant application and which co-pending application is also incorporated by reference herein.

TECHNICAL FIELD

The present invention relates to an infrared sensor.

BACKGROUND ART

In the past, there has been proposed an infrared sensor which detects infrared (e.g., infrared having a wavelength of 8 to 12 μm which emitted from a human body). A document 1 (Japanese patent publication No. 2576259) and a document 2 (Japanese patent publication No. 3287173) disclose infrared sensors manufactured by use of micromachining techniques. This kind of infrared sensor includes a thin film-shaped infrared absorption member and a temperature detection member. The infrared absorption member absorbs infrared and converts the absorbed infrared into heat. The temperature detection member measures a change in temperature of the infrared absorption member.

Wherein, the infrared sensor disclosed in the above document 1 includes a silicon substrate, and a silicon nitride film formed on the silicon substrate. The silicon substrate is provided with a cavity for thermal insulation. The silicon nitride film has its portion covering the cavity which acts as the infrared absorption member. In this infrared sensor, a thermopile is adopted as the temperature detection member. The thermopile is made of an n-type silicon film and a p-type silicon film formed on the silicon nitride film, by use of patterning techniques and the like.

The infrared sensor disclosed in the document 2 includes a dielectric layer (infrared absorption member) having high absorption in infrared wavelength region. On the dielectric layer is formed a temperature detection semiconductor layer. Below the dielectric layer under the temperature detection semiconductor layer is formed a cavity for suppressing conduction of heat from the temperature detection semiconductor layer to an outside. In this infrared sensor, the dielectric layer is preferred to be thinned in order to decrease a heat conductance thereof (increase a resistance thereof) and in order to increase a response speed. When the dielectric layer is thinned, the dielectric layer being the infrared absorption member is likely to suffer from a warp, and the infrared sensor may have poor structural stability and low sensitivity.

In addition, the infrared sensor disclosed in the document 2 uses a bolometer type infrared detection element. Therefore, it is necessary to flow a current in order to measure a change in a resistance of the infrared detection element. This causes increased power consumption. Moreover, since the bolometer type infrared detection element heats itself, the infrared detection element is likely to suffer from a warp caused by thermal stress resulting from the self-heating. Further, a resistance temperature coefficient of the infrared detection element is changed by a temperature variation resulting from the self-heating and/or a surrounding temperature variation. In view of this, a temperature compensation polysilicon layer is necessary to improve accuracy. However, to provide the temperature compensation polysilicon layer enlarges the infrared sensor, and increases a production cost.

Meanwhile, in the infrared sensor disclosed in the document 1, the thermopile is used as the temperature detection member. Differently from the bolometer type infrared detection element, the thermopile needs no current to measure the temperature. Thus, the thermopile does not produce self-heating. Therefore, the infrared absorption member is kept free from a warp caused by the self-heating. Further, power consumption can be reduced. In addition, since a sensitivity of the thermopile does not depend on its temperature, the thermopile has high accuracy.

In order to form the thermopile disclosed in the document 1, it is necessary to pattern, by use of etching techniques, the n-type silicon film and the p-type silicon film formed on the infrared absorption member. When the thermopile is formed, the infrared absorption member is likely to be etched together with the p-type silicon film and/or the n-type silicon film. In this situation, a thin film structure comprising the infrared sensor and the thermopile formed thereon is likely to suffer from a warp, and the infrared sensor may have poor structural stability and low sensitivity.

DISCLOSURE OF INVENTION

In view of the above insufficiency, the present invention has been aimed to propose an infrared sensor which is capable of reducing its power consumption and of improving its sensitivity.

The infrared sensor in accordance with the present invention comprises a base and an infrared detection element formed over a surface of the base. The infrared detection element comprises an infrared absorption member in the form of a thin film configured to absorb infrared, a temperature detection member configured to measure a temperature difference between the infrared absorption member and the base, and a safeguard film. The infrared absorption member is spaced from the surface of the base for thermal insulation. The temperature detection member includes a thermocouple which includes a p-type polysilicon layer formed over the infrared absorption member and the base, an n-type polysilicon layer formed over the infrared absorption member and the base without contact with the p-type polysilicon layer, and a connection layer configured to electrically connect the p-type polysilicon layer to the n-type polysilicon layer. Each of the p-type polysilicon layer and the n-type polysilicon layer has an impurity concentration in a range of $10^{18}$ to $10^{20}$ $cm^{-3}$. The p-type polysilicon layer has its thickness of $\lambda/4n_{1p}$, wherein $\lambda$ denotes a center wavelength of the infrared to be detected by the infrared detection element, and $n_{1p}$ denotes a reflective index of the p-type polysilicon layer. The n-type polysilicon layer has its thickness of $\lambda/4n_{1n}$, wherein $n_{1n}$ denotes a reflective index of the n-type polysilicon layer.

According to the present invention, in contrast to use of the bolometer type infrared detection element, it is unnecessary to supply electrical current to the temperature detection member, and therefore the temperature detection member does not produce self-heating. Thus, the infrared absorption member does not suffer from a warp caused by the self-heating of the temperature detection member and further it is possible to reduce power consumption. Furthermore, it is possible to enhance absorption efficiency of each of the p-type polysilicon layers and the n-type polysilicon layer for the targeted infrared, and therefore sensitivity of the infrared sensor can be improved.

In a preferred aspect, the infrared detection member includes an infrared absorption film formed over an opposite surface of the p-type polysilicon layer and the n-type polysilicon layer from the base. The infrared absorption film has its thickness of $\lambda/4n_2$, wherein $n_2$ denotes a reflective index of the infrared absorption film.

With this aspect, it is possible to more enhance absorption efficiency for the targeted infrared, and therefore the sensitivity can be more improved.

In a preferred aspect, the p-type polysilicon layer has the same thickness as the n-type polysilicon layer.

With this aspect, at the time of manufacturing the infrared sensor, the non-doped polysilicon layers which are respectively bases of the p-type polysilicon layer and the n-type polysilicon layer can be formed through a single deposition process. Thus, it is possible to reduce the production cost.

In a preferred aspect, the infrared sensor includes plural cells each including the infrared detection element. The plural cells are arranged over the surface of the base in an array manner.

With this aspect, it is possible to provide an infrared image sensor.

In a more preferred aspect, the cell includes a MOS transistor configured to read out an output of the temperature detection member.

With this aspect, it is possible to reduce the number of the output pads, and therefore it is possible to downsize the infrared sensor and reduce the production cost thereof.

In a further preferred aspect, the p-type polysilicon layer has the same thickness as the n-type polysilicon layer. The MOS transistor includes a gate electrode defined by a polysilicon film having the same thickness as the p-type polysilicon layer.

With this aspect, it is possible to form the gate electrode of the MOS transistor as well as the p-type polysilicon layer or the n-type polysilicon layer through the same process. Thus, it is possible to decrease the number of the steps of the method for manufacturing the infrared sensor, and therefore the production cost can be reduced.

In a further preferred aspect, the polysilicon layer defining the gate electrode of the MOS transistor has the impurity of the same kind and the same concentration as at least one of the p-type polysilicon layer and the n-type polysilicon layer.

With this aspect, it is possible to form the gate electrode of the MOS transistor as well as the p-type polysilicon layer or the n-type polysilicon layer through the same process. Thus, it is possible to decrease the number of the steps of the method for manufacturing the infrared sensor, and therefore the production cost can be reduced.

In a preferred aspect, the base is provided with a cavity for thermally insulation between the base and the infrared absorption member. The infrared detection member includes a thin film structure which comprises a plurality of a small and thin film structures, and is disposed over the cavity. Each of the small and thin film structures includes the infrared absorption member in the form of a thin film configured to absorb infrared, and the temperature detection member formed on the infrared absorption member and configured to measure a temperature of the same infrared absorption member. Between the small and thin film structures are formed slits. All the temperature detection members are electrically connected to each other in such a relation as to provide a temperature-dependent output which is greater than any single one of the temperature detection members.

With this aspect, the infrared sensor can improve its response speed and sensitivity. Furthermore, it is possible to prevent each infrared detection members from being deformed by deformation of the base, an external stress, a thermal stress, or the like. Thereby, it is possible to improve structural stability of the infrared sensor and to stabilize the sensitivity of the infrared sensor.

In a preferred aspect, the thin film structure includes a connection member configured to connect the small and thin film structures together.

According to this aspect, it is possible to prevent breakage of the infrared sensor which would otherwise occur due to a stress caused by an external temperature variation or impact at the time of using the infrared sensor. it is possible to prevent breakage of the infrared sensor which would otherwise occur at the time of manufacturing the same. The fabrication yield can be improved.

BRIEF DESCRIPTION OF DRAWINGS

FIG. 19A is a partial plane view illustrating the above infrared sensor, FIG. 19B shows a cross sectional view of the above infrared sensor along the line D-D of FIG. 19A.

BEST MODE FOR CARRYING OUT THE INVENTION

First Embodiment

Figure 1A:
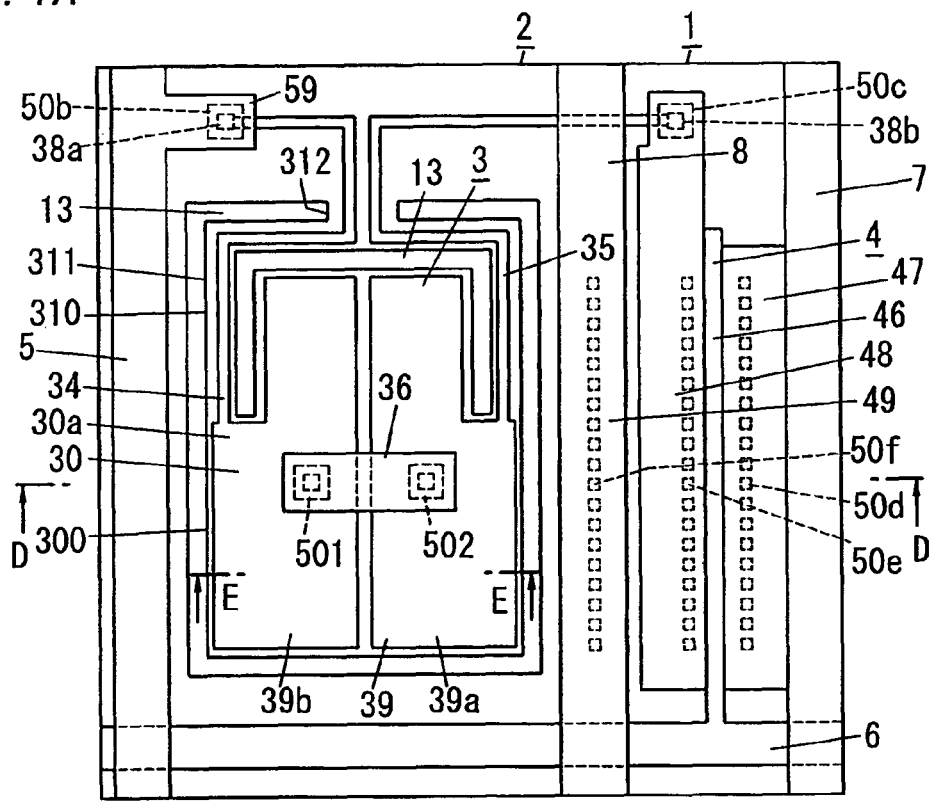
FIG. 1A is a plane view illustrating an infrared sensor of the first embodiment.
Figure 1B:
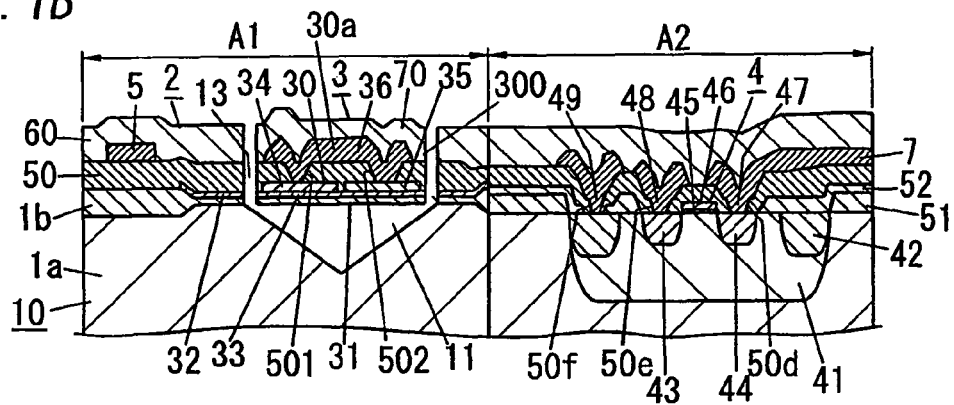
FIG. 1B is shows a cross sectional view of the infrared sensor of the first embodiment along the line D-D of FIG. 1A.
Figure 1C:
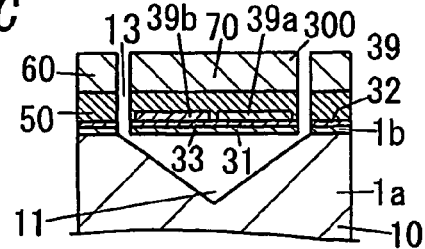
FIG. 1C is shows a cross sectional view of the infrared sensor of the first embodiment along the line E-E of FIG. 1A.
Figure 2A:
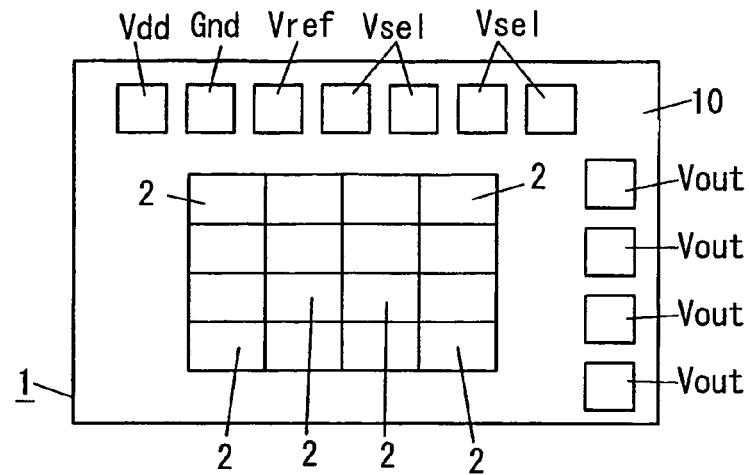
FIG. 2A is a plane view illustrating the above infrared sensor.
Figure 2B:
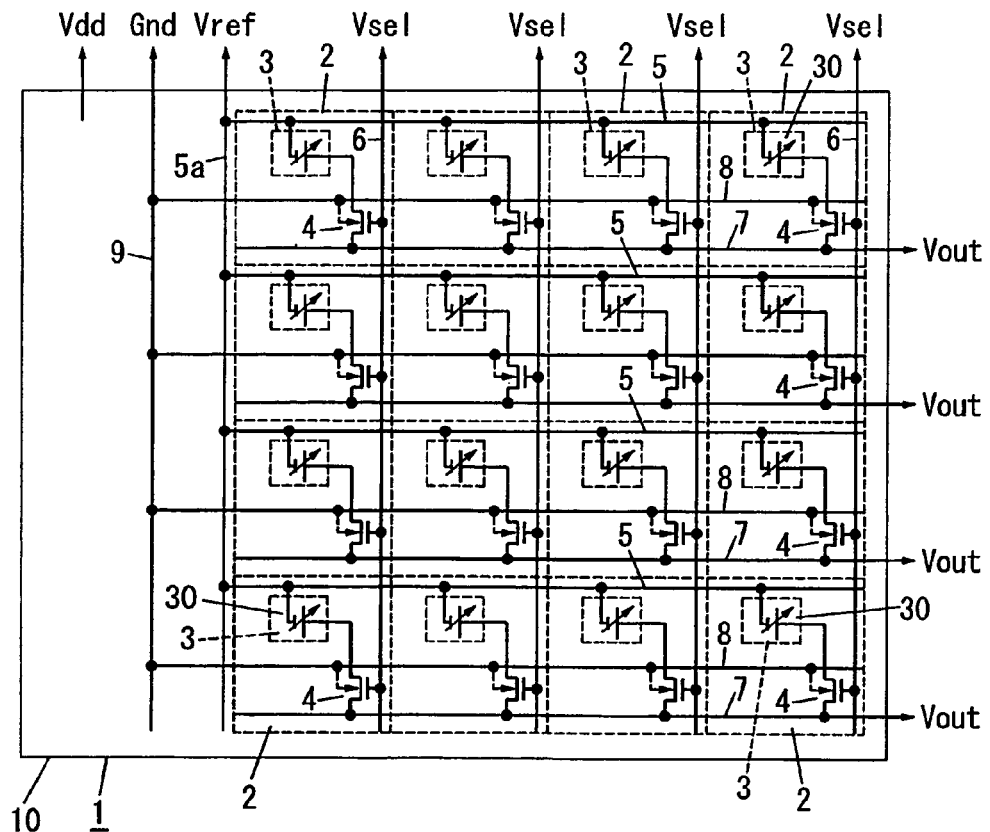
FIG. 2B is an equivalent circuit schematic illustrating the above infrared sensor.

The infrared sensor 1 of the present embodiment is an infrared image sensor (infrared array sensor). As shown in FIGS. 1 and 2, the infrared sensor 1 includes a base (base substrate) 10 used as a basement, and a plurality of cells (pixels) 2 arranged on a first surface (upper surface, in FIG. 1B) of the base 10 in an array (two dimensional array, in the illustrated instance) manner. The cell 2 includes a thermal type infrared detection element 3 including an infrared absorption member 33 and a temperature detection member 30, and a MOS transistor 4 defined as a switching element for pixel selection.

In the present embodiment, m by n (4 by 4, in the illustrated instance) pixels 2 are formed on the first surface of the single base 10. The number, arrangement, or both of the pixels 2 is not limited to the present embodiment. Besides, in FIG. 2B, an equivalent circuit of the temperature detection member 30 is illustrated as a power source.

The infrared sensor 1 includes a plurality of vertical read-out lines 7, a plurality of horizontal signal lines 6, a plurality of ground lines 8, a common ground line 9, a plurality of reference bias lines 5, and a common reference bias line 5a. Each of the vertical read-out lines 7 is connected to first ends of the temperature detection members 30 of the plural infrared detection elements 3 in a row via the corresponding MOS transistors 4. Each of the horizontal signal lines 6 is connected to gate electrodes 46 of the MOS transistors 4 corresponding to the temperature detection members 30 of the infrared detection elements 3 in a column. Each of the ground lines 8 is connected to p-type well regions 41 of the MOS transistors 4 in a row. The common ground line 9 is connected to each of the ground lines 8. Each of the reference bias lines 5 is connected to second ends of the temperature detection members 30 of the plural infrared detection elements 3 in a row. The common reference bias line 5a is connected to each of the reference bias lines 5.

According to the infrared sensor 1, it is enabled to read out a time-series data of the outputs from the temperature detection members 30 of all the infrared detection elements 3. Further, in the infrared sensor 1, the plural pixels 2 are formed on the first surface of the base 10. Each of the pixels 2 includes an infrared detection element 3, and a MOS transistor 4 which is juxtaposed to the corresponding infrared detection element 3 and is configured to read out an output of the same infrared detection element 3. The MOS transistor 4 has its gate electrode 46 connected to the horizontal signal line 6, its source electrode 48 connected to the reference bias line 5 via the temperature detection member 30, and its drain electrode 47 connected to the vertical read-out line 7.

Additionally, the infrared sensor 1 includes, plural pixel selection pads Vsel, plural output pads Vout, a ground pad Gnd, a reference bias pad Vref, and a substrate pad Vdd. The horizontal signal lines 6 are electrically connected to the pixel selection pads Vsel, respectively. The vertical read-out lines 7 are electrically connected to the output pads Vout, respectively. The common ground line 9 is electrically connected to the ground pad Gnd. The common reference bias line 5a is electrically connected to the reference bias pad Vref. The substrate pad Vdd is electrically connected to a silicon substrate 1a.

According to the infrared sensor 1, by controlling potentials of the pixel selection pads Vsel to sequentially turn on the MOS transistors 4, it is enabled to read out sequentially output voltages from the pixels 2. For example, when a potential of 5V is applied to the pixel selection pad Vsel while potentials of 1.65V, 0V, and 5V are applied to the reference bias pad Vref, the ground pad Gnd, and the substrate pad Vdd, respectively, the MOS transistor 4 is turned on. As a result, the output pad Vout outputs the output voltage (1.65V+an output voltage of the temperature detection member 30) of the pixel 2. In brief, it is possible to read out the output voltage of the temperature detection member 30. In contrast, when the electrical potential of the pixel selection pad Vsel is set to 0V, the MOS transistor 4 is turned off. Thus, the output pad Vout does not output the output voltage of the pixel 2.

Figure 3:
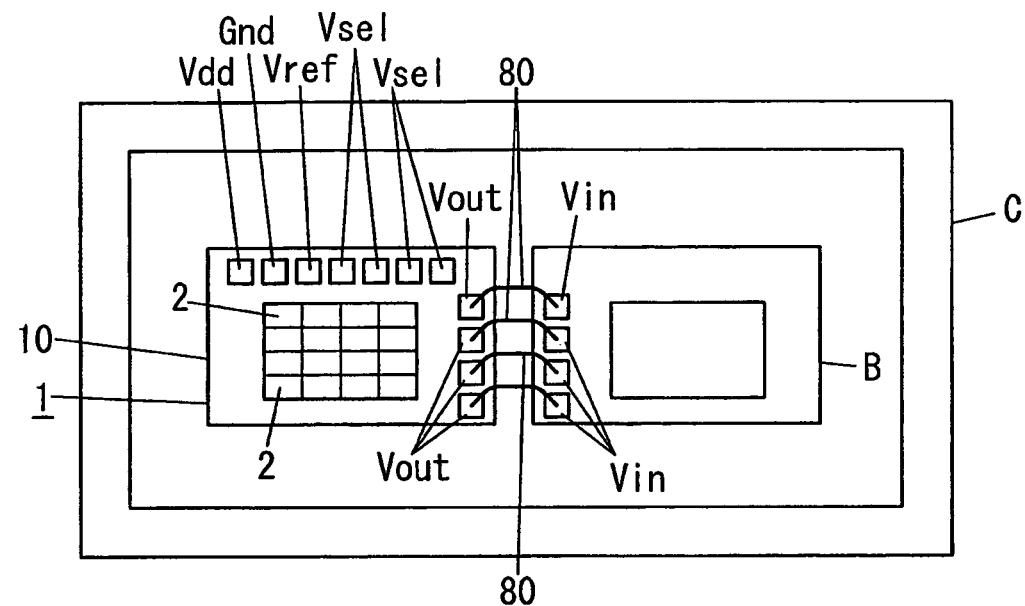
FIG. 3 is a schematic plane view illustrating an infrared sensor module including the above infrared sensor.

The infrared sensor 1 is applied to an infrared sensor module shown in FIG. 3. The infrared sensor module includes the infrared sensor 1, a signal processing device (signal processing IC chip) B configured to process an output signal (output voltage) of the infrared sensor 1, and a package C on which the infrared sensor 1 and the signal processing device B are mounted.

Figure 4:
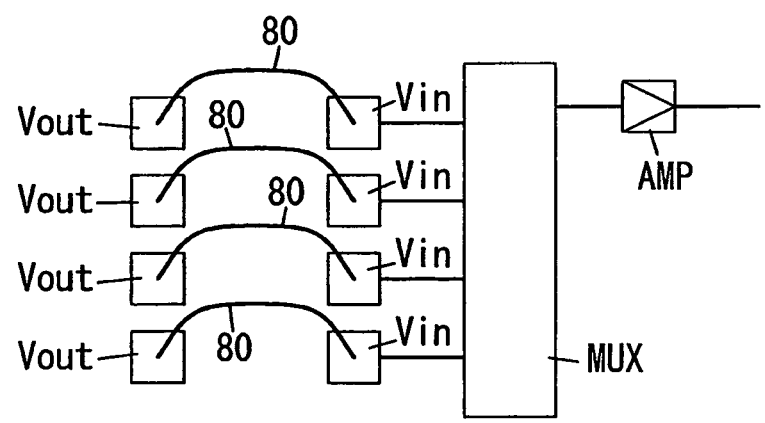
FIG. 4 is an explanatory view illustrating the infrared sensor module including the above infrared sensor.

As shown in FIG. 4, the signal processing device B includes plural (four, in the illustrated instance) input pads Vin. The input pads Vin are electrically connected to the plural (four, in the illustrated instance) output pads Vout by use of lines 80 being bonding wires, respectively. Further, the signal processing device B includes amplifier circuit AMP configured to amplify an output voltage from the input pad Vin, and a multiplexer MUX configured to input selectively the output voltages from the input pads Vin into the amplifier circuit AMP. Further, the signal processing device includes amplifier circuit configured to amplify an output voltage from the input pad, and a multiplexer configured to supply selectively the output voltages from the input pads to the amplifier circuit. With use of the signal processing device B, it is possible to generate an infrared image.

The package C is formed into a rectangular box shape and is provided with an opening in its surface. The infrared sensor 1 and the signal processing device B are mounted (installed) on an inner bottom surface of the package C. A package lid (not shown) is attached to the package C to cover the opening. The package lid is provided with a lens converging infrared to the infrared absorption member 33 of the infrared detection element 3.

In the aforementioned infrared sensor module, the base 10 of the infrared sensor 1 is formed to have a rectangular shaped outer periphery. All the output pads Vouf configured to read out the output signal from the temperature detection member 3 are arranged on an end portion of a first side of the outer periphery of the base 10 in line along the first side. The signal processing device B is formed to have a rectangular shaped outer periphery. All the input pads Vin respectively connected to the output pads Vout of the infrared sensor 1 are arranged on an end portion of a second side of the outer periphery of the signal processing device B in line along the second side. The infrared sensor 1 is mounted on the package C such that the second side of the signal processing device B is closer to the first side of the base 10 than any other sides of the signal processing device B. Therefore, it is possible to shorten the lines 80 respectively connecting the output pads Vout of the infrared sensor 1 to the input pads Vin of the signal processing device B. Consequently, an influence cause by an external noise can be reduced and therefore noise resistance can be improved.

The following explanation is made to a construction of the infrared sensor 1.

The base 10 is made of the silicon substrate 1a. For example, the silicon substrate 1a is a monocrystalline silicon substrate in which a conductivity type is n type and a main surface (upper surface, in FIG. 1B) is a (100) surface. Further, the silicon substrate 1a is provided with a cavity 11 for thermal insulation in its portion corresponding to the infrared absorption member 33. The cavity 11 has a rectangular shaped inner periphery.

The main surface of the silicon substrate 1a includes areas A1 each for forming the infrared detection element 3 of the pixel 2, and areas A2 each for forming the MOS transistor 4 of the pixel 2.

The infrared detection 3 is defined by a thin film structure 300 including the infrared absorption member 33. The infrared absorption member 33 is formed over the first surface of the base 10 made of the silicon substrate 1a and is placed to be spatially separated from the base 10. Further, the thin film structure 300 includes support members (bridges) 310 connecting the base 10 to the infrared absorption member 33. The support member 310 includes a first connection piece 311 and a second connection piece 312. The first connection piece 311 is formed into a U shape, and has its two legs connected to the infrared absorption member 33. The first connection piece 311 is arranged along an outer periphery of the infrared absorption member 33. The second connection piece 312 extends from a center of a central portion of the first connection piece 311 to an opposite side from the infrared absorption member 33, and is connected to the base 10. Besides, the support member 310 includes connection portions respectively connected to the infrared absorption member 33 and the base 10, and remaining potions spatially separated from both the infrared absorption member 33 and the base 10 by use of two slits 13. Each of the slits 13 has a width in a range of about 0.2 μm to about 5 μm, for example. As described in the above, the support member 310 is connected to the infrared absorption member 33 only at two points, and is connected to the base 10 only at one point. Since the support member 310 is connected to the base 10 only at one point, it is possible to prevent deformation of the thin film structure 300 even if the base 10 is deformed by an external stress, a thermal stress, or the like. Accordingly, it is possible to reduce a change in sensitivity of the infrared sensor caused by an external stress, a thermal stress, or the like, and therefore it is possible to improve accuracy. Besides, the base 10 has a rectangular frame shaped portion which surrounds the thin film structure.

The thin film structure 300 is formed by patterning a laminate structure including a silicon dioxide film 1b, the silicon nitride film 32, the temperature detection member 30, an interlayer dielectric film 50, and a passivation film 60. The silicon dioxide film 1b is formed on the main surface of the silicon substrate 1a. The silicon nitride film 32 is formed on the silicon dioxide film 1b. The temperature detection member 30 is formed on the silicon nitride film 32. The interlayer dielectric film 50 is made of a BPSG film formed over the silicon nitride film 32 to cover the temperature detection member 30. In the present embodiment, the interlayer dielectric film 50 has a film thickness of 0.8 μm (8000 Å). The passivation film 60 is a laminated film including a PSG film formed on the interlayer dielectric film 50, and an NSG film formed on the PSG film. In the present embodiment, the PSG film has a film thickness of 5000 Å, and the NSG film has a film thickness of 5000 Å. Therefore, the passivation film 60 has a film thickness of 1 µm. Besides, the passivation film 60 is not limited to the laminated film of the PSG film and the NSG film, but may be a silicon nitride film, for example.

A laminated film of the interlayer dielectric film 50 and the passivation film 60 is formed over the area A1 and the area A2. This laminated film has its portion which is formed over the area A1 and is used as an infrared absorption film 70. This infrared absorption film 70 has its thickness $t_2$ of $\lambda/4n_2$, wherein $\lambda$ denotes a center wavelength of infrared to be detected by the infrared detection element 3 and $n_2$ denotes a reflective index of the infrared absorption film 70. With this arrangement, it is possible to enhance absorption efficiency of the infrared absorption film 70 for infrared having a detection target wavelength (e.g., 8 to 12 µm), and therefore the sensitivity can be improved. For example, when $n_2$ is 1.4 and $\lambda$ is 10 µm, $t_2$ is about 1.8 µm. Besides, the infrared absorption film 70 may be made of a silicon nitride film.

The infrared sensor 1 of the present embodiment is configured to realize the infrared absorption member 33 in the silicon nitride film 32 at a portion except for the support member 310 of the thin structure 300. The base 10 is constituted by the silicon substrate 1a, the silicon dioxide film 1b, the silicon nitride film 32, the interlayer dielectric film 50, and the passivation film 60. Therefore, the passivation film 60 has a top surface which defines the first surface of the base 10.

The temperature detection member 30 is configured to measure a temperature difference between the infrared absorption member 33 and the base 10. The temperature detection member 30 includes a thermocouple 30a defining a temperature detection element. The thermocouple 30a is made of a p-type polysilicon layer 35, an n-type polysilicon layer 34, and a connection layer 36. The p-type silicon layer 35 is formed over the infrared absorption member 33 and the base 10. The n-type silicon layer 34 is formed over the infrared absorption member 33 and the base 10 without contact with the p-type polysilicon layer 35. The connection layer 36 connects the p-type polysilicon layer 35 to the n-type polysilicon layer 34 over an infrared incident surface (upper surface, in FIG. 1B) defined by an opposite surface of the infrared absorption member 33 from the base 10 (silicon substrate 1a), that is, over the infrared absorption member 33.

In more detail, the n-type polysilicon layer 34 and the p-type polysilicon layer 35 are formed on the silicon nitride 32 to be positioned over the infrared absorption member 33, the support member 33, and the base 10. The connection layer 36 is made of a metal material (e.g., Al—Si), and electrically connects a first end of the n-type polysilicon layer 34 and a first end of the p-type polysilicon layer 35 above a center of a top surface of the infrared absorption member 33. The temperature detection member 30 includes an electrode 38a formed on a second end of the n-type polysilicon layer 34, and an electrode 38b formed on a second end of the p-type polysilicon layer 35.

The interlayer dielectric film 50 isolates and separates the connection layer 36, the electrode 38a, and the electrode 38b from the others. The connection layer 36 is electrically connected to the first end of the n-type polysilicon layer 34 via a contact hole 501 formed in the interlayer dielectric film 50, and is electrically connected to the first end of the p-type polysilicon layer 35 via a contact holes 502 formed in the interlayer dielectric film 50. The electrode 38a is electrically connected to the second end of the n-type polysilicon layer 34 via a contact hole 50b formed in the interlayer dielectric film 50. The electrode 38b is electrically connected to the second end of the p-type polysilicon layer 35 via a contact hole 50c formed in the interlayer dielectric film 50.

The safeguard film 39 serves to protect the infrared absorption member 33 and prevent a warp of the infrared absorption member 33 at the time of forming the p-type polysilicon layer 35 and the n-type polysilicon layer 34. This safeguard film 39 is a polysilicon layer formed on the infrared incident surface of the infrared absorption member 33 to cover the infrared incident surface, and comprises a p-type safeguard film (p-type safeguard polysilicon layer) 39a, and an n-type safeguard film (n-type safeguard polysilicon layer) 39b. The p-type safeguard film 39a and the n-type safeguard film 39b are arranged not to contact with each other.

The p-type safeguard film 39a has the p-type impurity (e.g., boron) of the same kind and the same impurity concentration (e.g., $10^{18}$ to $10^{20}$ cm$^{-3}$) as the p-type polysilicon layer 35. In the present embodiment, the p-type safeguard film 39a is integrally formed with the p-type polysilicon layer 35. The n-type safeguard film 39b has the n-type impurity (e.g., phosphorus) of the same kind and the same impurity concentration (e.g., $10^{18}$ to $10^{20}$ cm$^{-3}$) as the n-type polysilicon layer 34. In the present embodiment, the n-type safeguard film 39b is integrally formed with the n-type polysilicon layer 34.

As described in the above, the safeguard film 39 constituted by the p-type safeguard film 39a formed integrally with the p-type polysilicon layer 35 and having an impurity concentration in a range of $10^{18}$ to $10^{20}$ cm$^{-3}$, and the n-type safeguard film 39b formed integrally with the n-type polysilicon layer 34 and having an impurity concentration in a range of $10^{18}$ to $10^{20}$ cm$^{-3}$. Accordingly, it is possible to reduce a resistance of the thermocouple 30a and therefore an S/N ration of the infrared sensor can be improved.

The p-type polysilicon layer has its thickness $t_{1p}$ of $\lambda/4n_{1p}$, and the n-type polysilicon layer has its thickness $t_{1n}$ of $\lambda/4n_{1n}$, wherein $n_{1p}$ denotes a reflective index of the p-type polysilicon layer 35 and $n_{1n}$ denotes a reflective index of the n-type polysilicon layer 34. In the present embodiment, $n_{1p}$ is equal to $n_{1n}$. Therefore, the thickness $t_{1p}$ of the p-type polysilicon layer 35 is equal to the thickness $t_{1n}$ of the n-type polysilicon layer 34. Further, the safeguard film 39 has its thickness (thickness of each of the p-type safeguard film 39a and the n-type safeguard film 39b) which is equal to both the thickness $t_{1p}$ of the polysilicon layer 35 and the thickness $t_{1n}$ of the polysilicon layer 34. Therefore, the thickness $t1$ of each of the p-type polysilicon layer 35, the n-type polysilicon layer, and the safeguard films 39a and 39b is represented by a formula of $\lambda/4n_1$, wherein $n_1$ denotes the reflective index of each of the p-type polysilicon layer 35, the n-type polysilicon layer 34, and the safeguard films 39a and 39b. With this arrangement, it is possible to enhance absorption efficiency of each of the p-type polysilicon layer 35, the n-type polysilicon layer 34, and the safeguard films 39a and 39b for infrared having a detection target wavelength (e.g., 8 to 12 µm), and therefore the sensitivity can be improved. For example, when $n_1$ is 3.6 and $\lambda$ is 10 µm, $t_1$ is about 0.69 µm.

Each of the safeguard films 39a and 39b has an impurity concentration in a range of $10^{18}$ to $10^{20}$ cm$^{-3}$. The p-type polysilicon layer 35 has the impurity of the same kind and the same concentration as the p-type safeguard film 39a. The n-type polysilicon layer 34 has the impurity of the same kind and the same concentration as the n-type safeguard film 39b. Each of the polysilicon layers 34 and 35 has an impurity concentration in a range of $10^{18}$ to $10^{20}$ cm$^{-1}$. Thus, as disclosed in the above document 2, an absorptance for infrared can be increased, and the reflection of the same infrared can be suppressed. Therefore, an S/N ratio of an output of the temperature detection member 30 is improved. Further, the p-type safeguard film 39a and the p-type polysilicon layer 35 can be formed through the same process, and the n-type safeguard film 39b and the n-type polysilicon layer 34 can be formed through the same process. Thus, it is possible to reduce a production cost of the infrared sensor.

The MOS transistor 4 includes a p-type well region 41, $n^+$-type drain region 44, $n^+$-type source region 43, $p^+$-type channel-stopper region 42, a gate insulation film 45, the gate electrode 46, the drain electrode 47, the source drain 48, and a ground electrode 49. The p-type well region 41 is formed on the main surface of the silicon substrate 1a. The $n^+$-type drain region 44 and the $n^+$-type source region 43 are formed in the p-type well region 41 so as to be separated from each other. The $p^+$-type channel-stopper region 42 is formed in the p-type well region 41 to surround both $n^+$-type the drain region 44 and the $n^+$-type source region 43. The gate insulation film 45 is made of a silicon dioxide film (thermally-oxidized film). The gate insulation film 45 is formed on a part of the p-type well region 41 so as to be placed between the $n^+$-type drain region 44 and the $n^+$-type source region 43. The gate electrode 46 is made of an n-type polysilicon layer, and is formed on the gate insulation film 45. The drain electrode 47 is made of a metal material (e.g., Al—Si), and is formed over the $n^+$-type drain region 44. The source electrode 48 is made of a metal material (e.g., Al—Si), and is formed over the $n^+$-type source region 43. The drain electrode 47 is electrically connected to the $n^+$-type drain region 44 via a contact hole 50d formed in the interlayer dielectric film 50. The source electrode 48 is electrically connected to the $n^+$-type source region 43 via a contact hole 50e formed in the interlayer dielectric film 50. The interlayer dielectric film 50 isolates and separates the gate electrode 46, the drain electrode 47, and the source electrode 48 from the others. The ground electrode 49 is made of a metal material (e.g., Al—Si), and is formed over the $p^+$-type channel-stopper region 42. The ground electrode 49 is electrically connected to the $p^+$-type channel-stopper region 42 via a contact hole 50f formed in the interlayer dielectric film 50. The ground electrode 49 is used to give lower potential to the $p^+$-type channel-stopper region 42 than (that given) to the $n^+$-type drain region 44 and the $n^+$-type source region 43 for mutual isolation of the elements (for isolating the element from each other).

In each pixel 2, the electrode 38b of the temperature detection member 30 is electrically connected to the source electrode 48 of the MOS transistor 4, and the electrode 38a of the temperature detection member 30 is electrically connected to the reference bias line 5 by use of a metal line (e.g., Al—Si line) 59. The metal line 59 is formed integrally with the reference bias line 5. Further, in each pixel 2, the drain electrode 47 of the MOS transistor 4 is electrically connected to the vertical read-out line 7, and the gate electrode 46 is electrically connected to the horizontal signal line 6. The horizontal signal line 6 is an n-type polysilicon line formed integrally with the gate electrode 46. Further, the ground electrode 49 is electrically connected to the common ground line 8.

Figure 5:
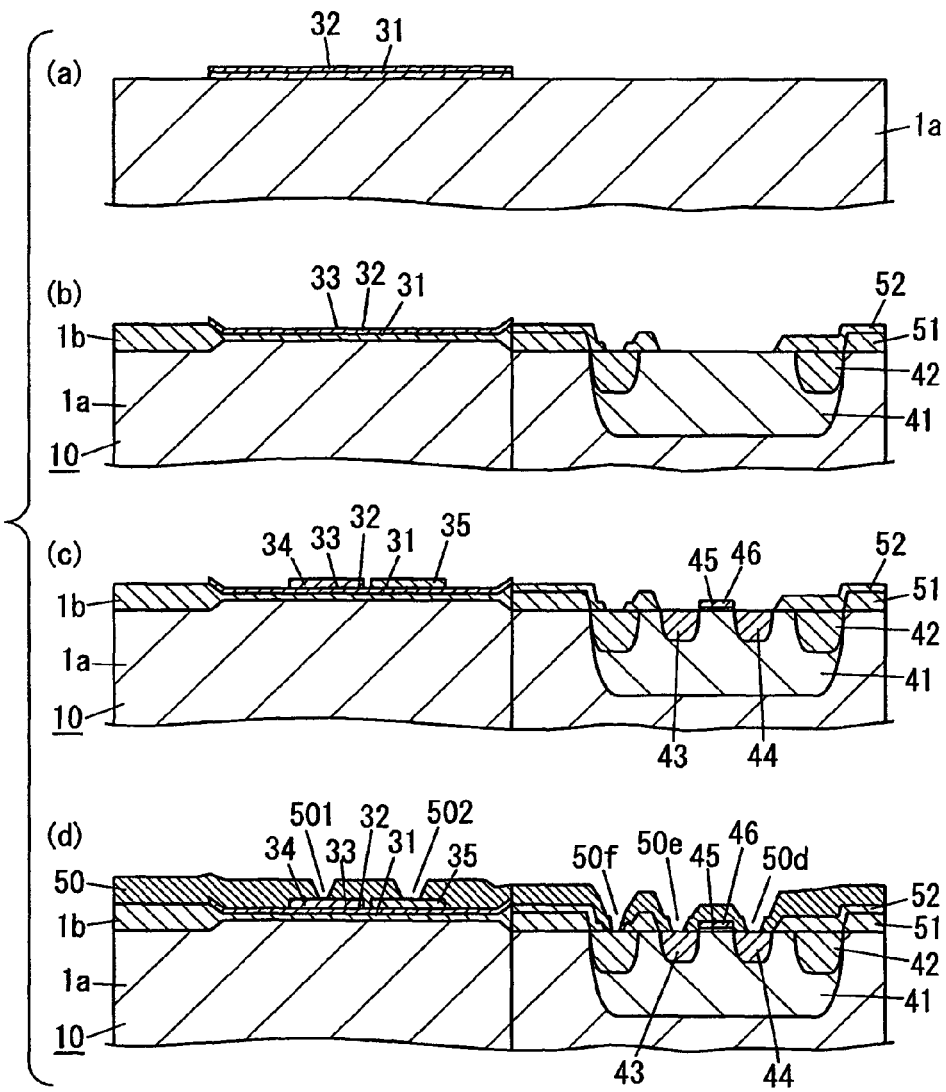
FIG. 5 is a process chart illustrating a method of manufacturing the above infrared sensor.
Figure 6:
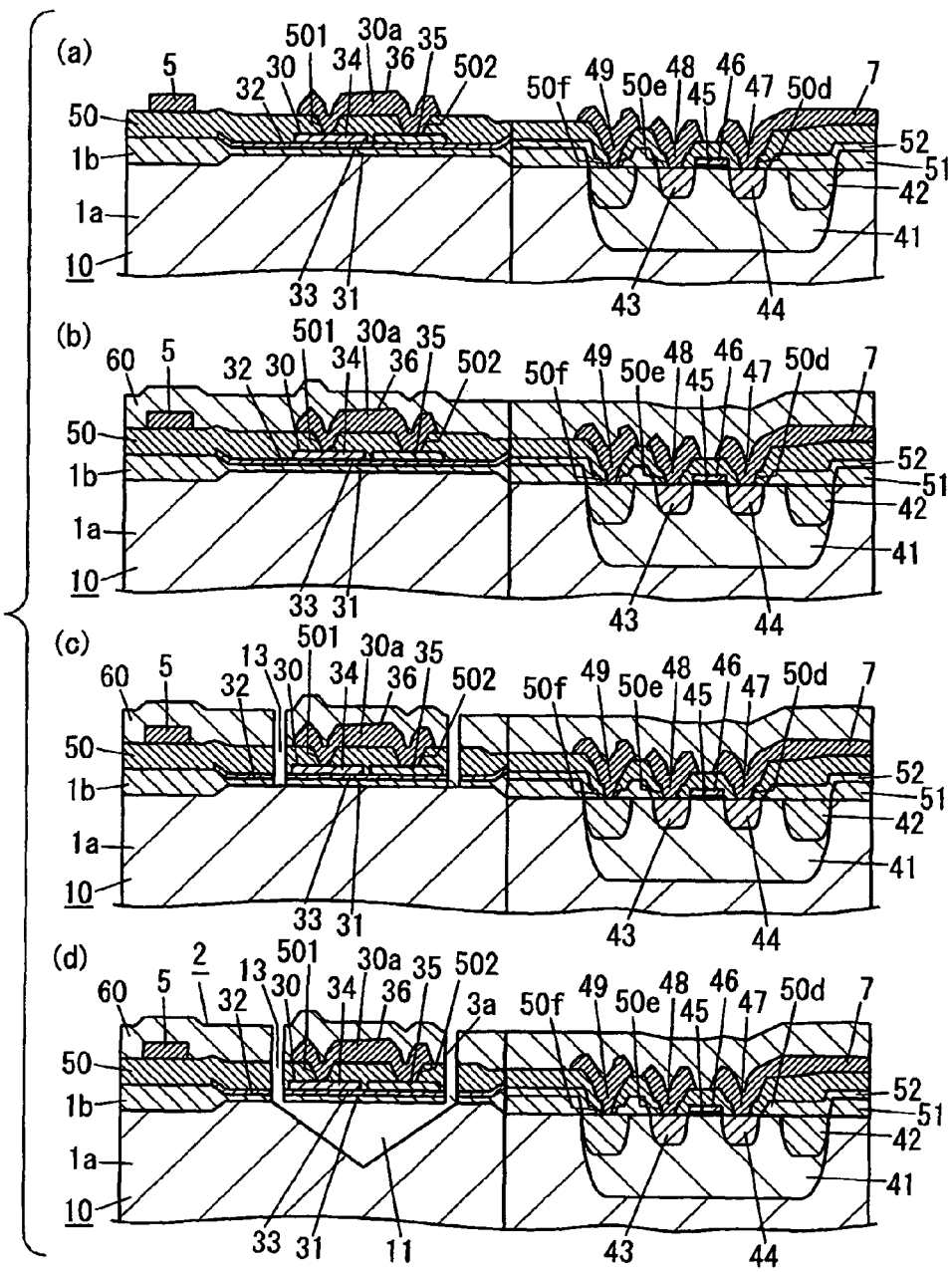
FIG. 6 is a process chart illustrating the method of manufacturing the above infrared sensor.

The following brief explanation is made to a method for manufacturing the infrared sensor 1, referring FIGS. 5 and 6.

First, an insulation layer forming step is performed. In the insulation layer forming step, an insulation layer is formed on the main surface of the silicon substrate 1a. The insulation layer is a laminated film of a first silicon dioxide film 31 having a first predetermined film thickness (e.g., 3000 Å), and the silicon nitride film 32 having a second predetermined film thickness (e.g., 900 Å). The silicon dioxide film 31 is formed by thermally oxidizing the main surface of the silicon substrate 1a at a predetermined temperature (e.g., 1100° C.). The silicon nitride film 32 is formed by use of an LPCVD technique.

After the insulation layer forming step, an insulation layer patterning step is performed. In the insulation layer patterning step, by use of the photolithography technique and the etching technique, a part of the insulation layer formed on the area A2 is removed yet a part of the insulation layer formed on the area A1 remains. Thereby, a structure illustrated in (a) of FIG. 5 is obtained.

After the insulation layer patterning step, a well region forming step is performed. In the well region forming step, the p-type well region 41 is formed in the main surface of the silicon substrate 1a. In more detail, by thermally oxidizing an exposed area of the main surface of the silicon substrate 1a at a predetermined temperature, a second silicon dioxide film (thermally-oxidized film) 51 is formed on a desired area of the main surface of the silicon substrate 1a. Thereafter, the silicon dioxide film 51 is patterned by use of the photolithography technique and the etching technique together with a mask for forming the p-type well region 41. Subsequently, the p-type well region 41 is formed by means of the ion implantation of a p-type impurity (e.g., boron) followed by the drive-in diffusion.

After the well region forming step, a channel-stopper region forming step is performed. In the channel-stopper region forming step, the $p^{30}$-type channel-stopper region 42 is formed in the p-type well region 41. In more detail, by thermally oxidizing the main surface of the silicon substrate 1a at a predetermined temperature, a third silicon dioxide film (thermally-oxidized film) 52 is formed on a desired area of the main surface of the silicon substrate 1a. Thereafter, the silicon dioxide film 52 is patterned by use of the photolithography technique and the etching technique together with a mask for forming the $p^+$-type channel-stopper region 42. Subsequently, the $p^+$-type channel-stopper region 42 is formed by means of the ion implantation of a p-type impurity (e.g., boron) followed by the drive-in diffusion. Besides, the first silicon dioxide film 31, the second silicon dioxide film 51, and the third silicon dioxide film 52 constitute the silicon dioxide film 1b. Thereby, a structure illustrated in (b) of FIG. 5 is obtained.

After the channel-stopper region forming step, a gate insulation film forming step is performed. In the gate insulation film forming step, the gate insulation film 45 made of a silicon dioxide film (thermally-oxidized film) having a predetermined film thickness (e.g., 600 ÅA) is formed on the main surface of the silicon substrate 1a by means of the thermal oxidization.

After the gate insulation film forming step, a polysilicon layer forming step is performed. In the polysilicon layer forming step, a non-doped polysilicon layer having a predetermined film thickness (e.g., 0.69 µm) is formed on the whole of the main surface of the silicon substrate 1a by use of an LPCVD technique. The non-doped polysilicon layer is used as a basis for forming the gate electrode 46, the horizontal signal line 6 (see FIG. 1A), the n-type polysilicon layer 34, the p-type polysilicon layer 35, and each of the safeguard films 39a and 39b.

After the polysilicon layer forming step, a polysilicon layer patterning step is performed. In the polysilicon layer patterning step, by use of the photolithography technique and the etching technique, the non-doped polysilicon layer is patterned in order to leave portions thereof respectively corresponding to the gate electrode 46, the horizontal signal line 6, the n-type polysilicon layer 34, the p-type polysilicon layer 35, and each of the safeguard films 39a and 39b.

After the polysilicon layer patterning step, a p-type polysilicon layer forming step is performed. The p-type polysilicon layer forming step is defined to perform an ion implantation of a p-type impurity (e.g., boron) to portions of the non-doped polysilicon layer respectively corresponding to the p-type polysilicon layer 35 and the p-type safeguard film 39*a*, followed by the drive diffusion, thereby forming the p-type polysilicon layer 35 and the p-type safeguard film 39*a*.

After the p-type polysilicon layer forming step, an n-type polysilicon layer forming step is performed. The n-type polysilicon layer forming step is defined to perform an ion implantation of an n-type impurity (e.g., phosphorus) to portions of the non-doped polysilicon layer respectively corresponding to the n-type polysilicon layer 34, the n-type safeguard film 39*b*, the gate electrode 46, and the horizontal signal line 6, followed by the drive diffusion, thereby forming the n-type polysilicon layer 34, the n-type safeguard film 39*b*, the gate electrode 46, and the horizontal signal line 6. Thereby, a structure illustrated in (c) of FIG. 5 is obtained. Besides, the order of the p-type polysilicon layer forming step and the n-type polysilicon forming layer may be reversed.

After both the p-type polysilicon layer forming step and the n-type polysilicon layer forming step, a source/drain forming step is performed. The source/drain forming step is defined to perform an ion implantation of an n-type impurity (e.g., phosphors) to regions of the p-type well region 41 respectively reserved for forming the n$^+$-type drain region 44 and the n$^+$-type source region 43. After that, the drive diffusion is performed to form the n$^+$-type drain region 44 and the n$^+$-type source region 43.

After the source/drain forming step, an interlayer dielectric film forming step is performed. In the interlayer dielectric film forming step, the interlayer dielectric film 50 is formed over the main surface of the silicon substrate 1*a*. In more detail, the planarized interlayer dielectric film 50 is formed by depositing a BPSG film having a predetermined film thickness (e.g., 8000 Å) over the main surface of the silicon substrate 1*a* by use of CVD technique followed by reflowing the deposited BPSG film at a predetermined temperature (e.g. 800° C.).

After the interlayer dielectric film forming step, a contact hole forming step is performed. In the contact hole forming step, the contact holes 501, 502, 50*b*, 50*c*, 50*d*, 50*e*, and 50*f* are formed in the interlayer dielectric film 50 by use of the photolithography technique and the etching technique. Thereby, a structure illustrated in (d) of FIG. 5 is obtained.

After the contact hole forming step, a metal film forming step is performed. In the metal film forming step, over the whole of the main surface of the silicon substrate 1*a* is formed, by use of the sputtering, a metal film (e.g., Al—Si film) having a predetermined film thickness (e.g., 2 μm). The above metal film is a basis for forming the connection layer 36, each of the electrodes 38*a* and 38*b*, the drain electrode 47, the source electrode 48, the reference bias line 5, the metal line 59, the vertical read-out line 7, the ground line 8, the common ground line 9, and each of the pads Vout, Vsel, Vref, Vdd, and Gnd.

After the metal film forming step, a metal film patterning step is performed. In the metal film patterning step, by patterning the metal film by use of the photolithography technique and the etching technique, the connection layer 36, each of the electrodes 38*a* and 38*b*, the drain electrode 47, the source electrode 48, the reference bias line 5, the vertical read-out line 7, the ground line 8, the common ground line 9, and each of the pads Vout, Vsel, Vref, Vdd, and Gnd. Thereby, a structure illustrated in (a) of FIG. 6 is obtained. Besides, in the metal film patterning step, the metal film is etched by use of RIE.

After the metal film patterning step, a passivation film forming step is performed. In the passivation film forming step, the passivation film 60 is formed over the whole of the main surface of the silicon substrate 1*a* (in other words, on the interlayer dielectric film 50) by use of the CVD technique. The passivation film 60 is a laminated film of the PSG film having a predetermined film thickness (e.g., 5000 Å) and the NSG film having a predetermined film thickness (e.g., 5000 Å). Thereby, a structure illustrated in (b) of FIG. 6 is obtained.

After the passivation film forming step, a laminate structure patterning step is performed. In the laminate structure patterning step, the thin film structure is formed by patterning a laminate structure which is composed of the thermal insulation layer defined as a laminate of the silicon dioxide film 31 and the silicon nitride film 32, the temperature detection member 30 formed on the thermal insulation layer, the interlayer dielectric film 50 formed over the thermal insulation layer to cover the temperature detection member 30, and the passivation film 60 formed on the interlayer dielectric film 50. Thereby, a structure illustrated in (c) of FIG. 6 is obtained. Besides, in the laminate structure patterning step, the plural (two, in the present embodiment) slits 13 are formed. Each of the slits 13 is configured to penetrate the laminate structure along a thickness direction thereof and to separate the infrared absorption member 33 from the base 10 is formed. The above laminate structure is completed by forming these slits 13.

After the laminate structure patterning step, an opening forming step is performed. In the opening forming step, openings (not shown) is formed by use of the photolithography technique and the etching technique. The openings are designed to expose the pads Vout, Vsel, Vref, Vdd, and Gnd, respectively. In the opening forming step, the openings are formed by use of the RIE.

After the opening forming step, a cavity forming step is performed. In the cavity forming step, by making anisotropic etching of the silicon substrate 1*a* with an etchant poured into each of the slits 13, the cavity 11 is formed in the silicon substrate 1*a*. Thereby, the infrared sensor 1 in which the pixels 2 are arranged in a two dimensional array manner is obtained, as shown in (d) of FIG. 6. In the cavity forming step, TMAH solution heated to a predetermined temperature (e.g., 85° C.) is used as the etchant. The etchant is not limited to the TMAH solution, but may be alkaline solution (e.g., KOH solution).

Besides, all the steps from the insulation layer forming step to the cavity forming step are performed at wafer level. Therefore, after completion of the cavity forming step, a separation step is made to separate the infrared sensors 1 from each other.

In addition, the MOS transistor 4 is formed by means of a known and common manufacturing method of MOS transistors. In other words, the p-type well region 41, the p$^+$-type channel-stopper region 42, the n$^+$-type drain region 44, and the n$^+$-type source region 43 are formed by repeating basic steps, that is, a step of forming a thermally-oxidized film by use of thermal oxidation, a step of patterning the thermally-oxidized film by use of the photolithography technique and the etching technique, a step of implementing an impurity, and a step of performing drive-in diffusion (diffusion of impurities).

According to the infrared sensor 1 explained in the above, the temperature detection member 30 detects the temperature difference between the infrared absorption member 33 and the base 10 by use of the thermocouple 30*a*. Therefore, it is unnecessary to supply electrical current to the temperature detection member 30. Since the temperature detection member 30 does not heat itself as opposed to the temperature detection member 30 made of a resistive bolometer, the infrared absorption member 33 and also the thin film structure 300 are kept free from a warp which would otherwise occur due to the self-heating of the temperature detection member 30, thereby contributing to reduce power consumption. Moreover, since the sensitivity is kept constant irrespective of temperature, the accuracy of the infrared sensor is improved.

Additionally, in the infrared sensor 1, each of the p-type polysilicon layer 35 and the n-type polysilicon layer 34 has its impurity concentration in a range of $10^{18}$ to $10^{20}$ cm$^{-3}$. Further, each of the p-type polysilicon layer 35 and the n-type polysilicon layer 34 has its thickness of $\lambda/4n_1$. Therefore, it is possible to the absorption efficiency of each of the polysilicon layers 34 and 35 for the targeted infrared, and therefore the sensitivity can be improved.

Moreover, the infrared sensor 1 includes the infrared absorption film 70 formed over an opposite surface of the p-type polysilicon layer 35 and the n-type polysilicon layer 34 from the base 10. Since the infrared absorption film 70 has its thickness $t_2$ of $\lambda/4n_2$, it is possible to more enhance the absorption efficiency of the infrared absorption film 70 for the targeted infrared, and therefore the sensitivity can be improved.

Further, in the infrared sensor 1, the p-type polysilicon layer 35 and the n-type polysilicon layer 34 have the same thickness. Therefore, at the time of manufacturing the infrared sensor 1, the non-doped polysilicon layers which are respectively bases of the p-type polysilicon layer 35 and the n-type polysilicon layer 34 can be formed through a single deposition process (the aforementioned polysilicon layer forming step). Thus, it is possible to reduce the production cost.

In addition, on the infrared incident surface of the infrared absorption member 33 are formed the safeguard films 39a and 39b configured to serve to protect the infrared absorption member 33 and to prevent a warp of the infrared absorption member 33 at the time of forming the p-type polysilicon layer 35 and the n-type polysilicon layer 34. Thus, it is possible to prevent the infrared absorption member 33 from being etched to be thinned at the time of forming the p-type polysilicon layer 35 and the n-type polysilicon layer 34. In brief, in the polysilicon layer patterning step, it is possible to prevent thinning of the silicon nitride film 32 caused by over-etching which may occur at the time of etching the non-doped polysilicon layer. In addition, uniform distribution of the stress in the thin film structure 300 can be enhanced. Consequently, it is possible to make the infrared absorption member 33 thin, yet keeping the infrared absorption member 33 (thin film structure 300) free from a warp, and therefore it is possible to improve the sensitivity.

The safeguard films 39a and 39b are preferred to be formed to cover, in cooperation with the temperature detection member 30, an approximately entire surface of the infrared absorption member 33. Notably, it is necessary to avoid contact of the p-type safeguard film 39a with the n-type safeguard film 39b. It is necessary to prevent the safeguard films 39a and 39b from being etched by the etchant (e.g., TMAH solution) used in the cavity forming step. Thus, the safeguard films 39a and 39b are shaped not to be exposed on an inner aspect of the slit 13. In brief, the safeguard films 39a and 39b are formed not to cover the outer periphery of the infrared absorption member 33.

Further, in the infrared sensor 1, the p-type polysilicon layer 35, the n-type polysilicon layer 34, and each of the safeguard films 39a and 39b have the same thickness. Therefore, the uniform distribution of the stress in the thin film structure 300 can be enhanced. Thus, it is possible to keep the infrared absorption member 33 free from a warp.

Furthermore, in the infrared sensor 1, the p-type polysilicon layer 35, the n-type polysilicon layer 34, and each of the safeguard films 39a and 39b are formed in a common plane. Therefore, the uniform distribution of the stress in the thin film structure 300 can be enhanced. Thus, it is possible to keep the infrared absorption member 33 free from a warp.

Moreover, since the infrared sensor 1 includes the MOS transistor 4 for each pixel 2, it is possible to reduce the number of the output pads Vout, and therefore it is possible to downsize the infrared sensor 1 and reduce the production cost thereof.

Additionally, in the infrared sensor 1, the polysilicon layer forming the gate electrode 46 of the MOS transistor 4 has the same thickness as the p-type polysilicon layer 35 and the n-type polysilicon layer 34. Consequently, it is possible to form the gate electrode 46 of the MOS transistor 4 as well as the p-type polysilicon layer 35 or the n-type polysilicon layer 34 through the same process. Thus, it is possible to decrease the number of the steps of the method for manufacturing the infrared sensor, and therefore the production cost can be reduced.

In the infrared sensor 1, the n-type polysilicon layer which is a polysilicon layer forming the gate electrode 46 of the MOS transistor 4 have the same thickness as the n-type safeguard film 39b. Consequently, it is possible to form the gate electrode 46 of the MOS transistor 4 as well as the n-type safeguard film 39b through the same process. Thus, it is possible to decrease the number of the steps of the method for manufacturing the infrared sensor, and therefore the production cost can be reduced.

Besides, the infrared sensor 1 may includes the single infrared detection element 3.

Second Embodiment

The infrared sensor 1A of the present embodiment is different from the infrared sensor 1 of the first embodiment in the pixel 2A and the temperature detection member 30A. Configurations common to the infrared sensor 1A and the infrared sensor 1 are designated by the same reference numerals, and no explanations thereof are made.

Each of the pixels 2A is provided with no MOS transistor 4.

The temperature detection member 30A includes the four thermocouples 30a each of which includes an n-type polysilicon layer 34, a p-type polysilicon layer 35, and a connection layer 36. The second end of the p-type polysilicon layer 35 of the thermocouple 30a is connected to the second end of the n-type polysilicon layer 34 of the thermocouple 30a next thereto by use of a connection layer 37 made of a metal material (e.g., Al—Si). As described in the above, the four thermocouples 30a are connected in series with each other to constitute a thermopile.

The aforementioned thermopile includes hot junctions each constituted by the first end of the n-type polysilicon layer 34, the first end of the p-type polysilicon layer 35, and the connection layer 36, and cold junctions each constituted by the second end of the p-type polysilicon layer 35, the second end of the n-type polysilicon layer 34, and the connection layer 37. The hot junctions are disposed over the infrared absorption member 33, and the cold junctions are disposed over the base 10.

The method for manufacturing the infrared sensor 1A is different from the method for manufacturing the infrared sensor 1 in the laminated structure patterning step and the cavity forming step. In the laminated structure patterning step of the present embodiment, four rectangular slits 14 which penetrate the laminated structure in a thickness direction thereof are respectively formed in four corners of a projected area of an area reserved for forming the cavity 11 of the silicon substrate 1a in order to form the thin film structure 300. In the cavity forming step of the present embodiment, the four slits 14 are used as etchant conduits. Besides, since the infrared sensor 1A is provided with no MOS transistors 4, the first silicon dioxide film 31 defines the silicon dioxide film 1b solely.

Figure 7C:
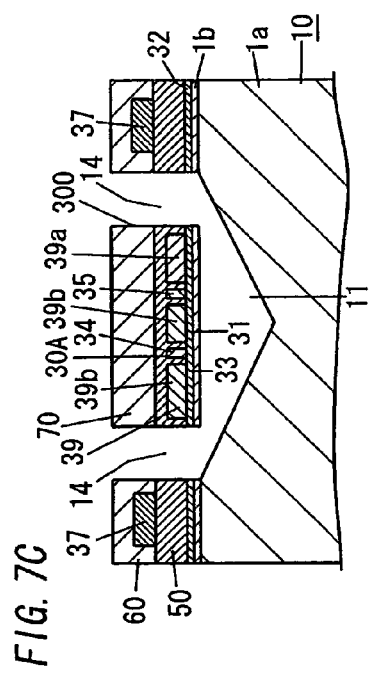
FIG. 7C is shows a cross sectional view of the infrared sensor of the second embodiment along the line D-D of FIG. 7A.
Figure 7B:
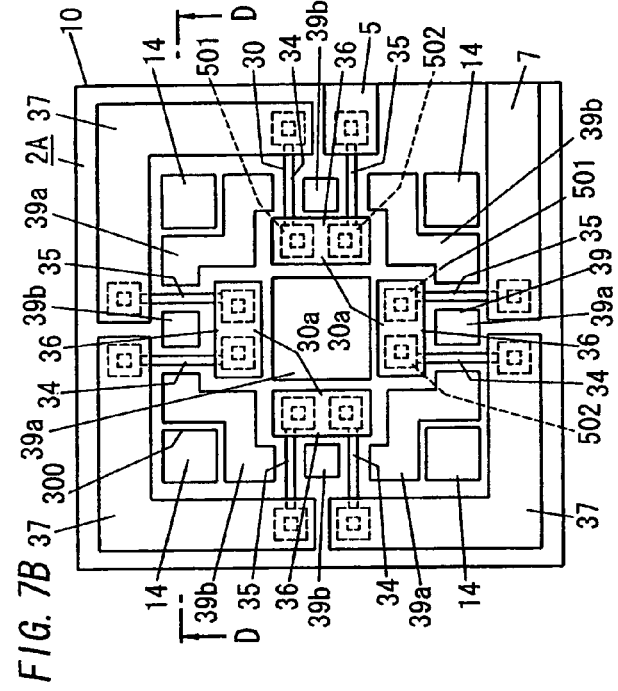
FIG. 7B is an enlarged view illustrating the infrared sensor of the second embodiment.
Figure 7A:
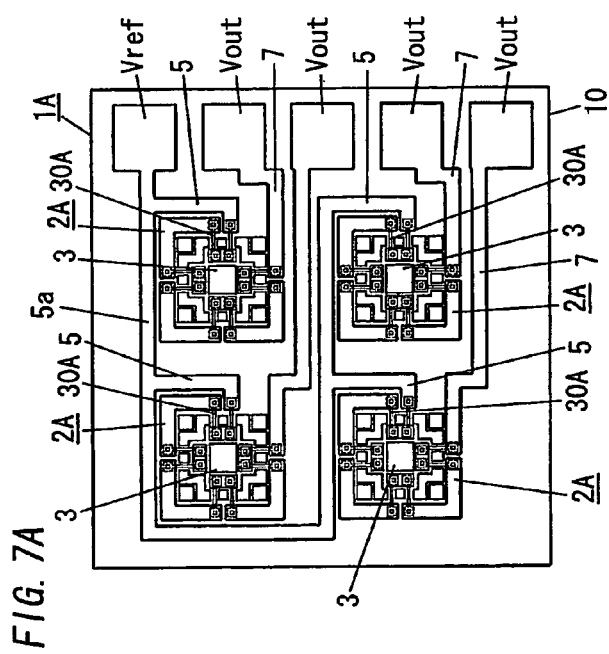
FIG. 7A is a plane view illustrating an infrared sensor of the second embodiment.
Figure 8:
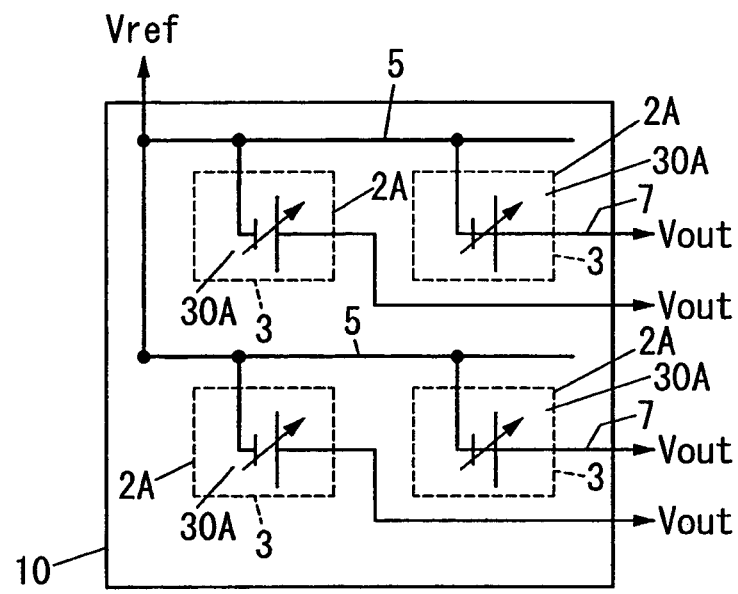
FIG. 8 is an equivalent circuit schematic illustrating the above infrared sensor.

As shown in FIGS. 7 and 8, the infrared sensor 1A includes the plural (four, in the illustrated instance) output pads Vout, and the single reference bias pad Vref. The output pads Vout are connected to the first ends of the temperature detection members 30, respectively. For each row, the reference bias pad Vref is connected to the second ends of the temperature detection members 30A of the plural (two, in the illustrated instance) infrared detection elements 3. According to the infrared sensor 1A, it is enabled to read out a time-series data of the outputs from all the infrared detection elements 3. Besides, the temperature detection member 30A has its first end electrically connected to the output pad Vout via the vertical read-out line 7. The temperature detection member 30A has its second end electrically connected to the common reference bias line 5a connected to the reference bias pad Vref, by use of the reference bias line 5. Besides, in FIG. 8, the temperature detection member 30A is illustrated as its equivalent circuit including a voltage source.

For example, while the electrical potential of 1.65 V is applied to the reference bias pad Vref, the output pad Vout outputs the output voltage (1.65 V+the output voltage of the temperature detection member 30A) of the pixel 2A.

Figure 9:
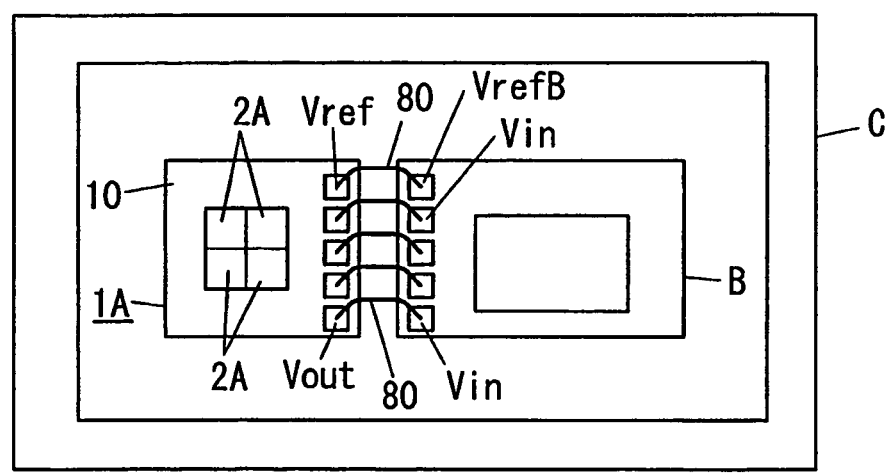
FIG. 9 is a schematic plane view illustrating an infrared sensor module including the above infrared sensor.

FIG. 9 shows the infrared sensor module including the infrared sensor 1A, the signal processing device B configured to process the output voltage being the output signal of the infrared sensor 1A, and the package C on which the infrared sensor 1A and the signal processing device B are mounted.

Figure 10:
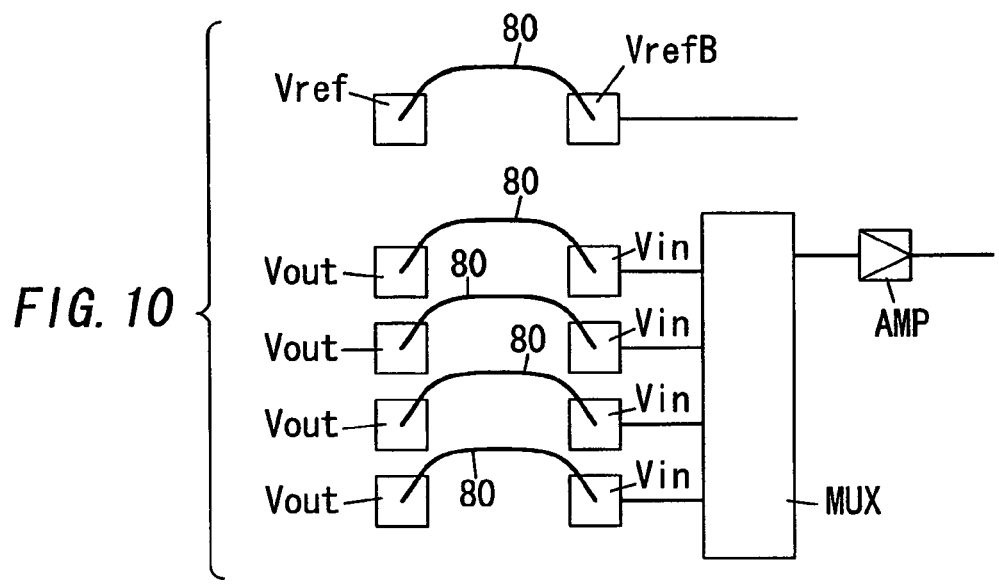
FIG. 10 is an explanatory view illustrating the infrared sensor module including the above infrared sensor.

As shown in FIG. 10, the signal processing device B includes the plural (four, in the illustrated instance) input pads Vin, and a pad VrefB. The input pads Vin are electrically connected to the output pads Vout of the infrared sensor 1A by use of lines 80, respectively. The pad VrefB is adapted in use to apply the reference voltage to the reference bias pad Vref of the infrared sensor 1A. The pad VrefB is electrically connected to the reference bias pad Vref via a line 80. The signal processing device B further includes the amplifier circuit AMP and the multiplexer MUX. With use of the signal processing device B, it is possible to generate an infrared image.

Figure 11A:
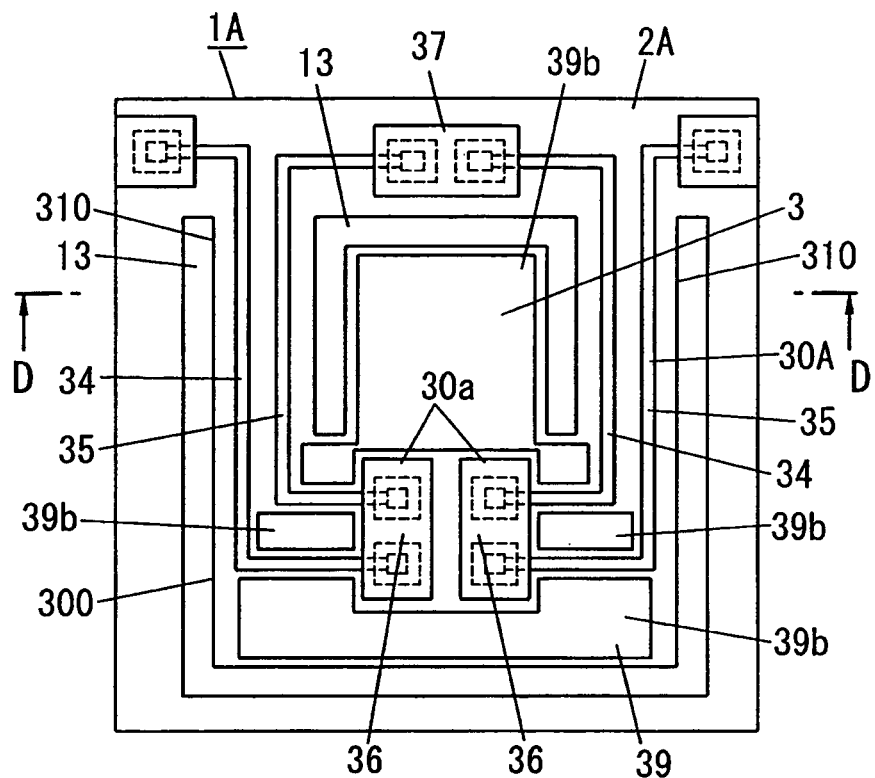
FIG. 11A is a plane view illustrating a modification of the above infrared sensor.
Figure 11B:
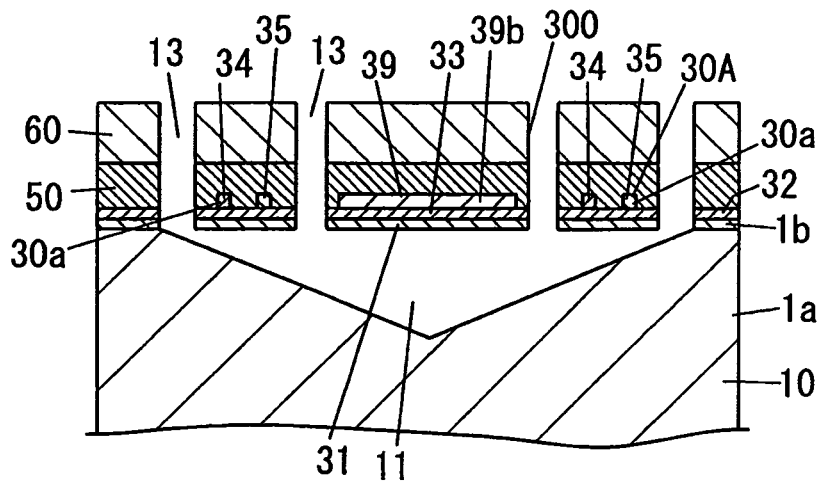
FIG. 11B shows a cross sectional view of the modification of the above infrared sensor along the line D-D of FIG. 11A.

FIG. 11 shows a modification of the infrared sensor 1A of the present embodiment. In the modification illustrated in the FIG. 11, the temperature detection member 30A is a thermopile comprising the two thermocouples 30a connected in series with each other. Further, in the modification, the thin film structure 300 is linked to the base 10 by use of the two support members 310.

Figure 12A:
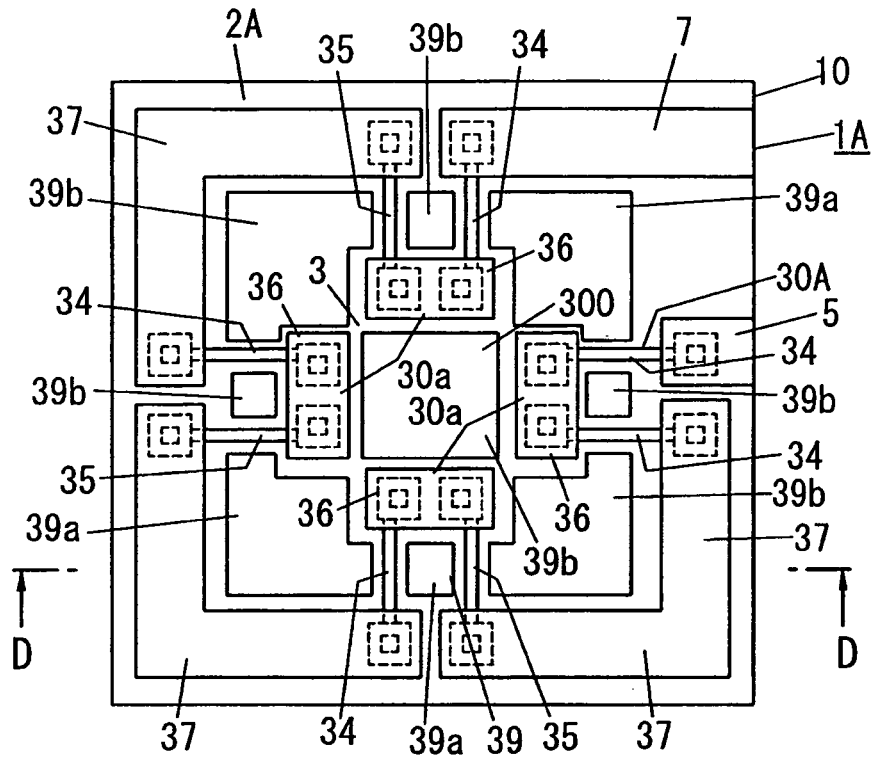
FIG. 12A is a plane view illustrating another modification of the above infrared sensor.
Figure 12B:
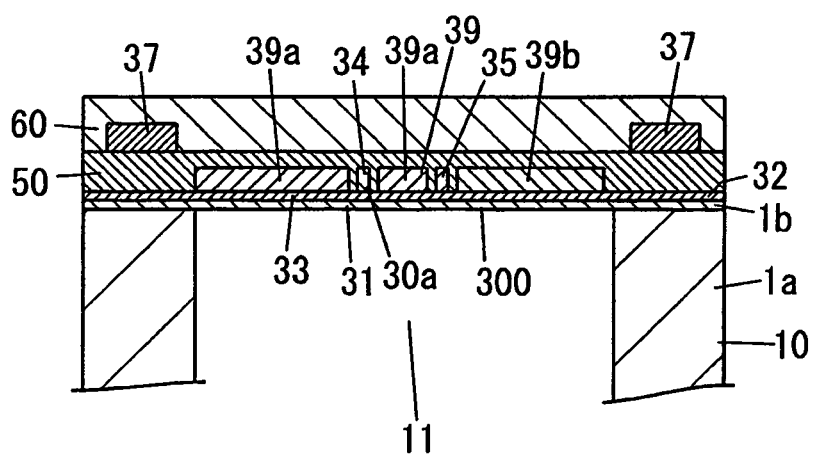
FIG. 12B shows a cross sectional view of said another modification of the above infrared sensor along the line D-D of FIG. 12A.

FIG. 12 shows another modification of the infrared sensor 1A. In the modification illustrated in the FIG. 12, the cavity 11 is formed to penetrate through the silicon substrate 1a in its thickness direction. In brief, the thin film structure 300 is formed into a diaphragm shape.

Third Embodiment

The following explains the infrared sensor 1B of the present embodiment with reference to FIGS. 13 to 37.

The infrared sensor 1B of the present embodiment is mainly different from the infrared sensor 1 of the first embodiment in the thin film structure 300B. Besides, components common to the infrared sensor 1B and the infrared sensor 1 are designated by the same reference numerals, and no explanations thereof are made.

Figure 15:
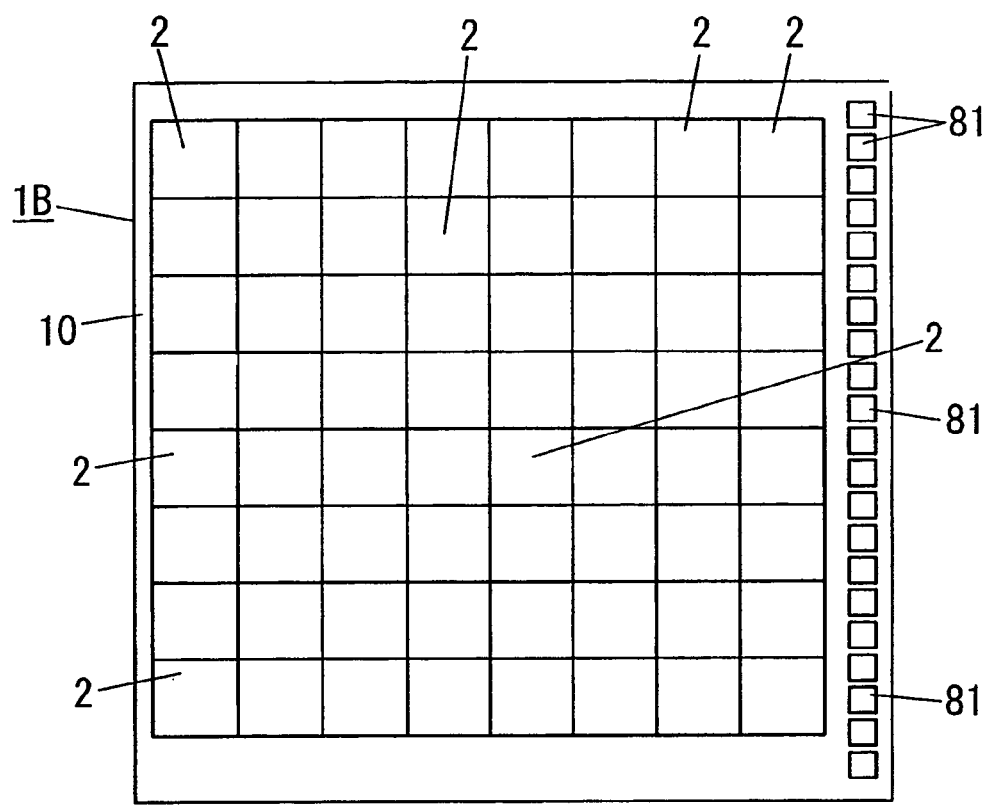
FIG. 15 is a schematic plane view illustrating the above infrared sensor.
Figure 25:
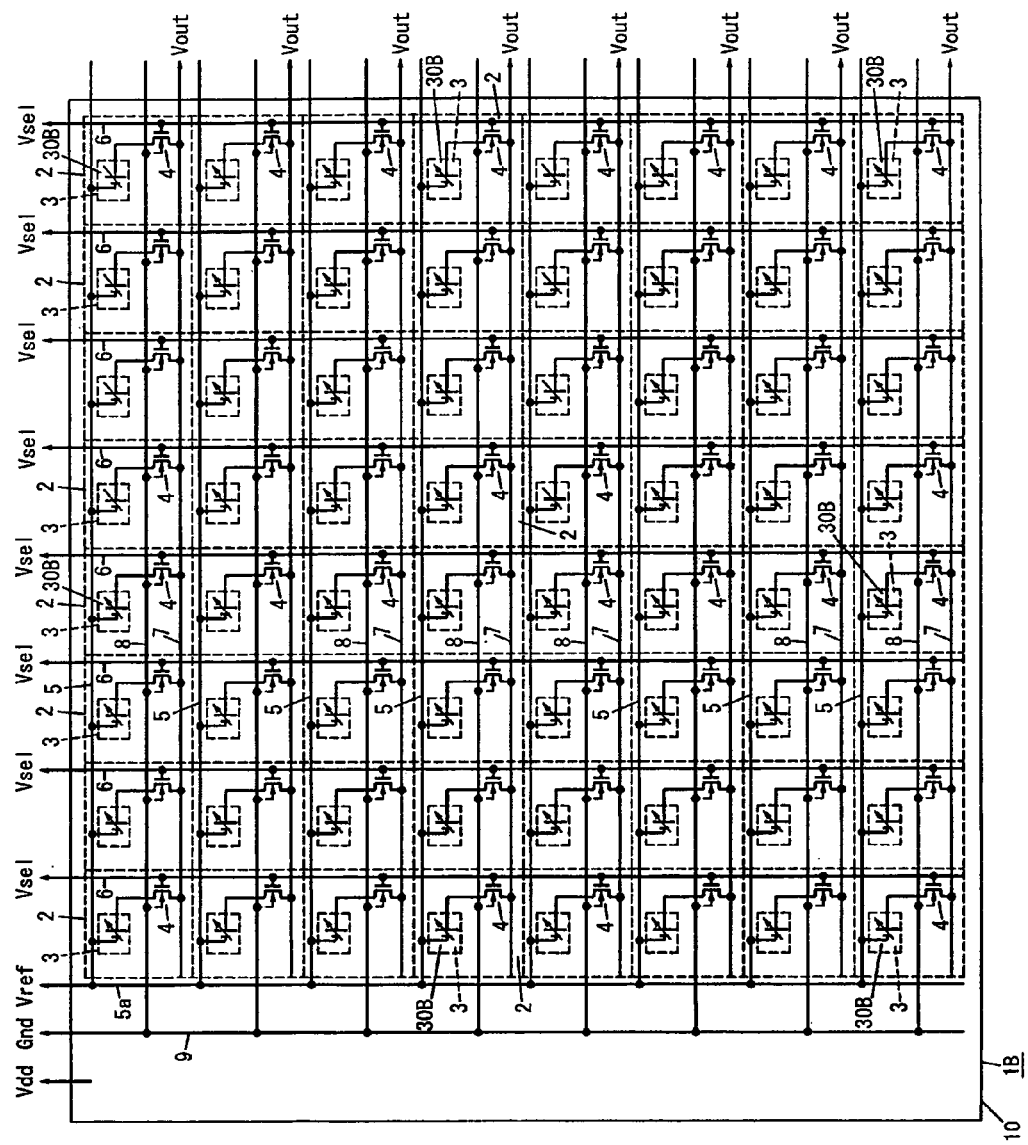
FIG. 25 is an equivalent circuit schematic illustrating the above infrared sensor.

In the infrared sensor 1B, as shown in FIGS. 15 and 25, the 8 by 8 pixels 2 are formed over the first surface of the single base 10. The number and arrangement of the pixels 2 are not limited.

Besides, in FIG. 15, the pixel selections Vsel, the reference bias pad Vref, the ground pad Gnd, the output pads Vout, and the like are illustrated, with no distinction, as pads 81.

Figure 26:
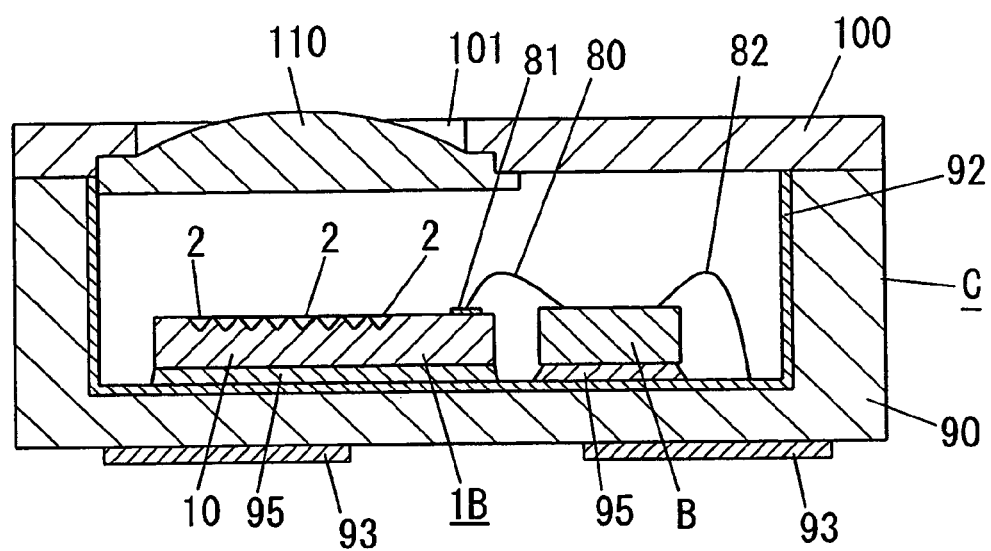
FIG. 26 is a schematic cross sectional view illustrating the infrared sensor module including the above infrared sensor.

FIG. 26 shows the infrared sensor module including the infrared sensor 1B (infrared array sensor module). This infrared sensor module includes the infrared sensor 1B, the signal processing device B configured to process the output voltage being the output signal of the infrared sensor 1A, and the package C on which the infrared sensor 1A and the signal processing device B are mounted.

The package C comprises a package body 90, and a package lid 100. The package body 90 is a multilayered ceramic substrate (ceramic package) which is formed into a rectangular box shape and is provided with an opening in its surface (upper surface). The infrared sensor 1B and the signal processing device B are mounted (installed) on an inner bottom surface of the package body 90. The package lid 100 is a metal lid, and is provided with a lens converging infrared to the infrared sensor 1B. According to the package C, an air tight space surrounded by the package body 90 and the package lid 100 defines a dry nitrogen atmosphere. The package lid has its outer periphery fixed to a rectangular patterned metal (not shown) formed on the surface of the package body 90 by means of seam welding. The package body 90 may be made by superimposing glass epoxy resin substrates.

On an inner surface of the package body 90 is formed a shield patterned conductor 92. The infrared sensor 1B and the signal processing device B are bonded to the shield patterned conductor 92 by use of junction layers 95 made of an electrically conductive junction material (e.g., solder and silver paste). For example, a method of bonding the infrared sensor 1B and the signal processing device B to the package body 90 can be selected one from normal temperature bonding method, Au—Sn eutectic bonding method, and Au—Si eutectic bonding method. In contrast to a bonding with the use of an electrically conductive material, a direct bonding such as normal temperature bonding can improve accuracy of distance between the infrared sensor 1A and the lens 110.

The lens 110 is made of silicon which is one of infrared transparent materials. The lens 110 can be made by use of a method for manufacturing a semiconductor lens using an anode oxidation technique (e.g., methods for manufacturing semiconductor lenses disclosed in Japanese patent publications No. 3897055 and No. 3897056), for example. The lens 110 is fixed, by use of an electrically conductive adhesive (e.g., solder and silver paste), to a periphery of an aperture 101 of the package lid 100 so as to cover the aperture 101 of the package lid 100. The lens 110 further is electrically connected to the shield patterned conductor 92. Therefore, the infrared array sensor module can suppress a decrease in the S/N ration caused by external electromagnetic noises. Besides, the lens 110 may be provided with an infrared optical filter, as necessary. The infrared optical filter may be a bandpass filter or a broadband rejection filter. Such an infrared optical filter can be made by alternately superimposing plural kinds of thin films having different refractive indexes.

The thin film structure 300B is formed to cover the cavity 11 which thermally insulates the infrared absorption member 33 from the base 10. In the present embodiment, the cavity 11 is formed into a square pyramid shape. Therefore, in a situation where the base 10 is made of the silicon substrate 1a, the cavity can be easily formed by use of anisotropic etching with alkaline solution.

The thin film structure 300B is divided into plural (six, in the illustrated instance) small and thin film structures 301 by plural linear slits 15. In brief, the thin film structure 300B comprises a plurality of the small and thin film structures 301. The plural small and thin film structures 301 are arranged in line along a circumference direction of the cavity 11. Each of the small and thin film structures 301 extends from an edge of the cavity 11 in the base 10 to an inside of the cavity 11. Each of the small and thin film structures 301 includes an infrared absorption member 33 and a temperature detection member 30B. As apparent from the above, the thin film structure 300B includes the plural (six, in the illustrated instance) infrared absorption members 33 arranged inside the cavity 11. Further, the thin film structure 300B includes connection members 320 configured to connect together the small and thin film structures 301 and 301 which are adjacent to each other.

Each of the temperature detection members 30B is disposed over a corresponding infrared absorption member 33. All the temperature detection members 30B are electrically connected to each other in such a relation as to provide a temperature-dependent output (output varied by a change in temperature) which is greater than any single one of the temperature detection members 30B.

In the present embodiment, all the temperature detection members 30B are connected in series with each other. All the temperature detection members thus connected in series with each other give an overall output which is equal to the sum of thermal electromotive forces of the individual temperature detection members 30B, and therefore provide the temperature-dependent output which is greater than any single one of the temperature detection members 30B, thereby improving sensitivity.

Besides, all the temperature detection members 306 need not be connected in series with each other. For example, two series circuits of three temperature detection members 30B may be connected in parallel with each other. This arrangement can improve the sensitivity, in contrast to a situation where all the temperature detection members 30B are connected in parallel with each other or a situation where the temperature detection members 30B are not connected to each other. Further, it is possible to decrease an electric resistance of an electrical circuit of the six temperature detection members 30B in contrast to a situation where all the temperature detection members 30B are connected in series with each other. Thus, a thermal noise can be reduced, and therefore the S/N ratio can be improved.

Further, it is sufficient that the temperature detection member 30B is a thermal type infrared detection member. Therefore, a pyroelectric element can be adopted as the temperature detection member 30B. In this situation, to connect the plural temperature detection members 30B in parallel with each other gives the sum of electric charges caused by a pyroelectric effect is output, and therefore provides the temperature-dependent output which is greater than that of any single one of the temperature detection members 30B.

The thin film structure 300B includes, for each small and thin film structure 301, two support members 310 each connecting the infrared absorption member 33 to the base 10. The two support members 310 are formed into a strip shape, and are spaced from each other in the circumference direction of the cavity 11. Further, the thin film structure 3006 is provided with U-shaped slits 13 each of which spatially separates the infrared absorption member 33 from two support members 310 and communicates to the cavity 11. The base 10 has a rectangular frame-shaped portion surrounding the thin film structure 300B. The support member 301 has portions respectively connected to the infrared absorption member 33 and the base 10, and a remaining portion spatially separated from the infrared absorption member 33 and the base 10. In the present embodiment, the small and thin film structure 301 has a length of 93 μm in an extension direction from the base 10. The small and thin film structure 301 has a width of 75 μm in a width direction which is orthogonal to the extension direction thereof. Each of the support members 310 has a width of 23 μm. Each of the slits 13 and 15 has a width of 5 μm. These values are illustrative only.

The thin film structure 300B is formed by patterning the laminated structure of the silicon dioxide film 1b, the silicon nitride film 32, the temperature detection member 30B, the interlayer dielectric film 50, and the passivation film 60 in a similar fashion as the thin film structure 300.

The connection member 320 is formed into a cross shape, and is configured to connect together the small and thin film structures 301 which are juxtaposed to each other in a diagonal direction crossing the extension direction of the small and thin film structure 301. Further, the connection member 320 is configured to connect together the small and thin film structures 301 which are juxtaposed to each other in the extension direction of the small and thin film structure 301. Moreover, the connection member 320 is configured to connect together the small and thin film structures 301 which are juxtaposed to each other in a direction perpendicular to the extension direction of the small and thin film structure 301.

The temperature detection member 30B is a thermopile, and includes the plural (nine, in the illustrated instance) thermopiles 30a connected in series with each other. As described in the second embodiment, the adjacent thermocouples 30a are electrically connected with each other via the connection layer 37. Also in the present embodiment, the first end of the n-type polysilicon layer 34, the first end of the p-type polysilicon layer 35, and the connection layer 36 constitute the hot junction, and the second end of the n-type polysilicon layer 34, the second end of the p-type polysilicon layer 35, and the connection layer 37 constitute the cold junction in a similar fashion as the second embodiment. The hot junctions are disposed over the infrared absorption member 33, and the cold junctions are disposed over the base 10.

Figure 20A:
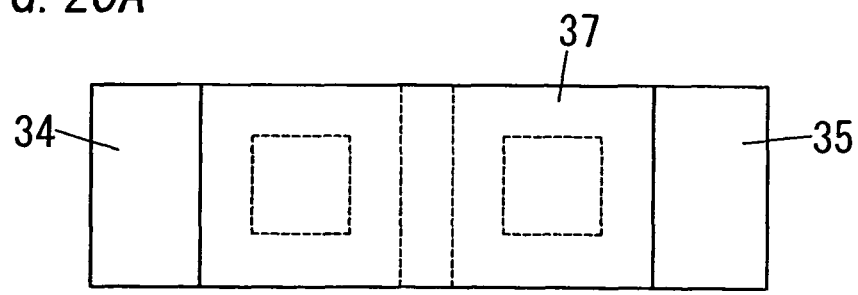
FIG. 20A is a partial plane view illustrating the above infrared sensor.
Figure 20B:
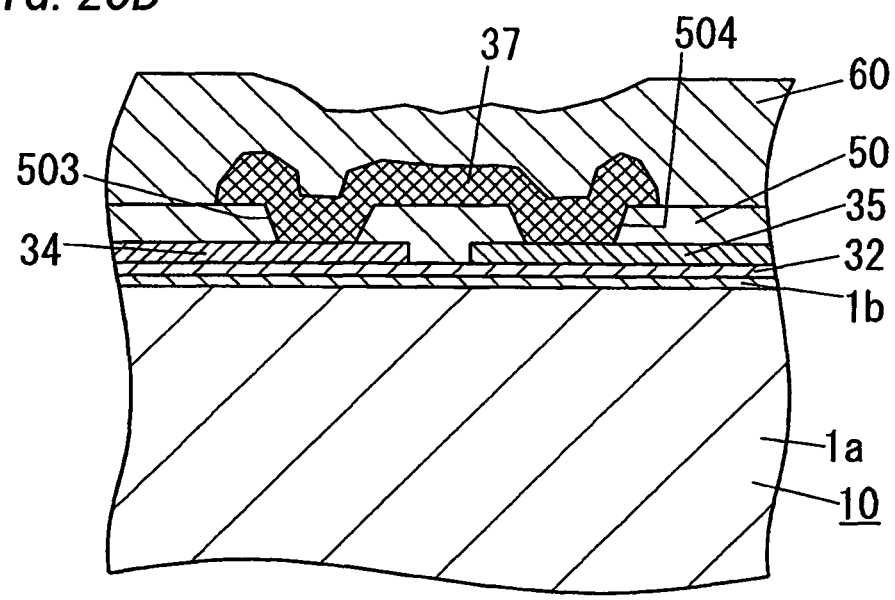
FIG. 20B is a schematic cross sectional view illustrating the above infrared sensor.
Figure 21A:
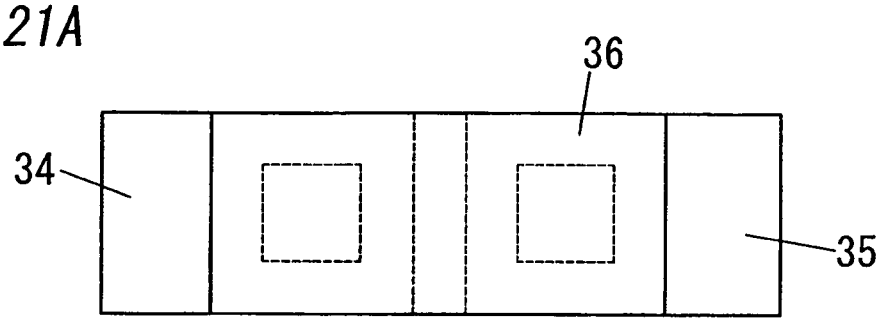
FIG. 21A is a partial plane view illustrating the above infrared sensor.
Figure 21B:
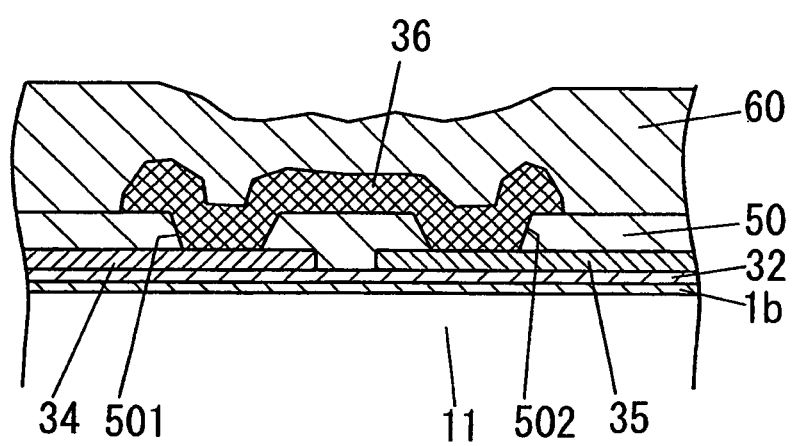
FIG. 21B is a schematic cross sectional view illustrating the above infrared sensor.

The connection layer 36 and 37 are isolated from each other by the interlayer dielectric film 50 (see FIGS. 20 and 21). In brief, the connection layer 36 of the hot junction is electrically connected to the first ends of both polysilicon layers 34 and 35 via contact holes 501 and 502 formed in the interlayer dielectric film 50, respectively. The connection layer 37 of the cold junction is electrically connected to the second ends of both polysilicon layers 34 and 35 via contact holes 503 and 504 formed in the interlayer dielectric film 50, respectively.

Figure 13:
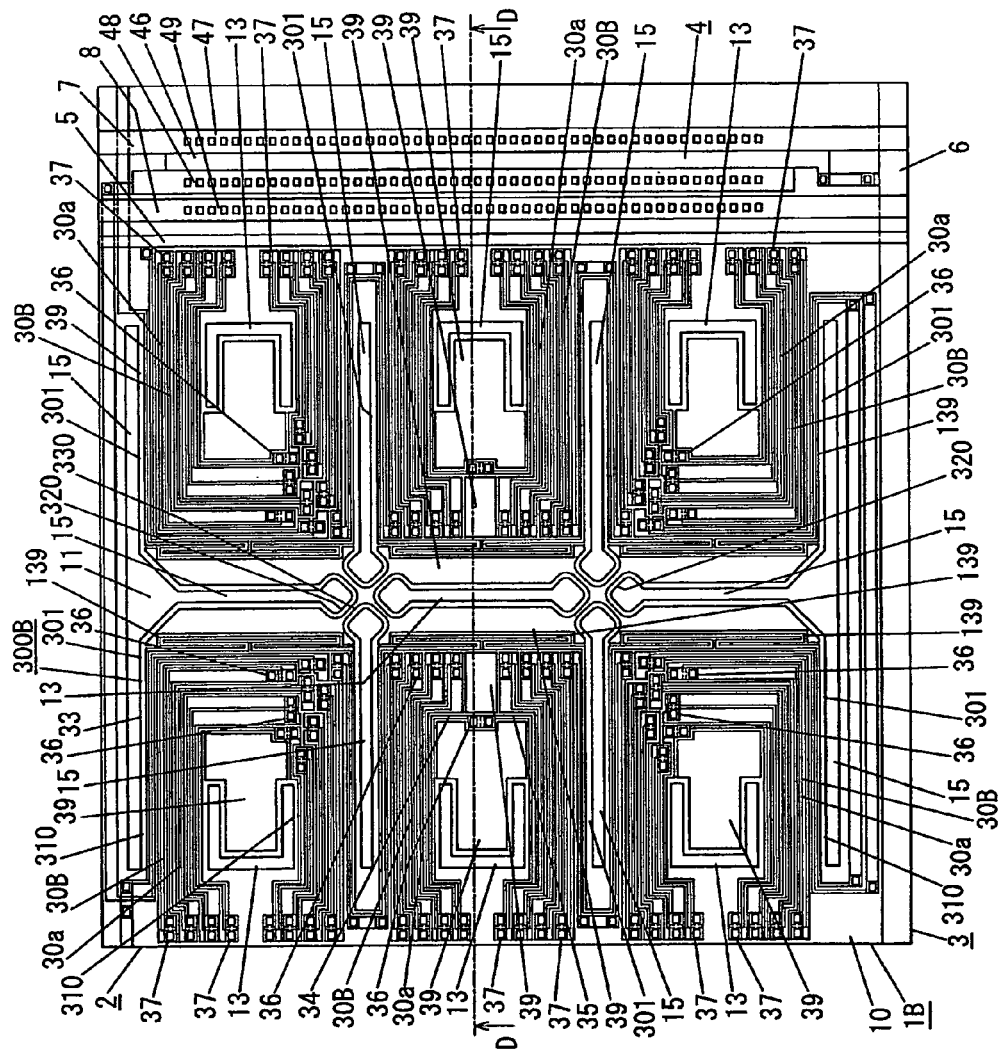
FIG. 13 is a plane view illustrating an infrared sensor of the third embodiment.
Figure 14:
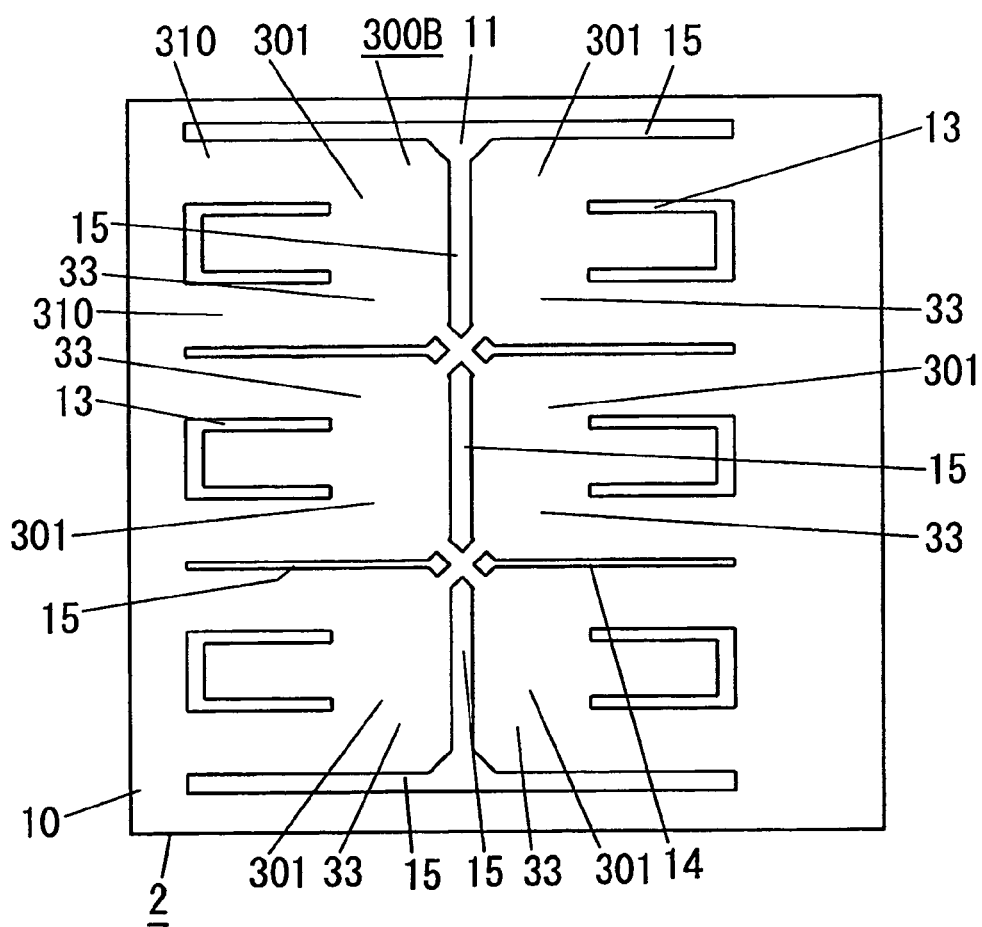
FIG. 14 is a schematic plane view illustrating the above infrared sensor.
Figure 18:
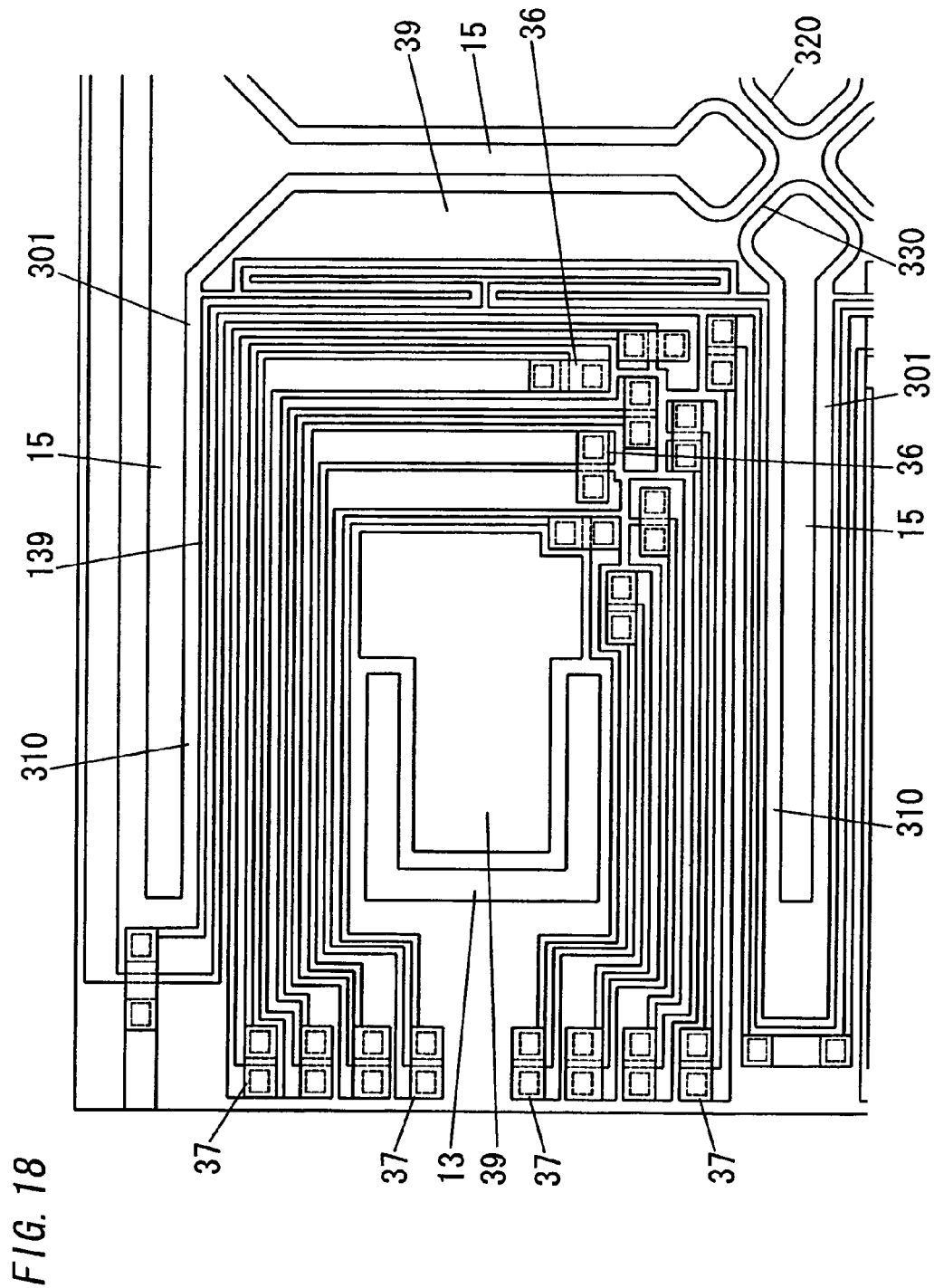
FIG. 18 is a partial plane view illustrating the above infrared sensor.

In the infrared sensor 1B of the present embodiment, the cavity 11 has the square pyramid shape. Therefore, a depth of the cavity 11 is made greater towards its center than at its outer circumference. In view of the above, the temperature detection members 30B are disposed over the corresponding small and thin film structures 301 such that the hot junctions are herded in a center of the thin film structure 300B. For example, with respect to the two small and thin film structures 301 in a center in an upward/downward direction of FIG. 13 (direction in which the three small and thin film structures 301 are aligned), the connection layers 36 are arranged along the upward/downward direction as shown in FIGS. 13 and 18. With respect to the two small and thin film structures 301 in an upper side in the upward/downward direction of FIG. 13, the connection layers 36 are herded in a lower side in the upward/ downward direction as shown in FIGS. 13 and 18. With respect to the two small and thin film structures 301 in a lower side in the upward/downward direction of FIG. 13, the connection layers 36 are herded in an upper side in the upward/ downward direction as shown in FIGS. 13 and 18. This arrangement enables to increase temperature variation at the hot junction, in contrast to a case where the plural connection layers 36 of the small and thin film structures 301 in the upper and lower sides are arranged in the upward/downward direction of FIG. 13 in the same fashion as the plural connection layers 36 of the small and thin film structures 301 are arranged in the center of the upward/downward direction of FIG. 13. Thus, the sensitivity can be improved.

Figure 16A:
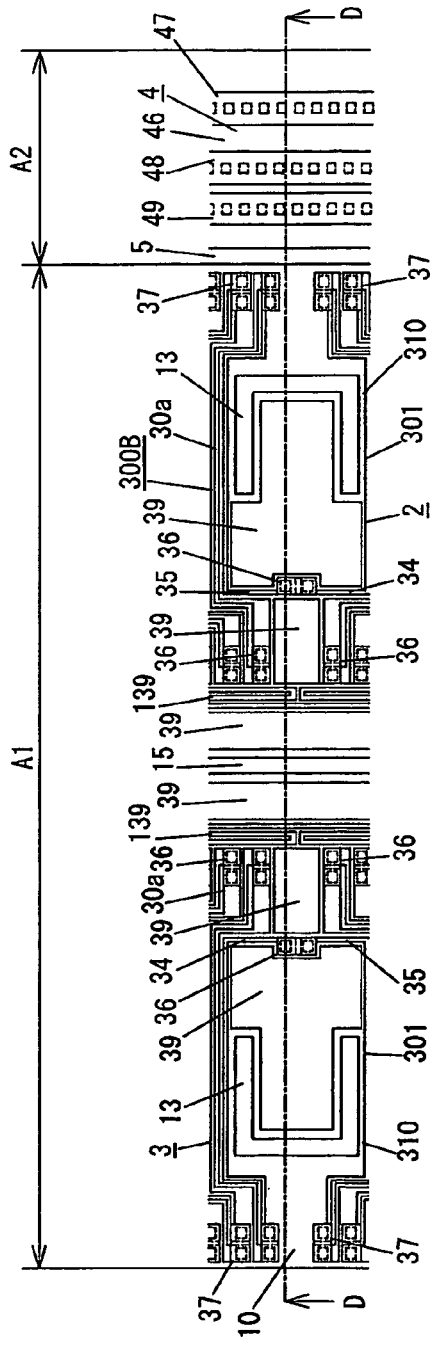
FIG. 16A is a partial plane view illustrating the above infrared sensor.
Figure 16B:
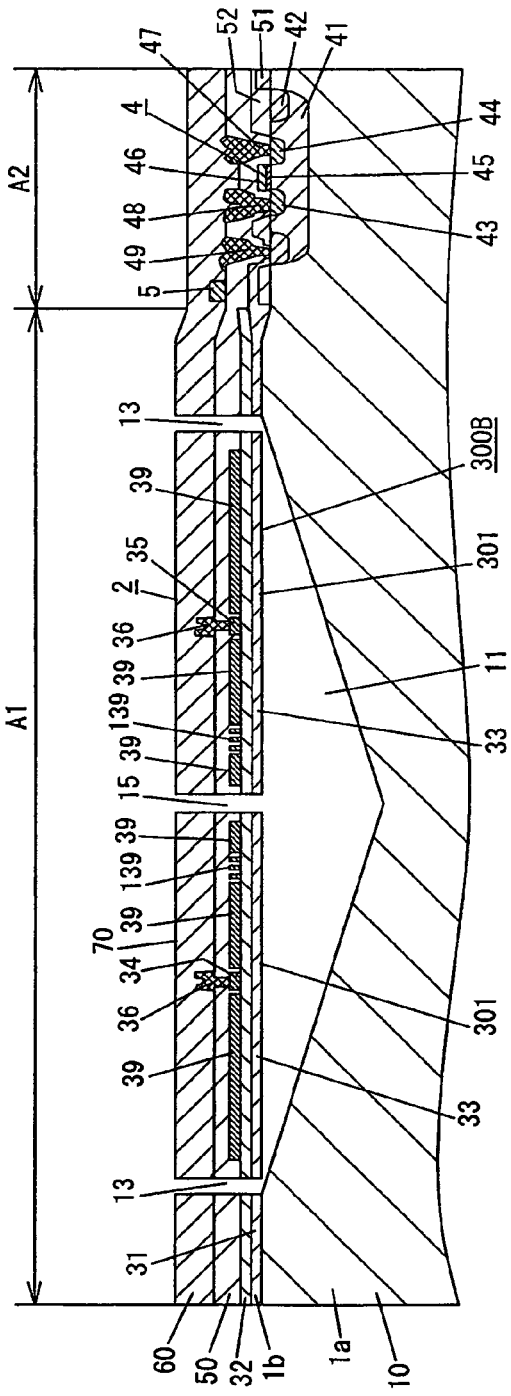
FIG. 16B shows a cross sectional view of the above infrared sensor along the line D-D of FIG. 16A.
Figure 17:
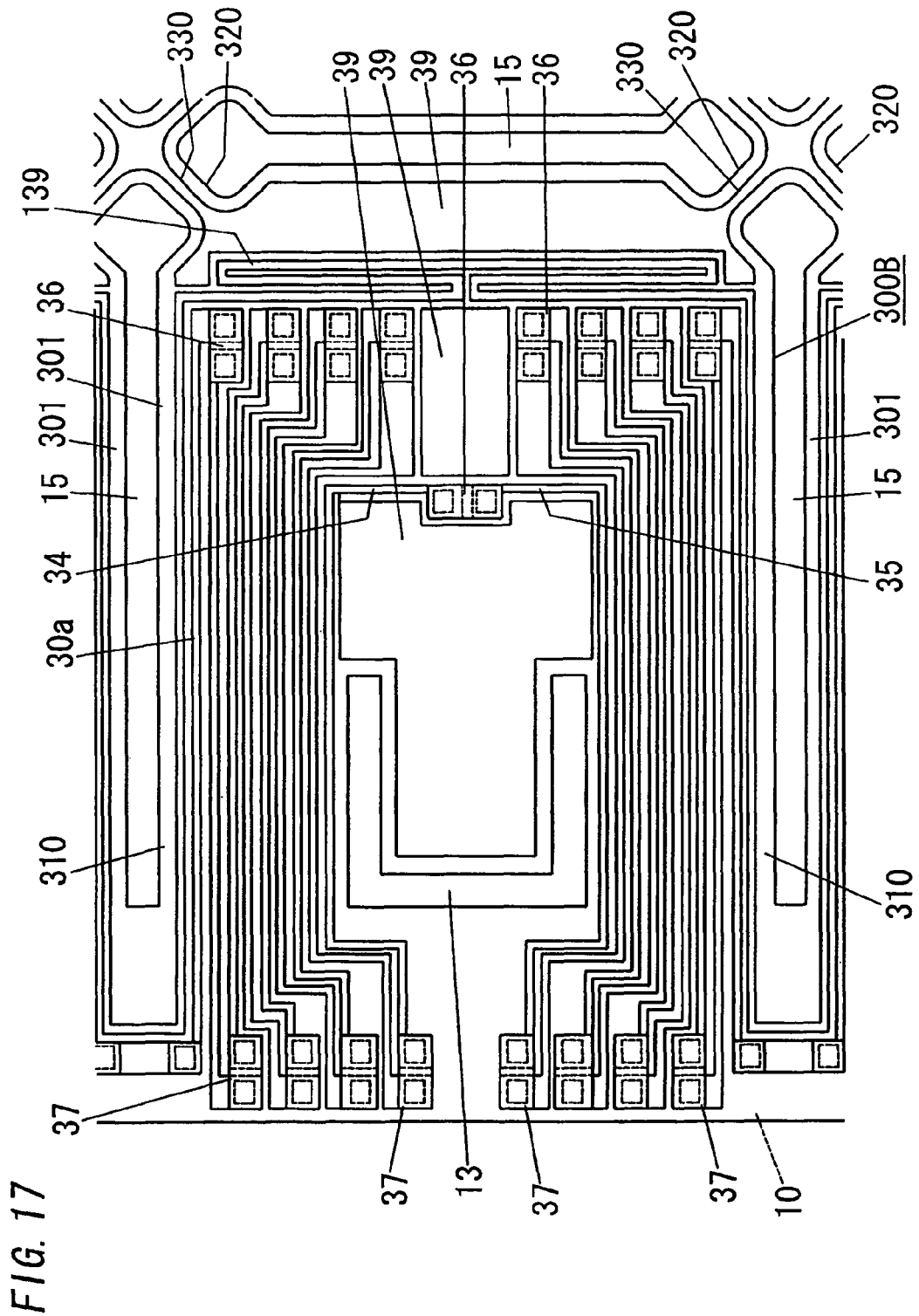
FIG. 17 is a partial plane view illustrating the above infrared sensor.
Figure 22:
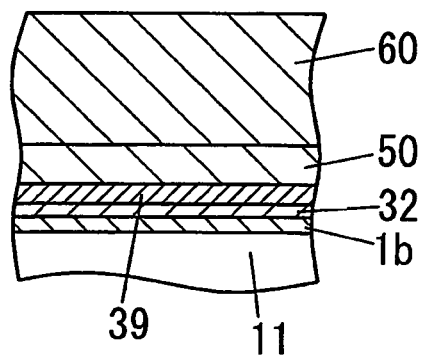
FIG. 22 is a partial cross sectional view illustrating the above infrared sensor.
Figure 23:
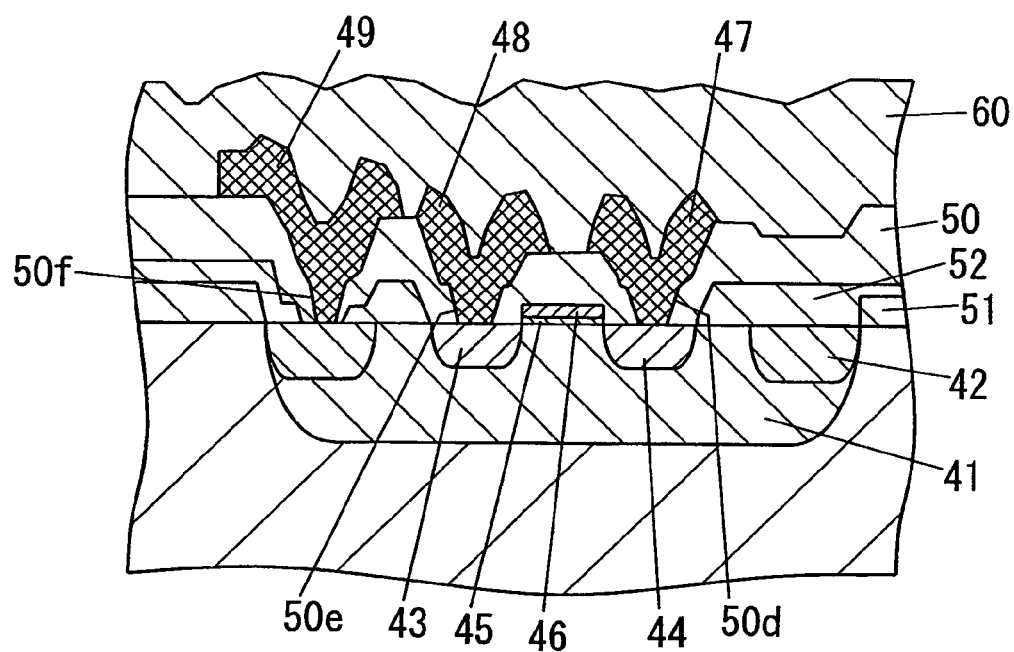
FIG. 23 is a partial cross sectional view illustrating the above infrared sensor.

In the small and thin film structure 301, the safeguard films 39 are formed on an area of the infrared incident surface of the silicon nitride film 32 on which the temperature detection members 30B are not formed (see FIGS. 13, 16, and 22). The safeguard film 39 is defined as an infrared absorption layer made of an n-type polysilicon layer which absorbs infrared and prevents the small and thin film structure 301 from suffering from a warp.

The connection member 320 is provided with a reinforcement member (reinforcement layer) 330 (see FIG. 19) which reinforces mechanical strength of the connection member 320. The reinforcement member 330 is integrally formed with the safeguard film 39. In the infrared sensor 1B of the present embodiment, since the reinforcement member 330 reinforces the connection member 320, it is possible to prevent breakage of the infrared sensor caused by a stress due to an external temperature variation or impact at the time of using the infrared sensor 1B. In addition, the infrared sensor 1B can be free from breakage at the time of manufacturing the infrared sensor 1B, and therefore fabrication yield can be improved. Besides, in the present embodiment, the connection member 320 has a length L1 of 24 μm and a width 12 of 5 μm, and the reinforcement member 330 has a width L3 of 1 μm. These values are illustrative only. In the present embodiment, the base 10 is made of the silicon substrate 1a, and the reinforcement member 330 is made of the n-type polysilicon layer. Therefore, it is necessary to prevent the reinforcement member 330 from being etched at the time of forming the cavity 11. Thus, the reinforcement member 330 is preferred to have a width smaller than that of the connection member 320 such that the reinforcement member 330 is disposed between opposite width ends of the connection member 320.

Figure 24A:
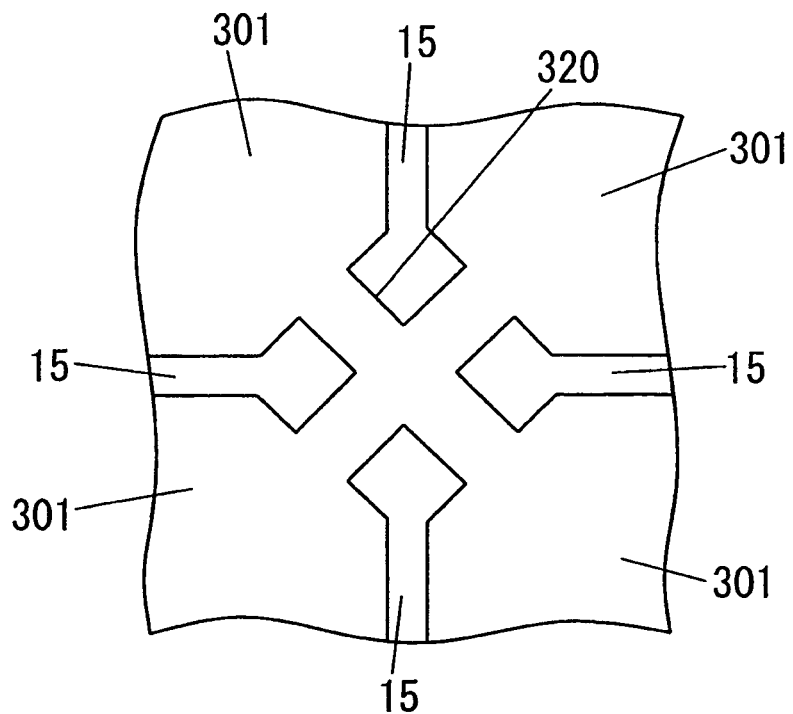
FIG. 24A is an explanatory view illustrating the above infrared sensor.
Figure 24B:
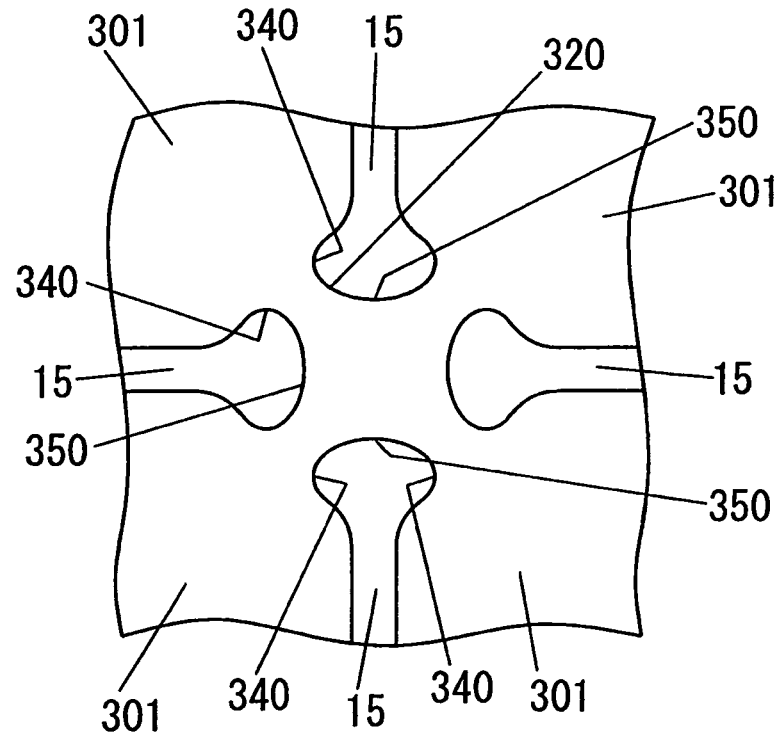
FIG. 24B is an explanatory view illustrating the above infrared sensor.

As shown in FIGS. 19 and 24B, the infrared sensor 1B is chamfered at its corners between the connection member 320 and the small and thin film structure 301 to form thereat chamfered surfaces 340. Further, corners between side surfaces of the cross-shaped connection members 320 which are approximately perpendicular to each other are chamfered to form chamfered surfaces 350. This arrangement can reduce a stress which occurs at a junction portion of the connection member 320 and the small and thin film structure 301, in contrast to a situation where the chamfered surfaces 340 and 350 are not formed as shown in FIG. 24B. Therefore, it is possible to reduce a residual stress which occurs at the time of manufacturing the infrared sensor 1B, and to prevent breakage of the infrared sensor 1B which would otherwise occur at the time of manufacturing the infrared sensor 1B. Thus, fabrication yield can be improved. Additionally, it is possible to prevent breakage of the infrared sensor 1B caused by a stress occurring due to an external temperature variation or impact at the time of using the infrared sensor 1B. Besides, in the instance illustrated in FIG. 19, though each of the chamfered surfaces 340 and 350 is an R-surface having a curvature radius of 3 μm, each of the chamfered surfaces 340 and 350 may be a C-surface.

Moreover, the infrared sensor 1B includes, for each small and thin film structure 301, a malfunction diagnosis line 139 made of an n-type polysilicon layer. The malfunction diagnosis line 139 starts from and returns to the base 10 as being routed through one support member 310, the infrared absorption member 33, and the other support member 310. All the malfunction diagnosis lines 139 are connected in series with each other. By energizing a series circuit of the m by n (3 by 2, in the illustrated instance) malfunction diagnosis lines 139, it is possible to detect breakage such as breakage of the support member 310.

The safeguard film 39, the reinforcement member 330, and the malfunction diagnosis line 139 contain the n-type impurity (e.g., phosphorus) of the same kind and the same impurity concentration (e.g., $10^{18}$ to $10^{20}$ cm$^{-3}$) as the n-type polysilicon layer 34, and are formed at the same time as the n-type polysilicon layer 34. For example, the p-type impurity of the p-type polysilicon layer 35 may be boron and the impurity concentration thereof may be in a range of about $10^{18}$ to $10^{20}$ cm$^{-3}$. In the present embodiment, each of the n-type polysilicon layer 34 and the p-type polysilicon layer 35 has an impurity concentration of $10^{18}$ to $10^{20}$ cm$^{-3}$. This arrangement can reduce a resistance of the thermocouple, and improve the S/N ratio. Besides, the safeguard film 39, the reinforcement member 330, and the malfunction diagnosis line 139 may be made of a p-type polysilicon layer. In this situation, the safeguard film 39, the reinforcement member 330, and the malfunction diagnosis line 139 may contain the impurity of the same kind and the same impurity concentration as the p-type polysilicon layer 35.

In the present embodiment, each of the n-type polysilicon layer 34, the p-type polysilicon layer 35, the safeguard film 39, the reinforcement member 330, and the malfunction diagnosis line 139 has its thickness $t_1$ of $\lambda/4n_1$, wherein $n_2$ denotes a reflective index of each of the n-type polysilicon layer 34, the p-type polysilicon layer 35, the safeguard film 39, the reinforcement member 330, and the malfunction diagnosis line 139, and $\lambda$ denotes a center wavelength of infrared to be detected by the infrared detection element 3. This arrangement can enhance the absorption efficiency for infrared having a detection target wavelength (e.g., 8 to 12 μm), thereby improving the sensitivity. For example, when $n_1$ is 3.6 and $\lambda$ is 10 μm, $t_1$ is about 0.69 μm.

Further, each of the n-type polysilicon layer 34, the p-type polysilicon layer 35, the safeguard film 39, the reinforcement member 330, and the malfunction diagnosis line 139 has an impurity concentration in a range of $10^{18}$ to $10^{20}$ cm$^{-3}$. Thus, an absorptance for infrared can be increased, and a reflection of the same infrared can be suppressed. Therefore, the S/N ratio of the output of the temperature detection member 30B is improved. Further, the safeguard film 39, the reinforcement member 330, and the malfunction diagnosis line 139 can be formed through the same process as the n-type polysilicon layer 34. Thus, it is possible to reduce the production cost.

In each pixel 2 of the infrared sensor 1B of the present embodiment, a temperature detection member 30B has its first end electrically connected to a source electrode 48 of a MOS transistor 4, and its second end electrically connected to a reference bias line 5. Further, a MOS transistor 4 has its drain electrode 47 electrically connected to a vertical read-out line 7 and its gate electrode 46 electrically connected to a horizontal signal line 6 which is made of an n-type polysilicon layer formed integrally with the same gate electrode 46.

The following brief explanation is made to a method of manufacturing the infrared sensor 1B, referring FIGS. 27 to 30.

Figure 27:
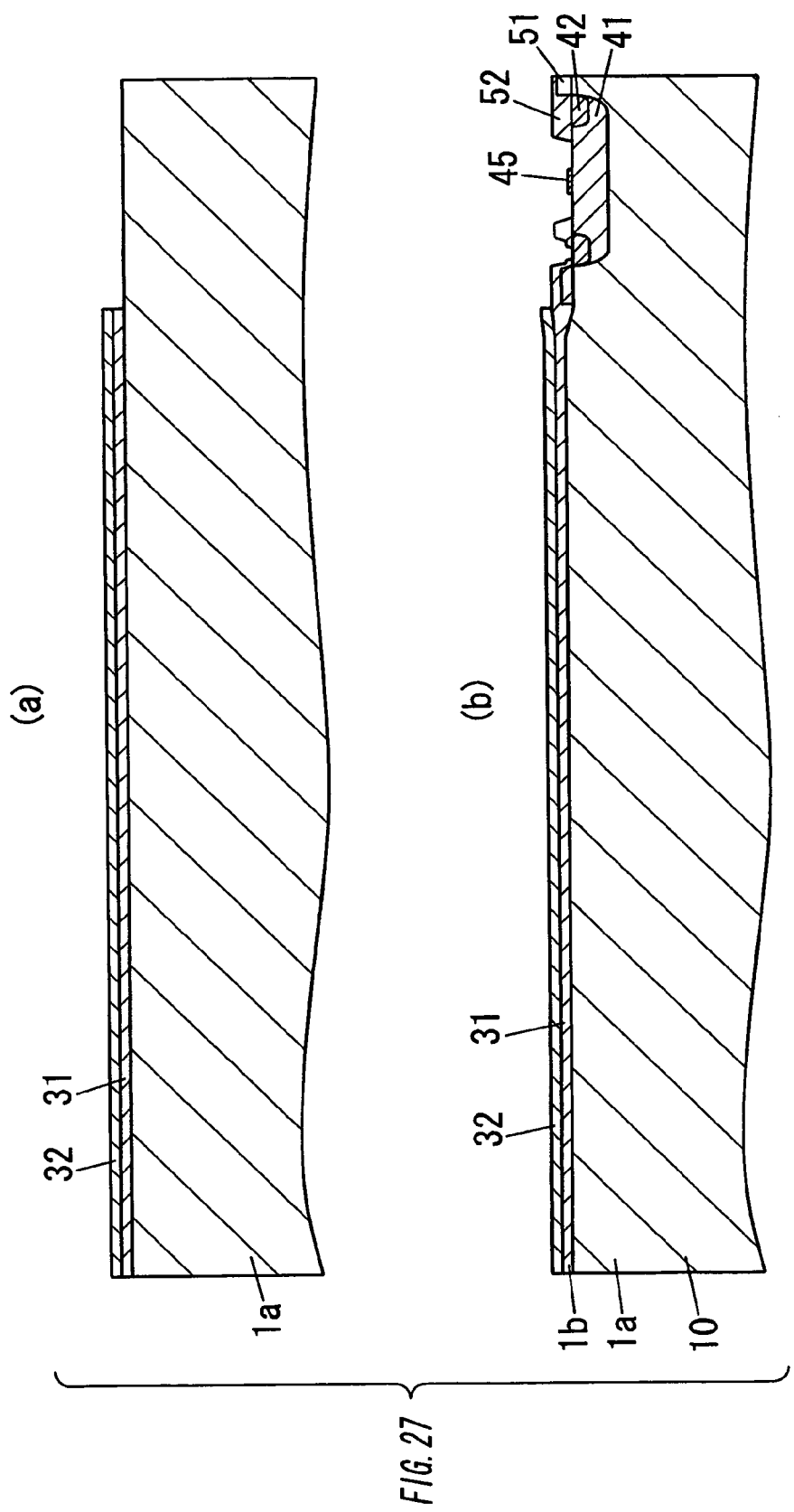
FIG. 27 is a process chart illustrating a method of manufacturing the above infrared sensor.

First, the insulation layer forming step is performed, followed by the insulation layer patterning step. Thereby, a structure illustrated in (a) of FIG. 27 is obtained. The insulation layer forming step and the insulation layer patterning step have been already explained in the first embodiment, and no explanations thereof are deemed necessary.

The well region forming step is performed after the insulation layer patterning step, and thereafter the channel stopper region forming step is performed. Thereby, a structure illustrated in (b) of FIG. 27 is obtained. The insulation layer patterning step, the well region forming step and the channel stopper region forming step have been already explained in the first embodiment, and no explanations thereof are deemed necessary.

The gate insulation film forming step is performed after the channel stopper region forming step. The gate insulation film forming step has been already explained in the first embodiment, and no explanation thereof is deemed necessary.

After the gate insulation film forming step, the polysilicon layer forming step is performed. In the polysilicon layer forming step of the present embodiment, a non-doped polysilicon layer having a predetermined film thickness (e.g., 0.69 μm) is formed on the whole of the main surface of the silicon substrate 1a by use of an LPCVD technique. The non-doped polysilicon layer is used as a basis for forming the gate electrode 46, the horizontal signal line 6 (see FIG. 13), the n-type polysilicon layer 34, the p-type polysilicon layer 35, and the safeguard film 39, the reinforcement member 330, and the malfunction diagnosis line 139.

After the polysilicon layer forming step, the polysilicon layer patterning step is performed. In the polysilicon layer patterning step of the present embodiment, by use of the photolithography technique and the etching technique, the non-doped polysilicon layer is patterned in order to leave portions thereof respectively corresponding to the gate electrode 46, the horizontal signal line 6, the n-type polysilicon layer 34, the p-type polysilicon layer 35, the safeguard film 39, the reinforcement member 330, and the malfunction diagnosis line 139.

The p-type polysilicon layer forming step is performed after the polysilicon layer patterning step. The p-type polysilicon layer forming step has been already explained in the first embodiment, and no explanation thereof is deemed necessary.

Figure 28:
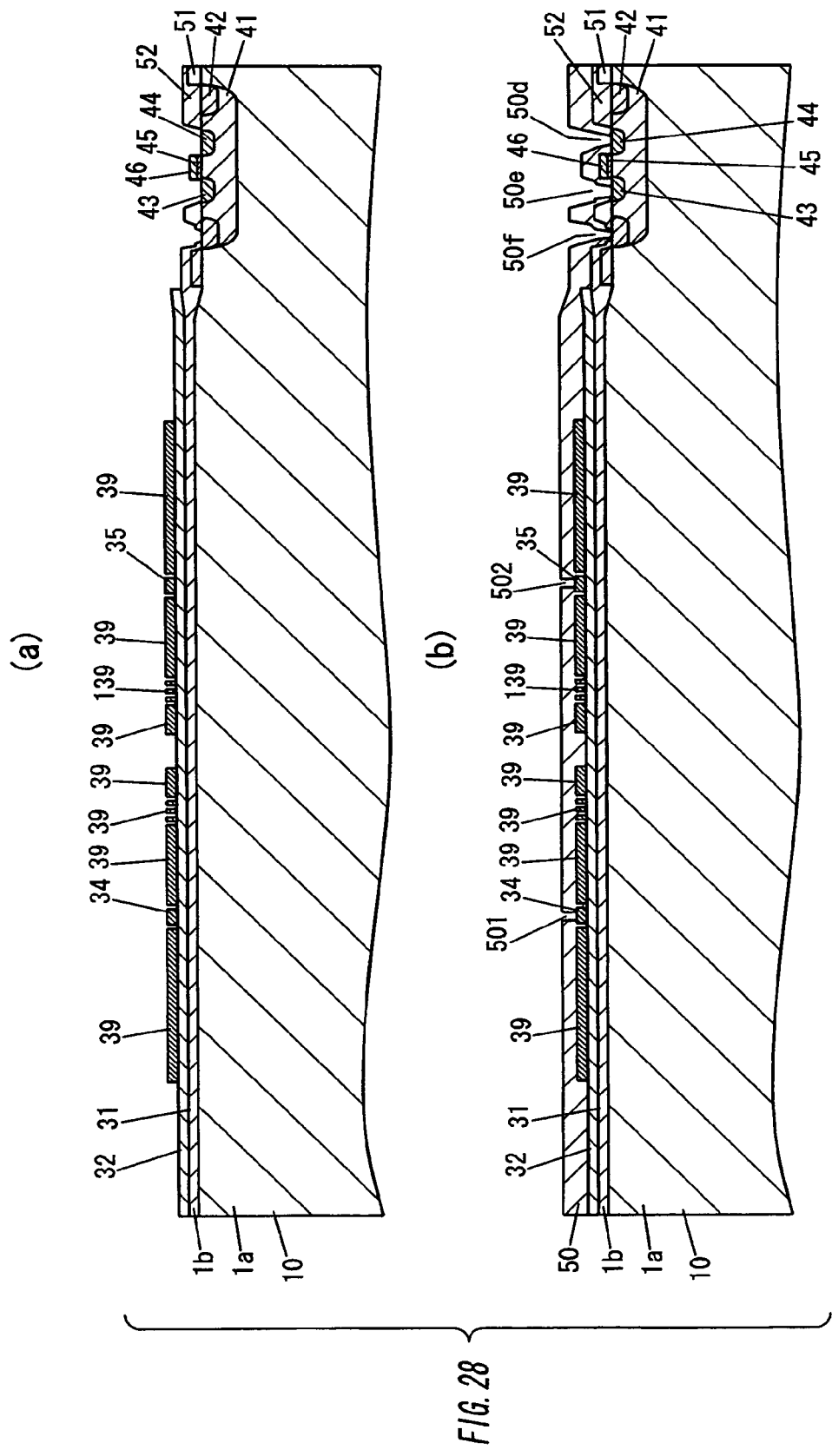
FIG. 28 is a process chart illustrating the method of manufacturing the above infrared sensor.

After the p-type polysilicon layer forming step, the n-type polysilicon layer forming step is performed. The n-type polysilicon layer forming step of the present embodiment is defined to perform an ion implantation of an n-type impurity (e.g., phosphorus) to portions of the non-doped polysilicon layer respectively corresponding to the n-type polysilicon layer 34, the safeguard film 39, the reinforcement member 330, the malfunction diagnosis line 139, the gate electrode 46, and the horizontal signal line 6, followed by the drive diffusion, thereby forming the n-type polysilicon layer 34, the safeguard film 39, the reinforcement member 330, the malfunction diagnosis line 139, the gate electrode 46, and the horizontal signal line 6. Thereby, a structure illustrated in (a) of FIG. 28 is obtained. Besides, the order of the p-type polysilicon layer forming step and the n-type polysilicon forming layer may be reversed.

After both the p-type polysilicon layer forming step and the n-type polysilicon layer forming step, the source/drain forming step, the interlayer dielectric film forming step, and the contact hole forming step are performed in this order. Thereby, a structure illustrated in (b) of FIG. 28 is obtained. The source/drain forming step, the interlayer dielectric film forming step, and the contact hole forming step have been already explained in the first embodiment, and no explanations thereof are deemed necessary.

After the contact hole forming step, the metal film forming step is performed. In the metal film forming step of the present embodiment, over the whole of the main surface of the silicon substrate 1a is formed, by use of the sputtering, a metal film (e.g., Al—Si film) having a predetermined film thickness (e.g., 2 μm). The above metal film is a basis for forming the connection layers 36 and 37, the drain electrode 47, the source electrode 48, the reference bias line 5, the vertical read-out line 7, the ground line 8, the common ground line 9, the pads Vout, Vsel, Vref, Vdd, and Gnd and the like (see FIG. 25).

Figure 29:
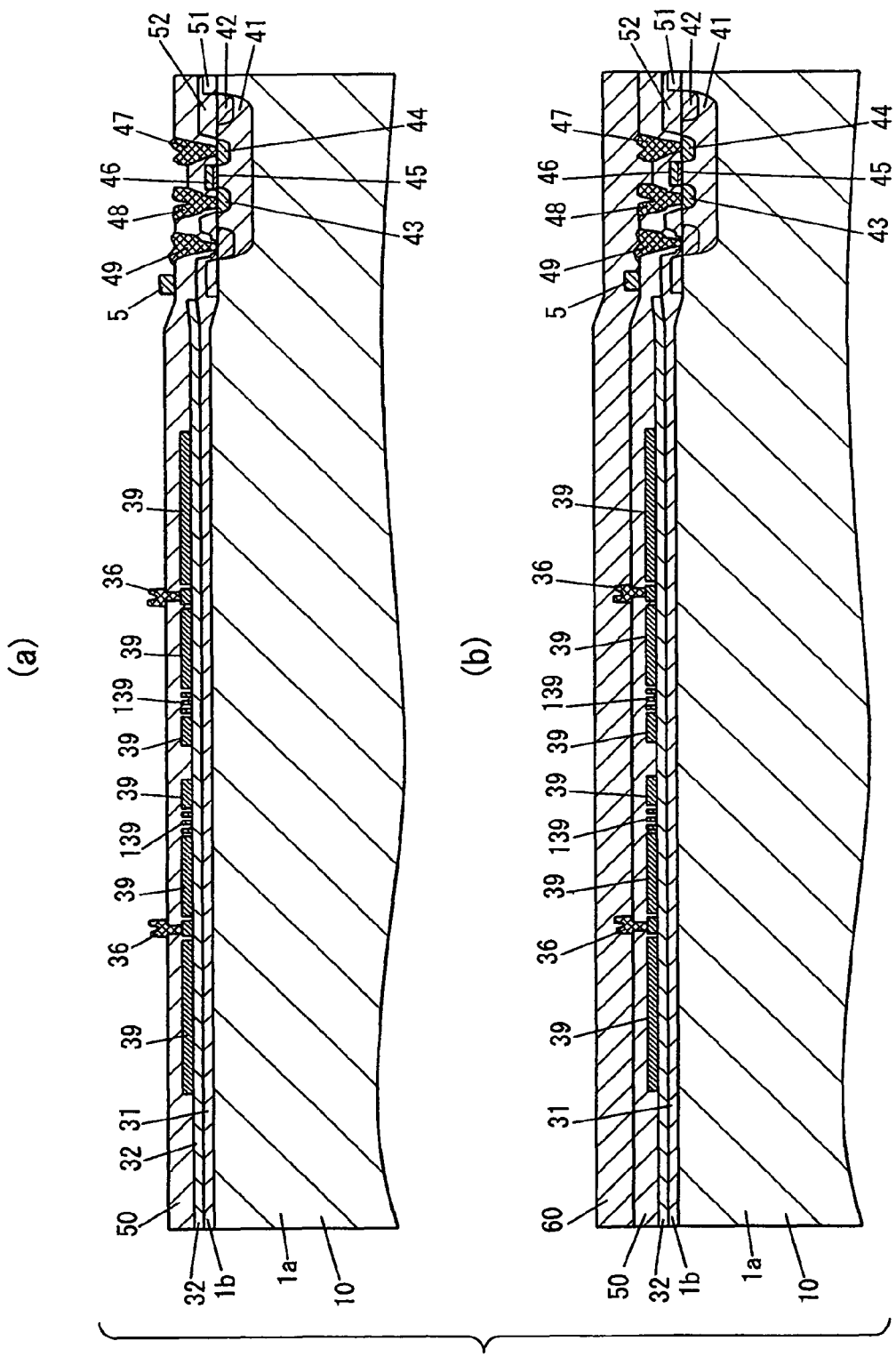
FIG. 29 is a process chart illustrating the method of manufacturing the above infrared sensor.

After the metal film forming step, the metal film patterning step is performed. In the metal film patterning step, by patterning the metal film by use of the photolithography technique and the etching technique, the connection layers 36 and 37, the drain electrode 47, the source electrode 48, the reference bias line 5, the vertical read-out line 7, the ground line 8, the common ground line 9, and the pads Vout, Vsel, Vref, Vdd, and Gnd. Thereby, a structure illustrated in (a) of FIG. 29 is obtained. Besides, in the metal film patterning step, the metal film is etched by use of RIE.

The passivation film forming step is performed after the metal film patterning step. Thereby, a structure illustrated in (b) of FIG. 29. The passivation film forming step has been already explained in the first embodiment, and no explanation thereof is deemed necessary.

Figure 30:
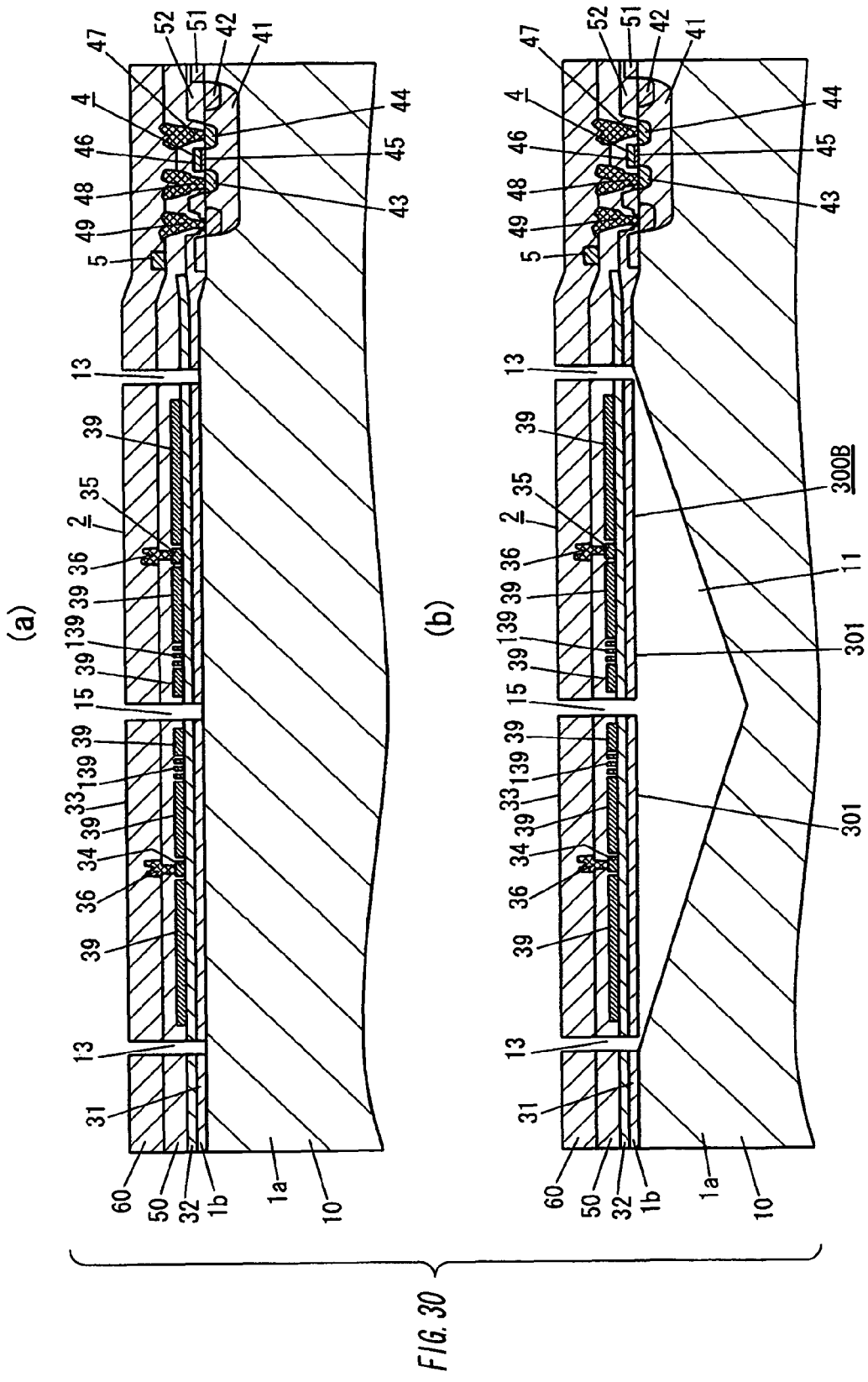
FIG. 30 is a process chart illustrating the method of manufacturing the above infrared sensor.

After the passivation film forming step, the laminate structure patterning step is performed. In the laminate structure patterning step, the thin film structure 300B which includes the plural small and thin film structures 301 is formed by patterning a laminate structure which is composed of the thermal insulation layer defined as a laminate of the silicon dioxide film 31 and the silicon nitride film 32, the temperature detection member 30B, the interlayer dielectric film 50, and the passivation film 60. Thereby, a structure illustrated in (a) of FIG. 30 is obtained. Besides, in the laminate structure patterning step, the plural slits 13 and 15 are formed.

After the laminate structure patterning step, the opening forming step is performed, and thereafter the cavity forming step is performed. In the cavity forming step of the present embodiment, by making anisotropic etching of the silicon substrate 1a with an etchant poured into each of the slits 13 and 15 as etchant conduits, the cavity 11 is formed in the silicon substrate 1a. Thereby, the infrared sensor 1B in which the pixels 2 are arranged in a two dimensional array manner is obtained, as shown in (b) of FIG. 30. The opening forming step has been already explained in the first embodiment, and no explanation thereof is deemed necessary. In the cavity forming step, TMAH solution heated to a predetermined temperature (e.g., 85° C.) is used as the etchant. The etchant is not limited to the TMAH solution, but may be alkaline solution (e.g., KOH solution).

Besides, since all the steps from the insulation layer forming step to the cavity forming step are performed at wafer level, the separation step is made to separate the infrared sensors 1B from each other after the cavity forming step.

In the infrared sensor 1B of the present embodiment explained in the above, the thin film structure 300B is divided into the plural small and thin film structures 301 by the plural linear slits 15. The plural small and thin film structures 301 are aligned in the circumference direction of the cavity 11. Each of the small and thin film structures 301 extends from the edge of the cavity 11 in the base 10 to the inside of the cavity 11. Each of the small and thin film structures 301 is provided with a temperature detection member 30B. All the temperature detection members 30B are electrically connected to each other in such a relation as to provide the temperature-dependent output which is greater than any single one of the temperature detection members 30B.

Therefore, the infrared sensor 1B of the present embodiment can improve its response speed and sensitivity. Furthermore, since the connection member 320 connects together the small and thin film structures 301 which are adjacent to each other, it is possible to suppress occurrence of a warp of each small and thin film structure 301. Thereby, it is possible to improve structural stability of the infrared sensor and to stabilize the sensitivity of the infrared sensor.

Furthermore, in the infrared sensor 1B of the present embodiment, the safeguard film 39, the reinforcement member 330, and the malfunction diagnosis line 139 are formed on the infrared incident surface of the infrared absorption member 33, in addition to the n-type polysilicon layer 34 and the p-type polysilicon layer 35. Thus, it is possible to prevent the silicon nitride film 32 from being etched to be thinned at the time of forming the p-type polysilicon layer 35 and the n-type polysilicon layer 34. In brief, in the polysilicon layer patterning step, it is possible to prevent thinning of the silicon nitride film 32 caused by over-etching which may occur at the time of etching the non-doped polysilicon layer used as a basis of both the n-type polysilicon layer 34 and the p-type polysilicon layer 35. In addition, it is possible to improve uniform distribution of the stress in the thin film structure 300B. Consequently, it is possible to make the infrared absorption member 33 thin, yet the infrared absorption member 33 and the small and thin film structures 301 are kept free from a warp, and therefore it is possible to improve the sensitivity. Besides, in order to prevent the n-type polysilicon layer 34, the p-type polysilicon layer 35, the safeguard film 39, the reinforcement member 330, and the malfunction diagnosis line 139 from being etched by the etchant (e.g., TMAH solution) used in the cavity forming step, the n-type polysilicon layer 34, the p-type polysilicon layer 35, the safeguard film 39, the reinforcement member 330, and the malfunction diagnosis line 139 are shaped not to be exposed on inner aspects of the slits 13 and 15.

Further, in the infrared sensor 1B, the n-type polysilicon layer 34, the p-type polysilicon layer 35, and the safeguard film 39, the reinforcement member 330, and the malfunction diagnosis line 139 are configured to have the same thickness. Therefore, the uniform distribution of the stress in the small and thin film structure 301 can be improved. Thus, it is possible to keep the small and thin film structure 301 free from a warp.

In addition, since the infrared sensor 1B includes the MOS transistor 4 for each pixel 2, it is possible to reduce the number of the output pads Vout, and therefore it is possible to downsize the infrared sensor 1B and reduce the production cost thereof. Besides, each pixel 2 need not be provided with a MOS transistor 4.

Figure 31:
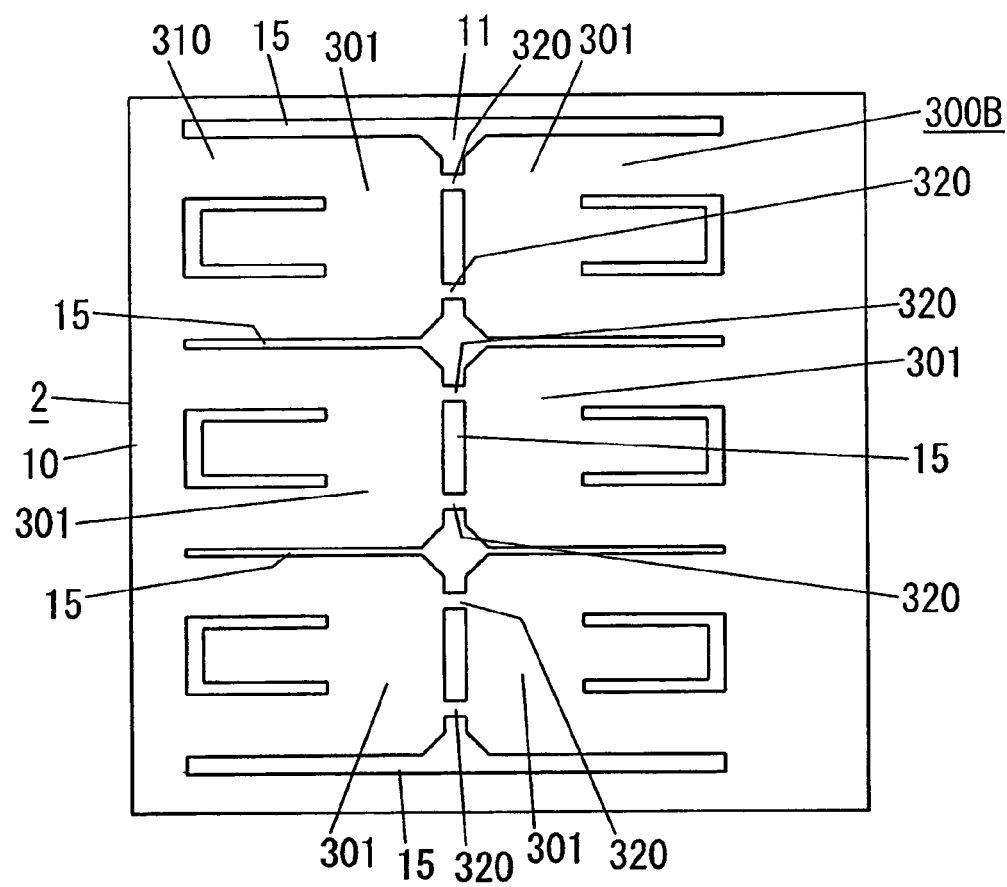
FIG. 31 is a partial plane view illustrating the infrared sensor of the first modification of the above embodiment.

FIG. 31 shows the first modification of the infrared sensor 1B of the present embodiment. The first modification is different in the thin film structure 300B from the basic example of the infrared sensor 1B of the present embodiment shown in FIGS. 13 to 30.

According to the thin film structure 300B of the first modification of the infrared sensor 1B, the small and thin film structures 301 are disposed adjacent to each other in an extension direction thereof (a lengthwise direction of the small and thin film structure, i.e., a lateral direction in FIG. 31), and are coupled by means of two connection members 320 which are spaced from each other in a direction crossing with the extension direction (i.e., a width direction of the small thin film structure 301).

According to the first modification, each of the small and thin film structures 301 and 301 has its first end (first end in the extension direction) directly connected to one edge of the cavity 11 in the base 10, and has its second end (second end in the extension direction) connected to another edge of the cavity 11 in the base by use of the connection member 320 and another small and thin film structure 301. As described in the above, each of the small and thin film structures 301 is supported to the base 10 at its opposite ends. Therefore, a possible warp of the small and thin film structure 301 can be reduced, and therefore the sensitivity can be stabilized, and the fabrication yield can be improved. Besides, the small and thin film structures 301 and 301, which are juxtaposed to each other in the extension direction, may be coupled to each other at the width centers thereof by means of a single connection member 320.

Figure 32:
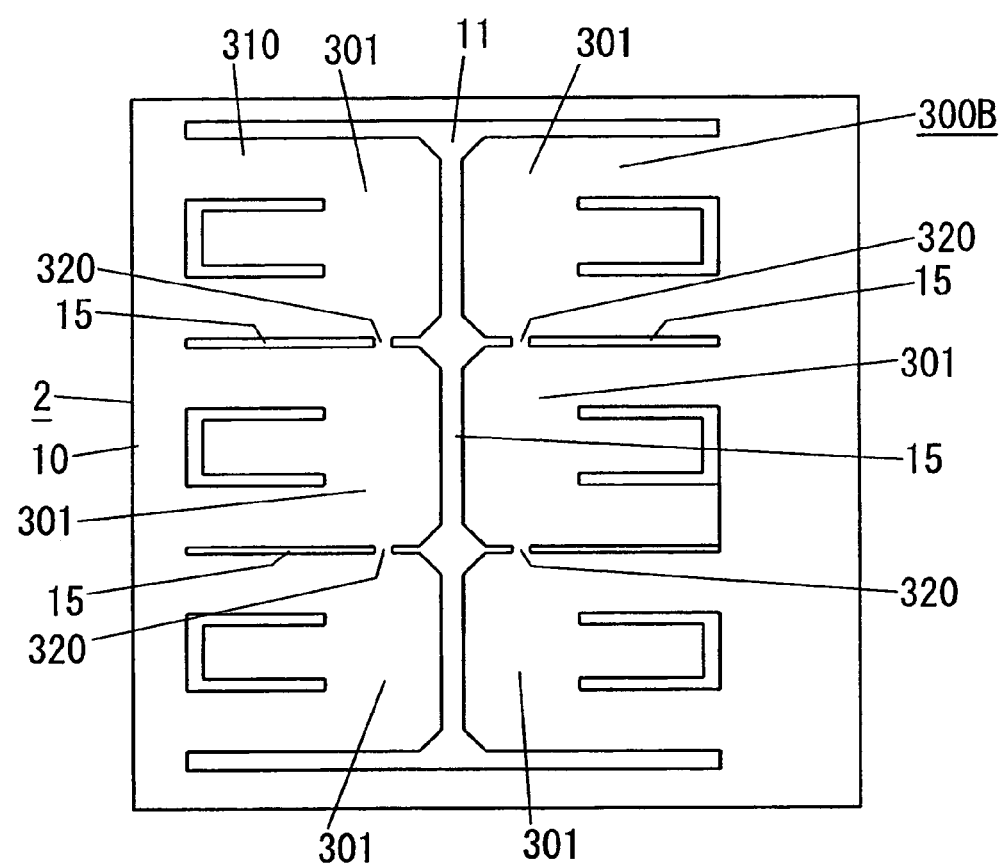
FIG. 32 is a partial plane view illustrating the infrared sensor of the second modification of the above embodiment.

FIG. 32 shows the second modification of the infrared sensor 1B of the present embodiment. The second modification is different in the thin film structure 300B from the basic example.

According to the infrared sensor 1B of the second modification, the small and thin film structures 301 and 301, which are juxtaposed to each other in a direction (width direction of the small thin film structure 301, that is, upward/downward direction in FIG. 32) perpendicular to the extension direction of the small and thin film structures, are coupled to each other by means of the single connection member 320 at the portions other than the support members 310. Besides, the connection member 320 is preferred to be located away from the support member 310.

According to the second modification, each of the small and thin film structure 301 has an improved torsional stiffness, and therefore it is possible to prevent torsional deformation of each small and thin film structure 301. Thus, the sensitivity can be stabilized, and the fabrication yield can be improved.

Figure 33:
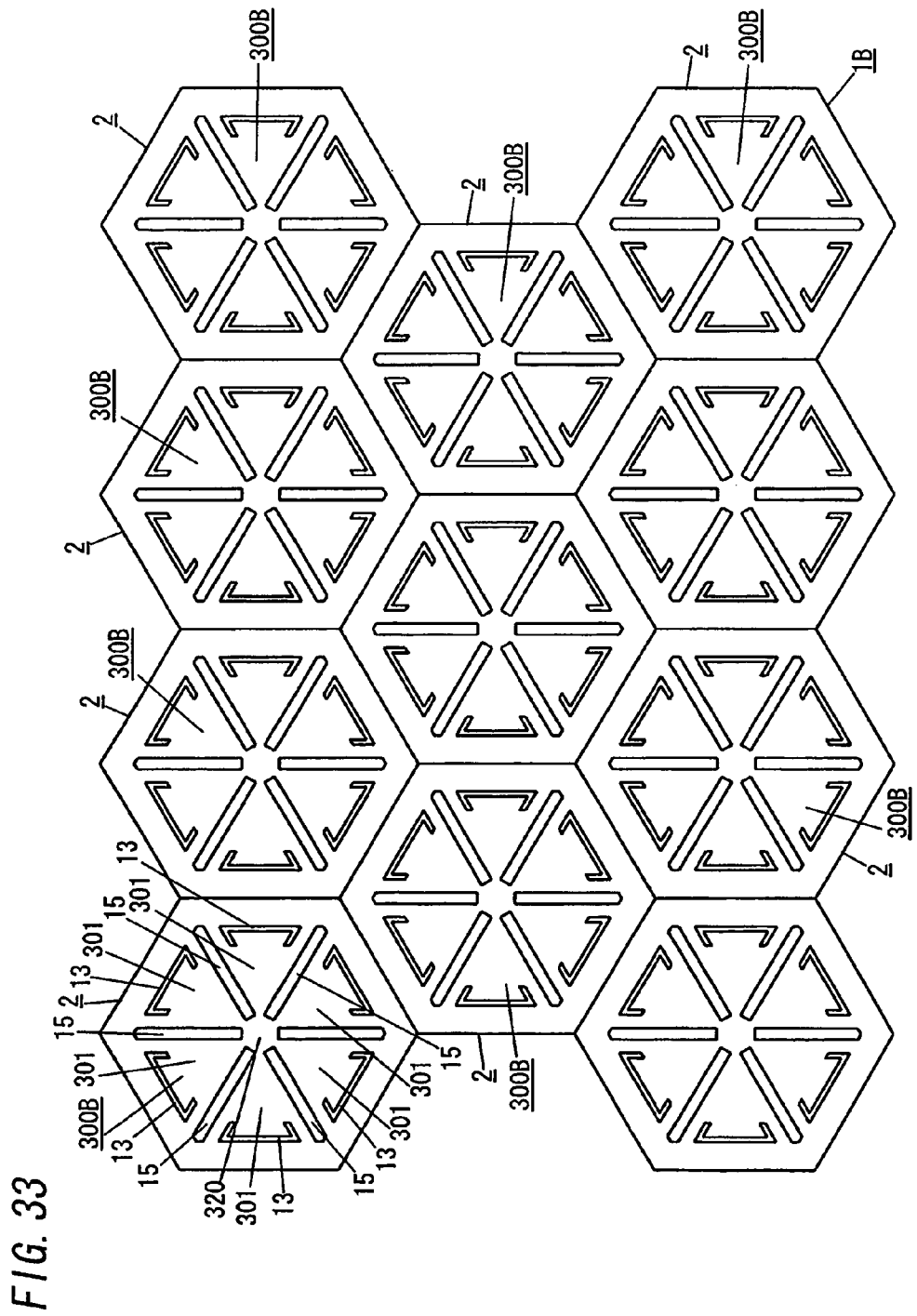
FIG. 33 is a partial plane view illustrating the infrared sensor of the third modification of the above embodiment.
Figure 34:
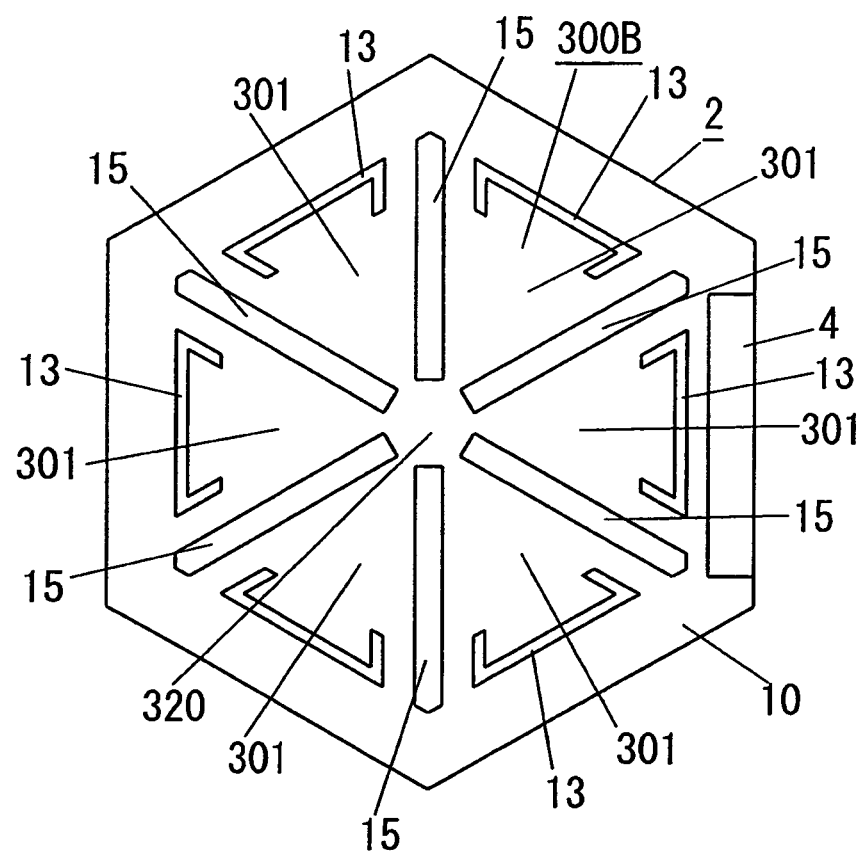
FIG. 34 is a partial enlarged view of the above infrared sensor.

FIGS. 33 and 34 show the third modification of the infrared sensor 1B of the present embodiment. The third modification is different in the pixel 2 from the basic example.

In the third modification of the infrared sensor 1B, each pixel 2 is formed into a hexagonal shape. The plural pixels 2 are arranged in a honeycomb manner.

The thin film structure 300B of the third modification is divided into the plural (six, in the illustrated instance) small and thin film structures 301 by the plural (six, in the illustrated instance) slits 15. The plural small and thin film structures 301 are connected to each other by the connection member 320.

The aforementioned third modification can prevent deformation of each small and thin film structure 301. Additionally, it is possible to improve density of the small and thin film structures 301 as well as density of the pixels 2.

Figure 35:
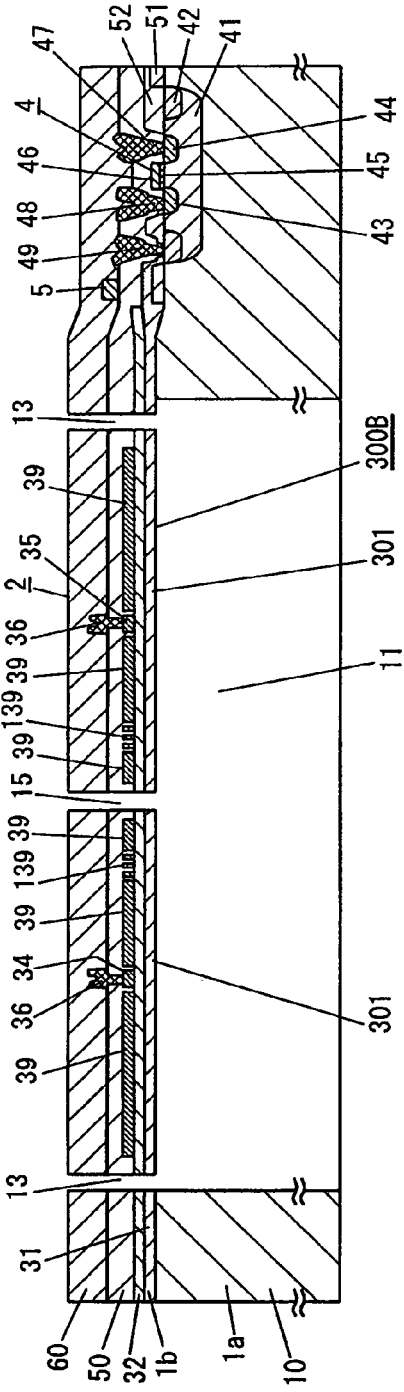
FIG. 35 is a partial plane view illustrating the infrared sensor of the fourth modification of the above embodiment.

FIG. 35 shows the fourth modification of the infrared sensor 1B of the present embodiment. The fourth modification is different from the basic example in that the cavity 11 of the base 10 is formed from a second surface (lower surface, in FIG. 35) of the base 10.

In order to manufacture the infrared sensor 1B of the fourth modification, the cavity forming step is modified as follows. In the cavity forming step, a region reserved for forming the cavity 11 in the second surface of the base 10 (i.e., a lower surface of the silicon substrate 1a, in FIG. 35) is etched by means of anisotropic etching with a dry etching apparatus of an induction coupled plasma (ICP) type or the like to form the cavity 11.

The fourth modification can suppress heat transfer from each of the small and thin film structures 310 of the thin film structure 300B to the base 10, thereby more improving the sensitivity.

Figure 36:
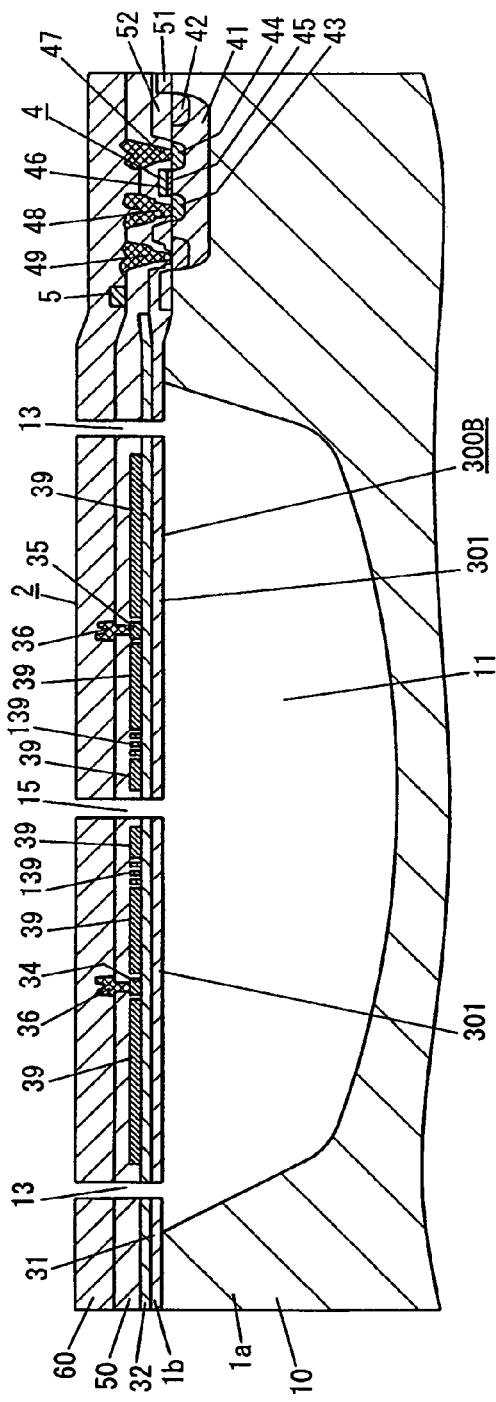
FIG. 36 is a partial plane view illustrating the infrared sensor of the fifth modification of the above embodiment.

FIG. 36 shows the fifth modification of the infrared sensor 1B of the present embodiment. The fifth modification is different from the basic example in that the cavity 11 of the base 10 has its inner surface shaped into a recessed surface.

The cavity 11 of the fifth embodiment is formed by means of isotropic etching, for example.

According to the fifth modification, the inner surface of the cavity 11 can reflect infrared passing through the thin film structure 300B toward the thin film structure 300. Thus, it is possible to increase an amount of infrared absorption of the infrared absorption member 33, and therefore the sensitivity can be improved.

Figure 37:
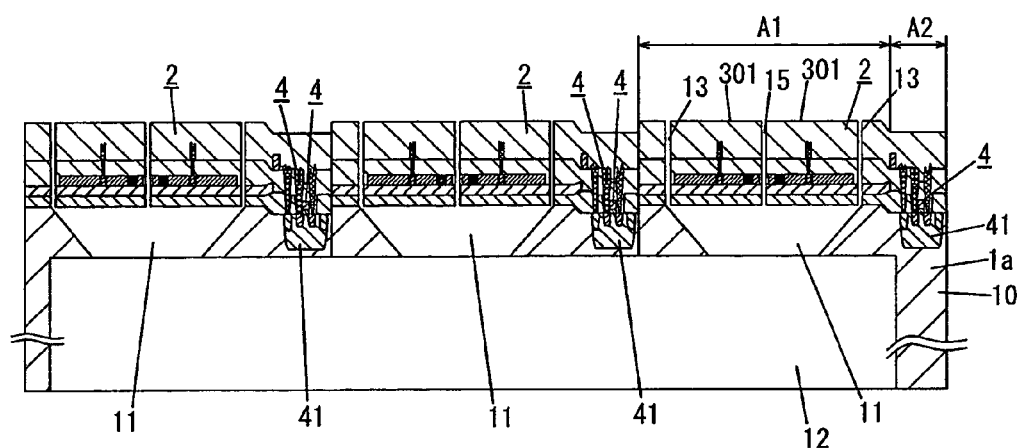
FIG. 37 is a partial plane view illustrating the infrared sensor of the sixth modification of the above embodiment.
Figure 38:
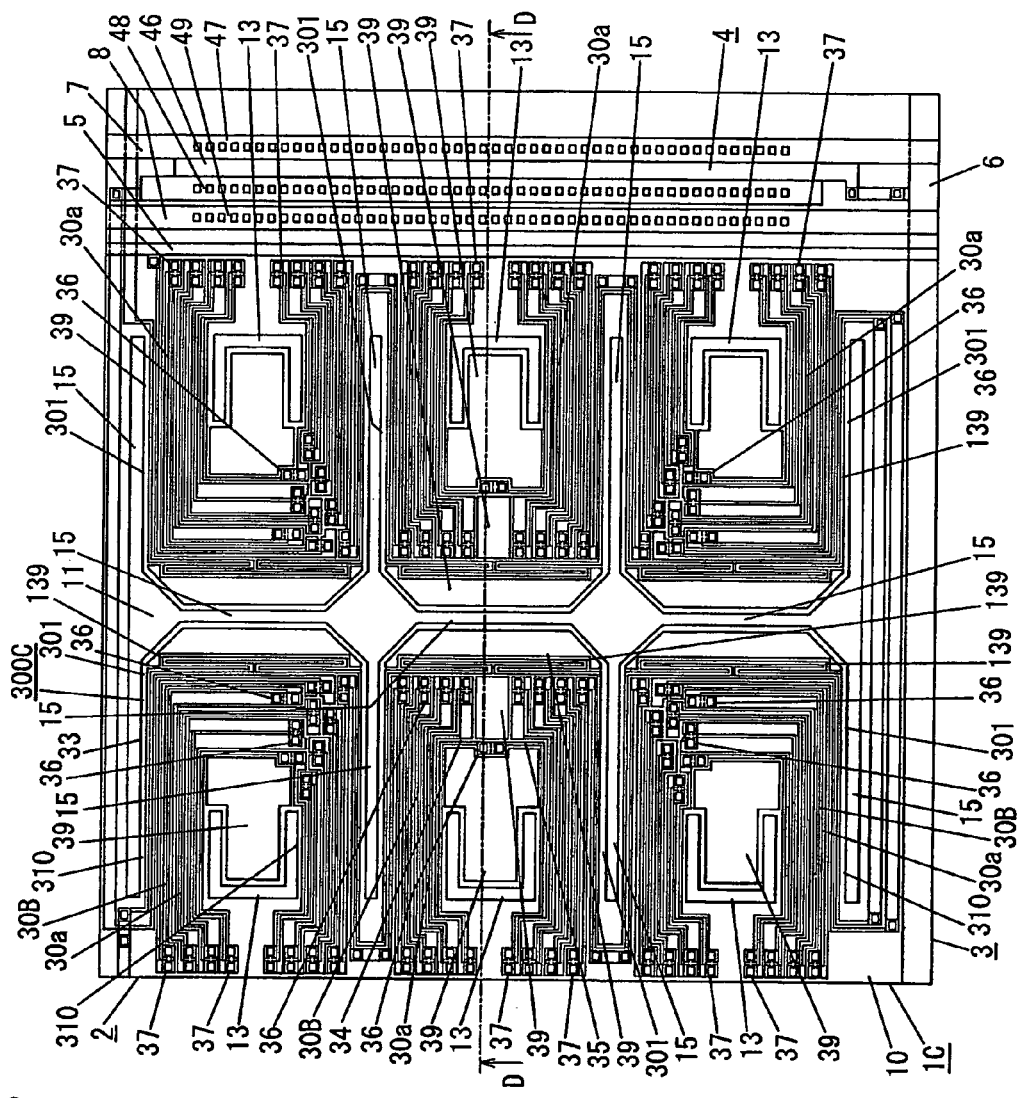
FIG. 38 is a plane view illustrating the infrared sensor of the fourth embodiment.
Figure 39:
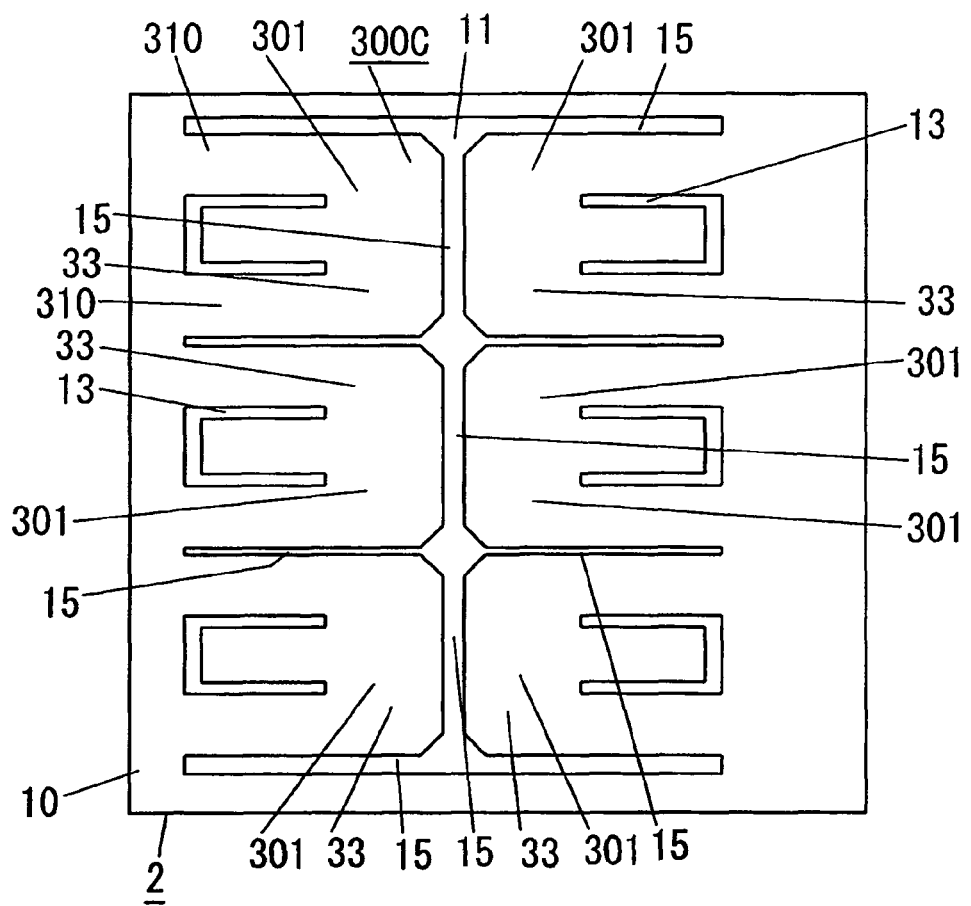
FIG. 39 is a schematic plane view illustrating the above infrared sensor.
Figure 40:
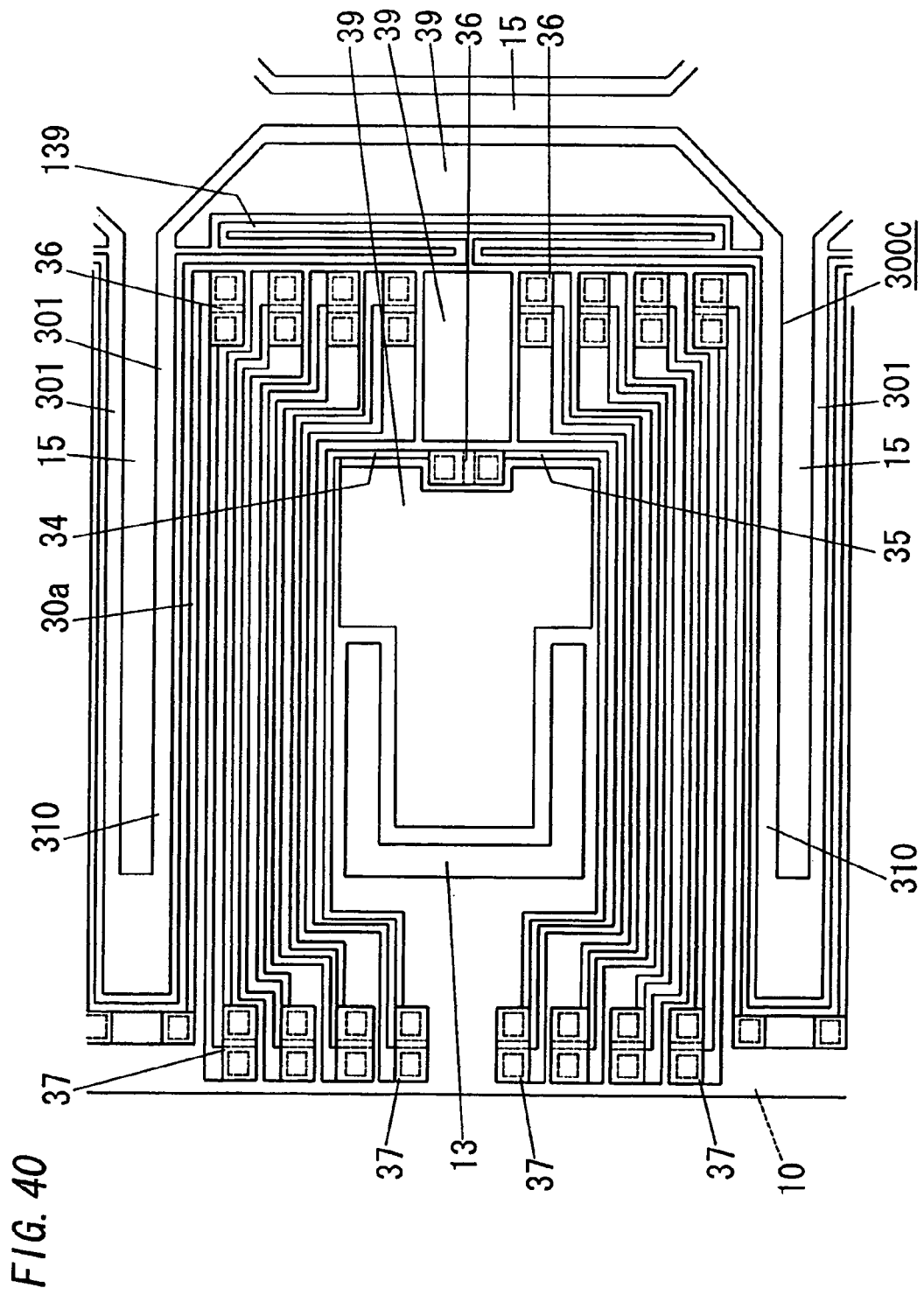
FIG. 40 is a partial plane view illustrating the above infrared sensor.
Figure 41:
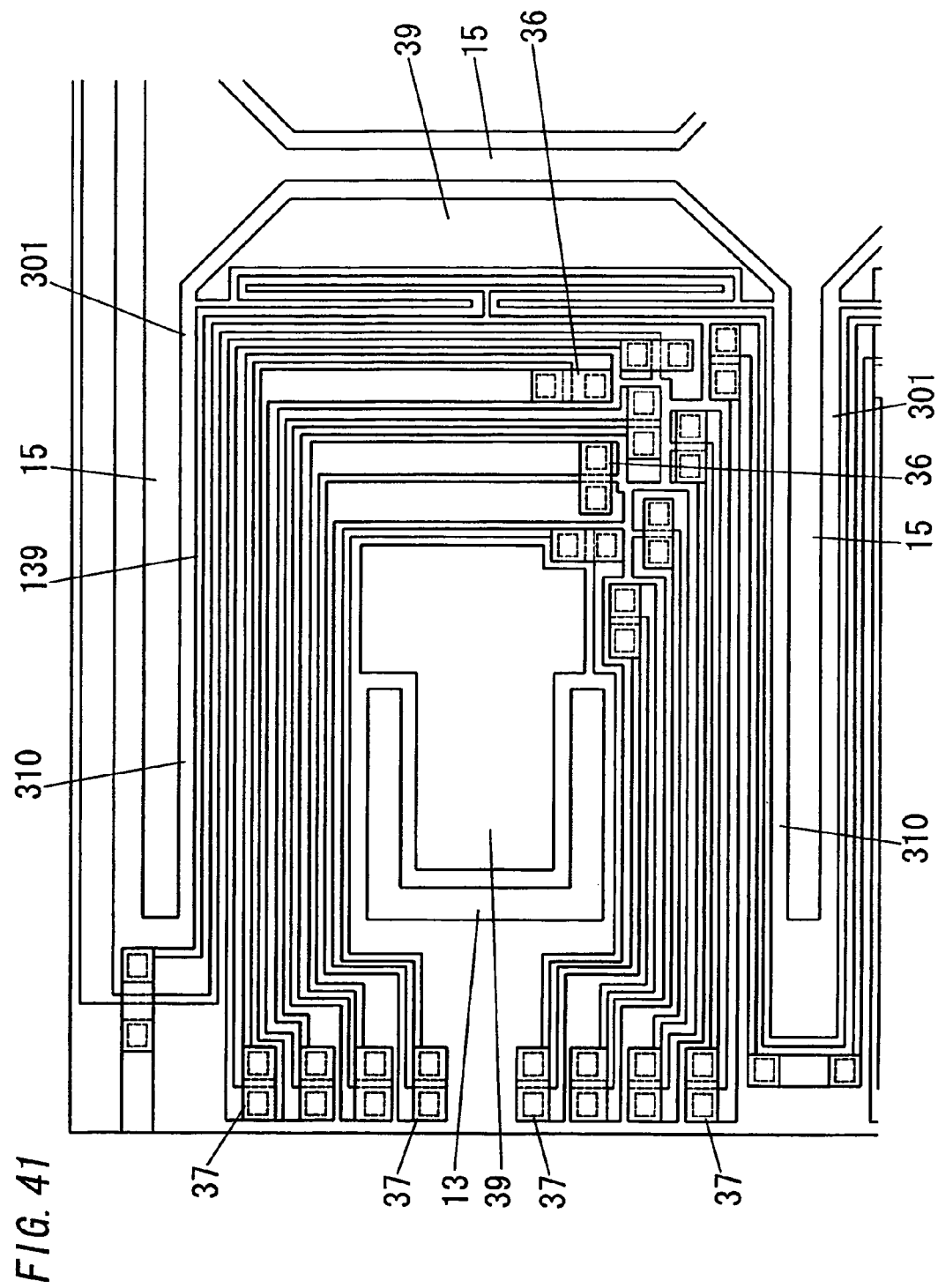
FIG. 41 is a partial plane view illustrating the above infrared sensor.

FIG. 37 shows the sixth modification of the infrared sensor 1B of the present embodiment. The sixth modification is different from the basic example in that the base 10 is provided its second surface with an opening 12 configured to communicate the plural cavities 11.

The opening 12 may be formed by etching a region reserved for forming the opening 12 of the second surface of the base 10 (i.e., a lower surface of the silicon substrate 1a, in FIG. 37) by means of anisotropic etching utilizing a dry etching apparatus of an ICP type or the like.

The sixth modification can more suppress heat transfer from each of the small and thin film structures 310 of the thin film structure 300B to the base 10, thereby more improving the sensitivity.

Fourth Embodiment

The following explains the infrared sensor 1C of the present embodiment with reference to FIGS. 38 to 44.

The infrared sensor 1C of the present embodiment is mainly different from the infrared sensor 1B of the third embodiment in the thin film structure 300C. Besides, components common to the infrared sensor 1B and the infrared sensor 1 are designated by the same reference numerals and no explanation thereof are deemed necessary.

The thin film structure 300C of the present embodiment is different from the thin film structure 300B in that the thin film structure 300C is devoid of the connection member 320. In brief, according to the thin film structure 300C, each of the small and thin film structures 301 is supported to the base 10 in a cantilever fashion.

Figure 42:
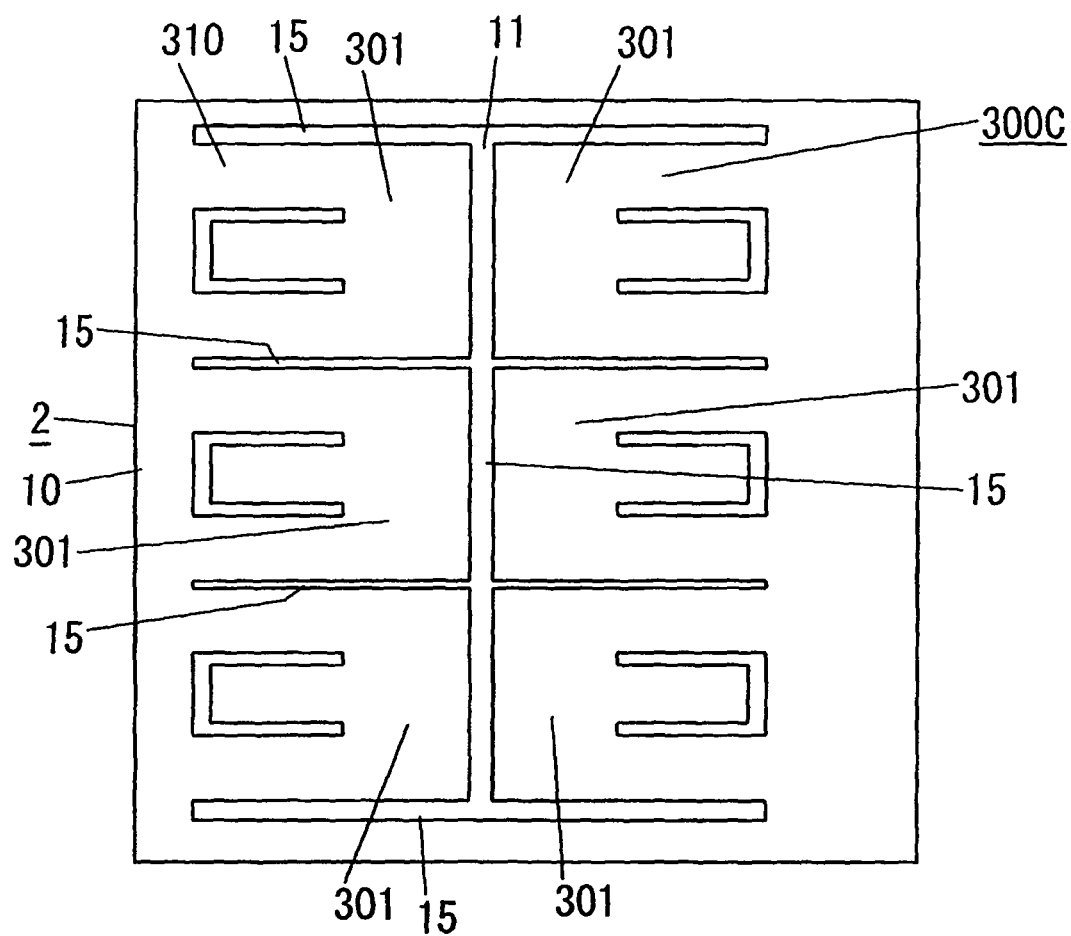
FIG. 42 is a partial plane view illustrating the infrared sensor of the first modification of the above embodiment.

The infrared sensor 1C is chamfered at its corners formed between a tip of the small and thin film structure 301 in the extension direction and each of width ends of the same. Thus, it is enabled to prevent breakage of the infrared sensor 1C at the time of manufacturing the same which might otherwise occur when the infrared sensor is not so chamfered, as shown in FIG. 42. Thus, the cavity 11 can be also formed easily. Thus, the fabrication yield can be improved. Besides, in the illustrated instance, each of the chamfered surfaces is a C-surface, but may be an R-surface.

A method for manufacturing the infrared sensor 1C is the same as the method for manufacturing the infrared sensor 1B of the third embodiment, except the connection member 320 and the reinforcement member 330 are not formed. Therefore, no explanation is made to the method for manufacturing the infrared sensor 1C.

In the infrared sensor 1C of the present embodiment explained in the above, the thin film structure 300C is divided into the plural small and thin film structures 301 by the plural linear slits 15. The plural small and thin film structures 301 are aligned in the circumference direction of the cavity 11. Each of the small and thin film structures 301 is supported to the base 10 in a cantilever fashion. Further, each small and thin film structure 301 is provided with a temperature detection member 30B. All the temperature detection members 30B are electrically connected to each other in such a relation as to provide the temperature-dependent output which is greater than any single one of the temperature detection members 30B.

Therefore, the infrared sensor 1C of the present embodiment can improve its response speed and sensitivity. Furthermore, it is possible to restrain deformation of each small and thin film structure 301 even in the presence of a stress in the base 10 or subject to external stress or thermal stress. Thereby, it is possible to improve structural stability of the infrared sensor and to stabilize the sensitivity of the infrared sensor.

Figure 43:
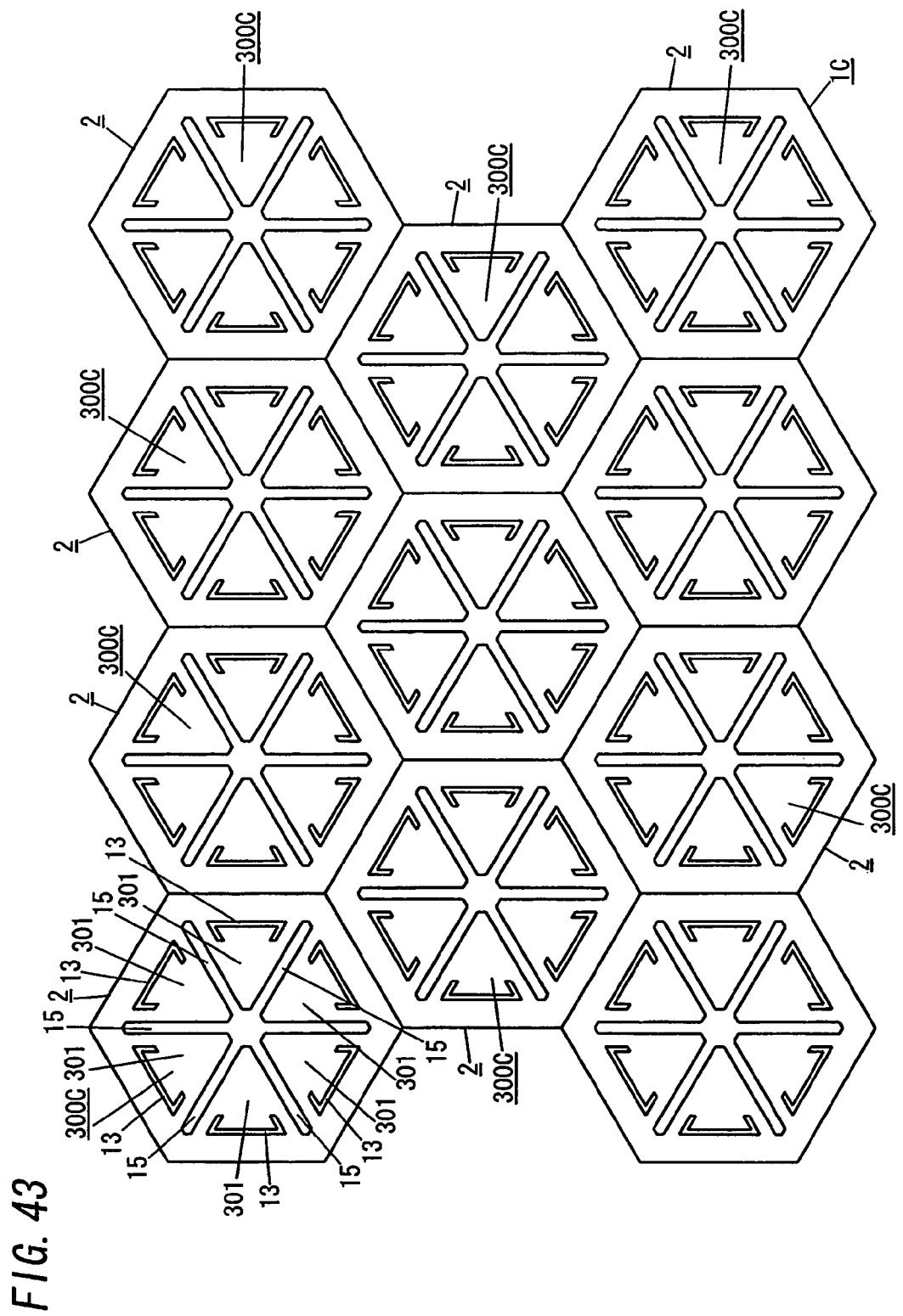
FIG. 43 is a partial plane view illustrating the infrared sensor of the second modification of the above embodiment.
Figure 44:
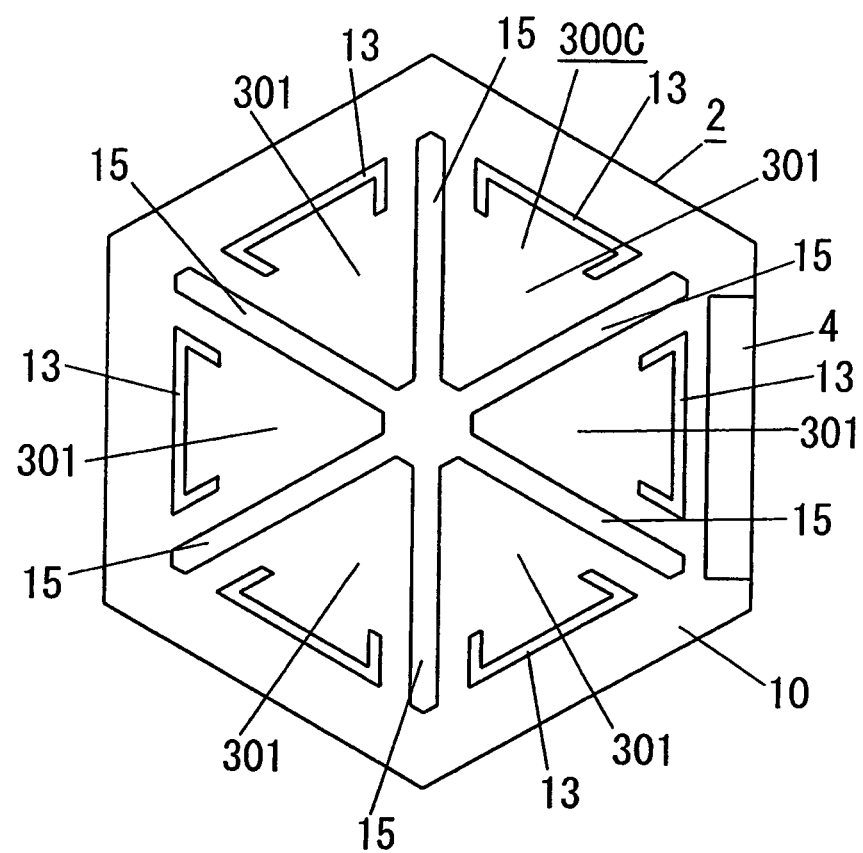
FIG. 44 is a partial enlarged view of the above infrared sensor.

Alternatively, as shown in FIGS. 43 and 44, each pixel 2 may be formed into a hexagonal shape. In this situation, the pixels 2 are preferred to be arranged in a honeycomb manner.

With this arrangement, it is possible to prevent deformation of each small and thin film structure 301. Additionally, it is possible to improve density of the small and thin film structures 301 as well as density of the pixels 2.

The invention claimed is:

1. An infrared sensor comprising:
a base; and
an infrared detection element formed over a surface of said base,
wherein
said infrared detection element comprises:
an infrared absorption member in the form of a thin film configured to absorb infrared, and spaced from the surface of said base for thermal insulation; and
a temperature detection member configured to measure a temperature difference between said infrared absorption member and said base, and including a thermocouple, said thermocouple including a p-type polysilicon layer, an n-type polysilicon layer, and a connection layer, said p-type polysilicon layer formed over said infrared absorption member and said base, said n-type polysilicon layer formed over said infrared absorption member and said base without contact with said p-type polysilicon layer, and said connection layer being configured to electrically connect said p-type polysilicon layer to said n-type polysilicon layer,
each of said p-type polysilicon layer and said n-type polysilicon layer having an impurity concentration in a range of $10^{18}$ to $10^{20}$ cm$^{-3}$,
said p-type polysilicon layer having its thickness of $\lambda/4n_{1p}$, wherein $\lambda$ denotes a center wavelength of the infrared to be detected by said infrared detection element, and $n_{1p}$ denotes a reflective index of said p-type polysilicon layer, and
said n-type polysilicon layer having its thickness of $\lambda/4n_{1n}$, wherein $n_{1n}$ denotes a reflective index of said n-type polysilicon layer.

2. The infrared sensor as set forth in claim 1, wherein
said infrared detection member includes an infrared absorption film formed over an opposite surface of said p-type polysilicon layer and said n-type polysilicon layer from said base, said infrared absorption film having its thickness of $\lambda/4n_2$, wherein $n_2$ denotes a reflective index of said infrared absorption film.

3. The infrared sensor as set forth in claim 1, wherein said p-type polysilicon layer has the same thickness as said n-type polysilicon layer.

4. The infrared sensor as set forth in claim 1, wherein said infrared sensor includes plural cells each including said infrared detection element,
said plural cells being arranged over the surface of said base in an array manner.

5. The infrared sensor as set forth in claim 4, wherein said cell includes a MOS transistor configured to read out an output of said temperature detection member.

6. The infrared sensor as set forth in claim 5, wherein said p-type polysilicon layer has the same thickness as said n-type polysilicon layer,
said MOS transistor including a gate electrode defined by a polysilicon film having the same thickness as said p-type polysilicon layer.

7. The infrared sensor as set forth in claim 5, wherein said polysilicon layer defining said gate electrode of said MOS transistor has the impurity of the same kind and the same concentration as at least one of said p-type polysilicon layer and said n-type polysilicon layer.

8. The infrared sensor as set forth in claim 1, wherein said base is provided with a cavity for thermally insulation between said base and said infrared absorption member,
said infrared detection member including a thin film structure which comprises a plurality of a small and thin film structures, and is disposed over said cavity,
each of said small and thin film structures including said infrared absorption member in the form of a thin film configured to absorb infrared, and said temperature detection member formed on said infrared absorption member and configured to measure a temperature of the same infrared absorption member,
said infrared detection member including slits formed between said small and thin film structures, and
all said temperature detection members being electrically connected to each other in such a relation as to provide a temperature-dependent output which is greater than any single one of said temperature detection members.

9. The infrared sensor as set forth in claim 8, wherein said thin film structure includes a connection member configured to connect said small and thin film structures together.

* * * * *